United States Patent
Poulin et al.

(10) Patent No.: US 11,336,300 B2
(45) Date of Patent: May 17, 2022

(54) GENERALIZED POLAR CODES

(71) Applicant: SOCPRA SCIENCES ET GÉNIE S.E.C., Sherbrooke (CA)

(72) Inventors: David Poulin, Sherbrooke (CA); Andrew J. Ferris, Sherbrooke (CA)

(73) Assignee: SOCPRA SCIENCES ET GÉNIE S.E.C, Sherbrooke (CA)

( * ) Notice: Subject to any disclaimer, the term of this patent is extended or adjusted under 35 U.S.C. 154(b) by 0 days.

(21) Appl. No.: 16/490,293

(22) PCT Filed: Mar. 5, 2018

(86) PCT No.: PCT/CA2018/050259
§ 371 (c)(1),
(2) Date: Aug. 30, 2019

(87) PCT Pub. No.: WO2018/157263
PCT Pub. Date: Sep. 7, 2018

(65) Prior Publication Data
US 2020/0076451 A1  Mar. 5, 2020

Related U.S. Application Data

(60) Provisional application No. 62/466,414, filed on Mar. 3, 2017.

(51) Int. Cl.
*H03M 13/13* (2006.01)
*H03M 13/23* (2006.01)
*H03M 13/45* (2006.01)

(52) U.S. Cl.
CPC ......... *H03M 13/13* (2013.01); *H03M 13/23* (2013.01); *H03M 13/455* (2013.01); *H03M 13/458* (2013.01)

(58) Field of Classification Search
None
See application file for complete search history.

(56) References Cited

U.S. PATENT DOCUMENTS 9,176,927 B2 * 11/2015 Gross ................ H03M 13/617
2016/0308643 A1   10/2016 Li et al.

FOREIGN PATENT DOCUMENTS

CN        106130687 A  * 11/2016  ........ H03M 13/6368

OTHER PUBLICATIONS

Renes et al, "Efficient Polar Coding of Quantum Information", 2012, ArXiv-1109.3195 (Year: 2012).*
(Continued)

*Primary Examiner* — April Y Blair
*Assistant Examiner* — Matthew W Wahlin
(74) *Attorney, Agent, or Firm* — Benoit Yelle; Kevin O'Neil; Gowling WLG (Canada) LLP

(57) ABSTRACT

A method for determining the n best positions of frozen bits in a channel decoder for a noisy communication channel. A decoding method and decoding processing unit for implementing the channel having frozen bits at the n worst positions. A method and system that iteratively, for each bit i from the n bits, determines a probability vector for the bit i by traversing a logical graph using contraction identities simplified to specific values, indexes the specific values from the contraction identities newly computed during the determination of the probability vector for subsequent reference during a following iteration based on corresponding contraction identities, fixes the bit i from the probability vector and moving to bit i+1 until all n bits are fixed.

6 Claims, 35 Drawing Sheets

(56) References Cited

OTHER PUBLICATIONS

Ferris et al, "Branching MERA codes, a natural extension of polar codes", 2013, ArXiv-1312.4575 (Year: 2013).*
(Renes et al)—"Efficient Polar Coding of Quantum Information" (published Mar. 2012)—ArXiv-1109.3195 (Year: 2012).*
(Elkelesh et al),"Flexible Length Polar Codes through Graph Based Augmentation", (Feb. 2017)—IEEE (Year: 2017).*
(Ferris et al),"Branching MERA codes, a natural extension of polar codes"—(Dec. 2013)—ArXiv-1312.4575 (Year: 2013).*
(Parag et al),"On the queueing behavior of random codes over a gilbert-elliot erasure channel"—(Jun. 2010)—IEEE (Year: 2010).*
(Niu et al)—"Polar codes primary concepts and practical decoding algorithms"—(Jul. 2014)—IEEE (Year: 2014).*
Piao, Z. et al., "Efficient successive cancellation decoder for polar codes based on frozen bits", 2016 IEEE Asia Pacific Conference on Circuits and Systems (APCCAS); Jeju, South Korea; 25-28 (Oct. 28, 2016), pp. 585-587.
International Preliminary Report on Patentability dated Sep. 12, 2019 for corresponding PCT/CA2018/050259.
Huawei Hisilicon, "Details of the Polar Code Design", 3GPP TSG RAN WG1, meeting #87, Reno, USA (Nov. 13, 2016).
Liang Ma et al., "An Incremental Redundancy HARQ Scheme for Polar Code", (Aug. 31, 2017), pp. 1-6.
Ferris, Andrew James et al., "Convolutional Polar Codes", arxiv. org, Cornell University Library, NY (Apr. 3, 2017).
Extended European Search Report dated Jun. 29, 2021 for corresponding EP application 18761817.8.

* cited by examiner

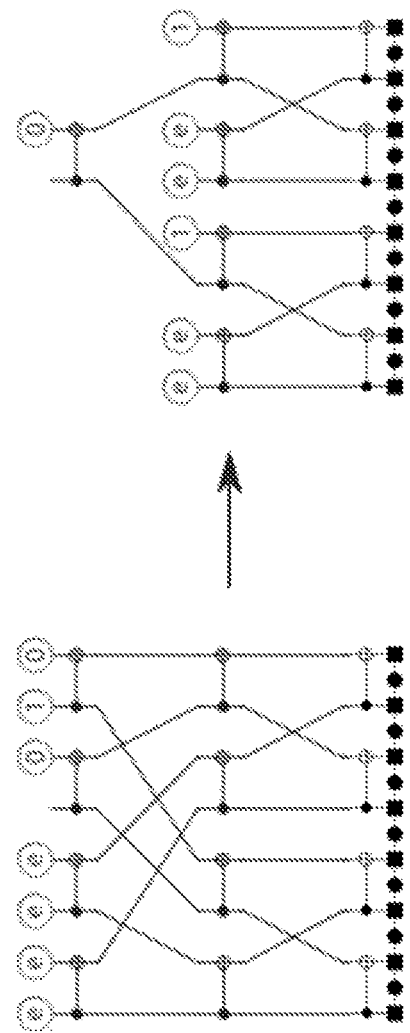
Figure 13A
Figure 13B
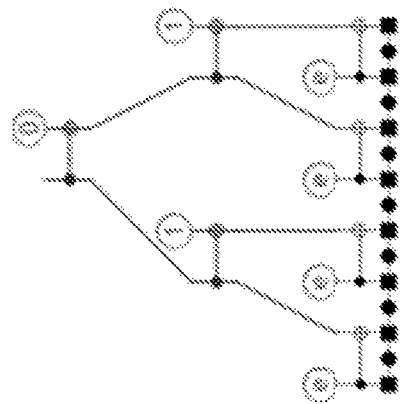
Figure 13C
Figure 13D
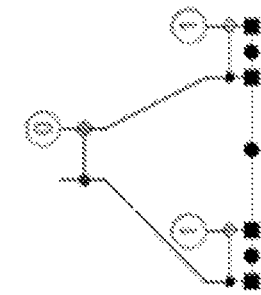
Figure 13E
Figure 13F

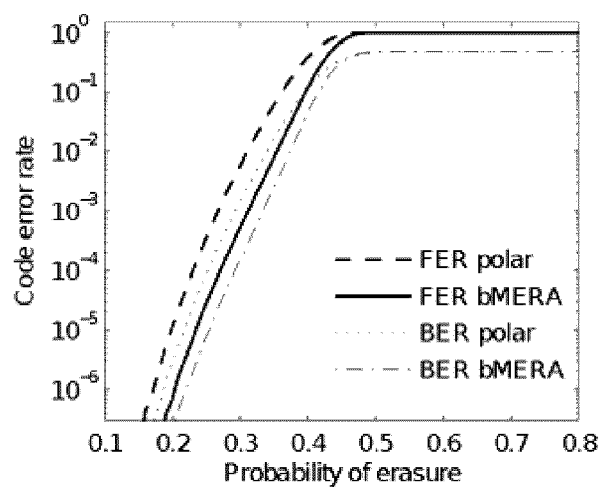
Figure 17D
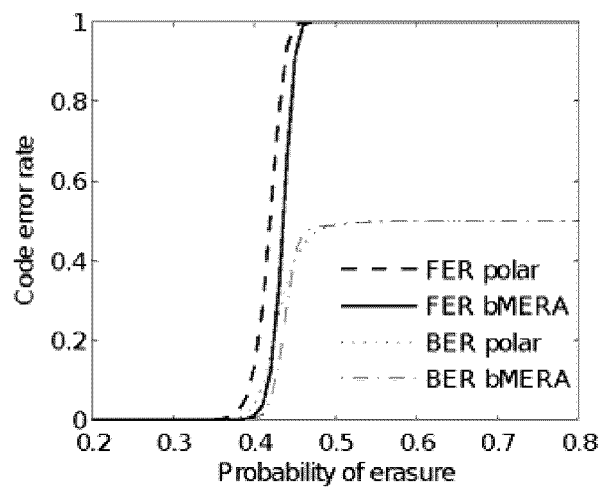
Figure 17E
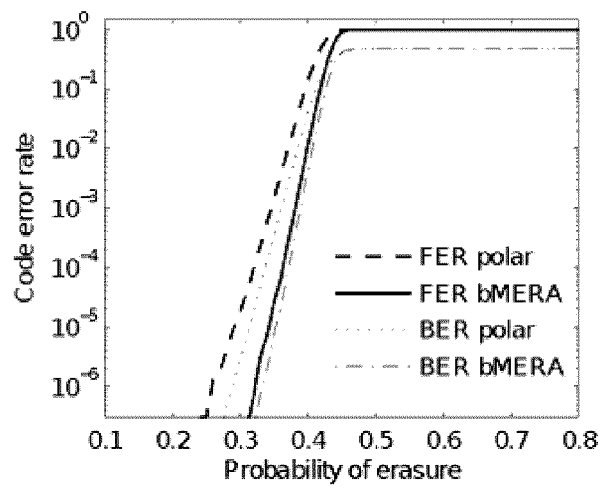
Fgure17F

Figue 19E

GENERALIZED POLAR CODES

CROSS REFERENCE TO RELATED APPLICATIONS

The present non-provisional patent application is a U.S. National Phase of International Patent Application PCT/CA2018/050259, filed Mar. 5, 2018, which is hereby incorporated by reference in its entirety and which claims priority based upon the prior U.S. provisional patent application entitled "CONVOLUTIONAL POLAR CODES", application No. 62/466,414, filed Mar. 3, 2017, in the name of SOCPRA Sciences et Genie s.e.c., which is incorporated herein by reference in its entirety.

TECHNICAL FIELD

The present invention relates to channel coding and, more particularly, to use of certain types of polar codes in channel coding.

BACKGROUND

Channel coding is used in cellular communication systems for correcting communication errors that are caused by noise, interference and poor signal strength. Channel coding is highly complex and, at the same time, central to performance of the cellular communication systems.

In 3G and 4G cellular systems, turbo code has been used as the main channel coding mechanism. For 5G, the radio interface is expected to reach downlink throughput of up to 20 Gbps while keeping ultra-low latencies. 5G will also require much greater flexibility considering the diversification of the consumers (e.g., Internet of Things (IoT), broadband communication, transportation communications, etc.). Other communications protocol (e.g., for satellite communication) would also benefit from improved channel coding technologies. Current channel coding can be improved in that regards.

The present invention addresses, at least partly, this challenge.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A first aspect of the present invention is directed to a method for determining the n best positions of frozen bits in a channel decoder for a noisy communication channel. The method comprises:
selecting a polar code encoding scheme;
obtaining a polar code decoder scheme corresponding to the polar code encoding scheme;
determining a channel bandwidth defining a number of channel bits;
determining a message length defining a number of message bits, the number of channel bits and the number of message bits defining a number of frozen bits n;
notwithstanding the nature of the noisy communication channel, characterizing the communication channel with an erasure probability p; and
computing the n worst positions considering the probability p.

As an optional feature of the method, the polar code encoding scheme may be a convolutional polar code modeled using at least 2 levels of CNOT gates.

Optionally, the polar code encoding scheme may also, alternatively or additionally, have a number of bits k as a power of 2, k being selected to be equal to or greater than the number of channel bits. As an alternative option, the polar code encoding scheme comprises more than one sub-polar code, each comprising a number of coding bits expressed as a power of 2, the number of coding bits in each of the sub-polar code being selected such that the sum thereof is equal to or greater than the number of channel bits.

In some embodiments, the noisy communication channel may present correlated noise characteristics characterized by a good-state of erasure $p_2$, the probability of erasure p corresponding to a bad-state probability $p_1 \geq p_2$. The channel may also provide a probability of transition between the good state and the bad state Pgb and between the good state and the bad state Pbg and computing the n worst positions would therefore further consider the probabilities $p_2$, Pgb and Pbg.

In accordance with a second aspect of the present invention, a decoding method may be provided that implements the polar code decoder scheme selected in accordance with the first aspect and having frozen bits at the n worst positions also determined thereby. Likewise, a decoding processing unit may be provided to implement the polar code decoder scheme selected in accordance with the first aspect and having frozen bits at then worst positions also determined thereby.

In accordance with a third aspect of the present invention, a method for iteratively decoding a message of n bits to obtain a message of m<n bits is provided. The message is received over a noisy communication channel exhibiting correlated noise characterized by a bad-state probability of erasure $p_1$, a good-state of erasure $p_2$, the probability of $p_2 \leq p_1$. The channel also provides a probability of transition between the good state and the bad state Pgb and between the good state and the bad state Pbg. The method comprises:
iteratively, for each bit i from the n bits:
determining a probability vector for the bit i by traversing a logical graph using contraction identities simplified to specific values;
indexing the specific values from the contraction identities newly computed during the determination of the probability vector for subsequent reference during a following iteration based on corresponding contraction identities;
fixing the bit i from the probability vector; and
moving to bit i+1 until all n bits are fixed.

In certain embodiments, the newly computed contraction identities may correspond to one or more sections of the logical graph replaced by the specific values during the determination of the probability vector. The message is typically, but not necessarily, received over a network interface. Likewise, he fixed bits are is typically, but not necessarily, provided to a higher processing layer of a network stack.

A fourth aspect of the present invention is directed to system for iteratively decoding a message of n bits to obtain a message of m<n bits, the message being received over a noisy communication channel exhibiting correlated noise characterized by a bad-state probability $p_1$, a good-state of erasure $p_2$, the probability of $p_2 \leq p_1$. The channel provides a probability of transition between the good state and the bad state Pgb and between the good state and the bad state Pbg.

The system comprises a processing module that iteratively, for each bit i from the n bits:
   determines a probability vector for the bit i by traversing a logical graph using contraction identities simplified to specific values;
   indexes the specific values from the contraction identities newly computed during the determination of the probability vector for subsequent reference during a following iteration based on corresponding contraction identities;
   fixes the bit i from the probability vector; and
   moves to bit i+1 until all n bits are fixed.

The newly computed contraction identities may correspond to one or more sections of the logical graph replaced by the specific values during the determination of the probability vector. The system may further comprise a network interface that receives the message and the fixed bits may be provided to a higher processing layer of a network stack associated to the network interface.

BRIEF DESCRIPTION OF THE DRAWINGS

Further features and exemplary advantages of the present invention will become apparent from the following detailed description, taken in conjunction with the appended drawings, in which:

FIG. 13A, FIG. 13B, FIG. 13C, FIG. 13D, FIG. 13E, and FIG. 13F, herein referred to concurrently as FIG. 13, depict an exemplary sequential simplification procedure for decoding in presence of correlated noise, in accordance with the teachings of the present invention;

FIG. 17A, FIG. 17B, FIG. 17C, FIG. 17D, FIG. 17E and FIG. 17F, herein referred to concurrently as FIG. 17, are graphs showing a comparison of the performance of rate 1/2 Polar and Convolutional Polar codes of various sizes for the binary erasure channel;

FIG. 19A, FIG. 19B, FIG. 19C, FIG. 19D, FIG. 19E and FIG. 19F, herein referred to concurrently as FIG. 19, are graphs showing a comparison of the performance of rate 1/2 Polar and Convolutional Polar codes of various sizes for the additive Gaussian white noise channel;

DETAILED DESCRIPTION

Figure 1A:
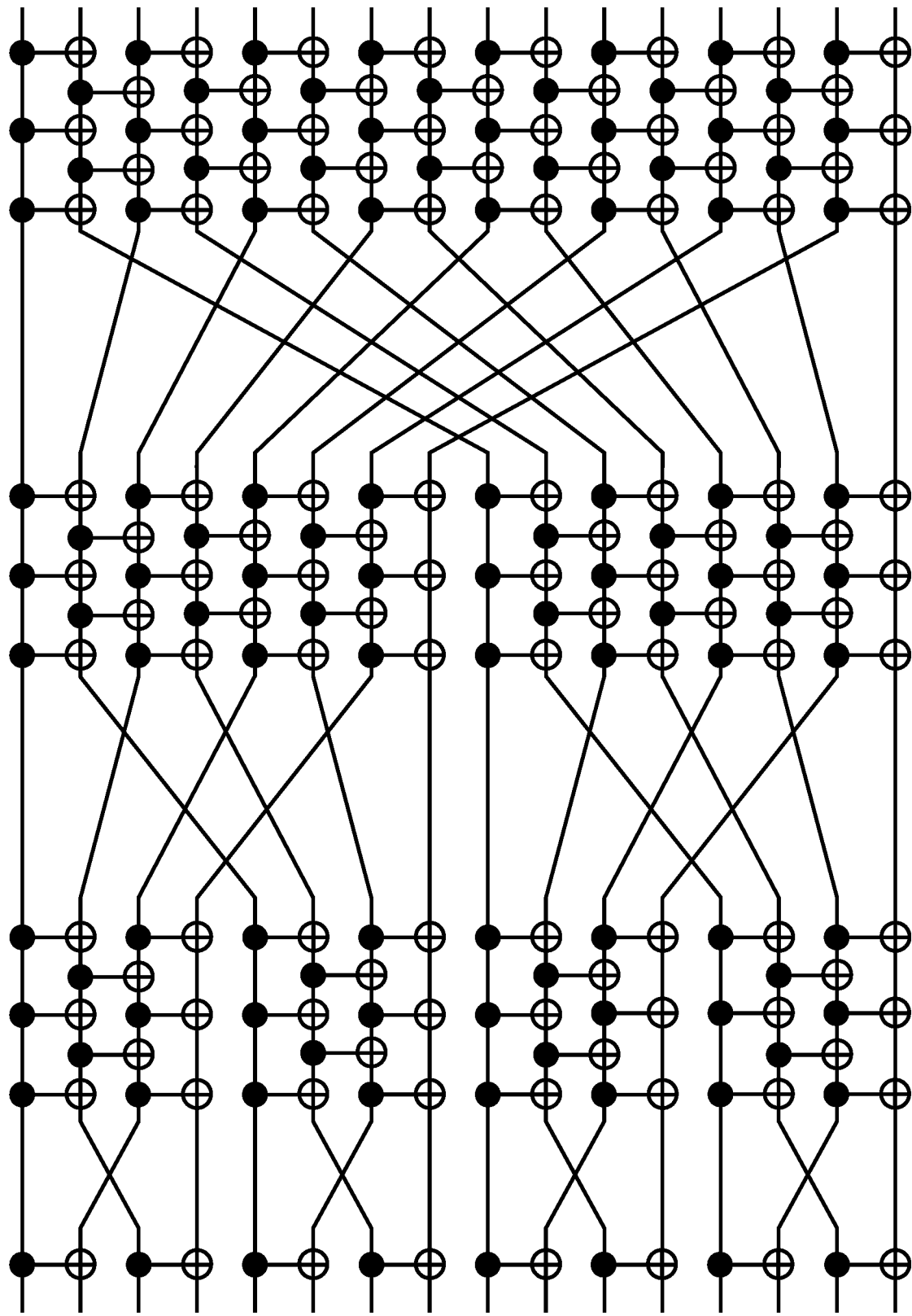
FIG. 1A, FIG. 1B, FIG. 1C, FIG. 1C', FIG. 1D, FIG. 1E, FIG. 1F and FIG. 1G, herein referred to concurrently as FIG. 1, are logical views of exemplary levels for forming generalized encoding circuits in accordance with the teachings of the present invention.
Figure 1B:
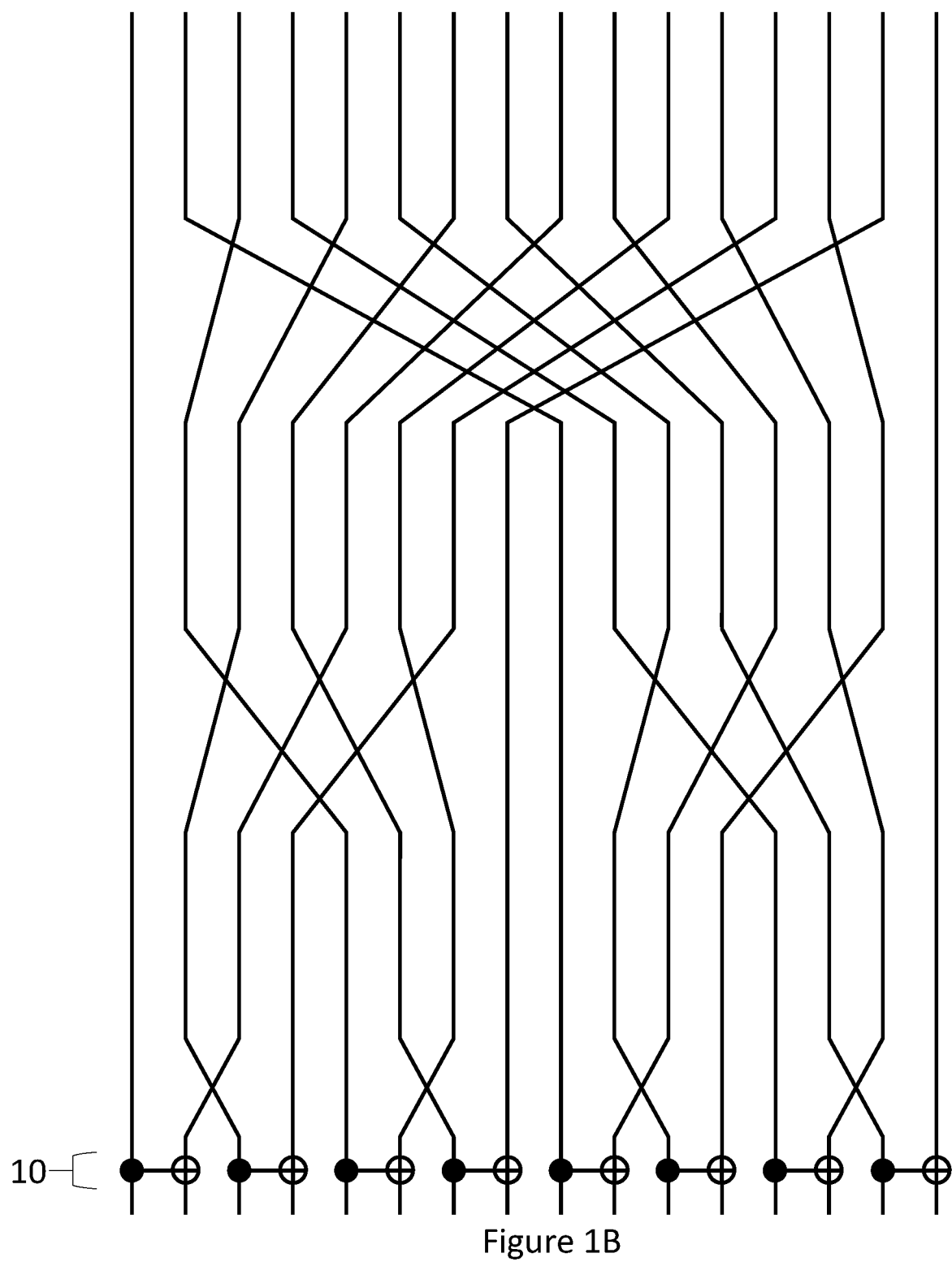

The phenomenon of channel polarization, discovered by Arikan, can be produced by a controlled-not (CNOT) gate. Because the control bit is added to the target bit, it becomes redundantly encoded and thus more robust to noise. On the other hand, the information of the target bit is partially washed away because its value is modified in a way that depends on the value of the possibly unknown control bit. We thus say that the channels have partially polarized into a better and a worse channel. The encoding circuit of a Polar code is obtained by iterating this polarization procedure, and asymptotically produces a perfect polarization, where a fraction of the channels are error-free and the complement are completely randomizing.

Because of this recursive nature, the encoding circuit takes the geometric form of a spectral transformation where CNOT gates follow a hierarchical arrangement on different length scales, and much like the (fast) Fourier transform, the linear encoding matrix can be decomposed into a Kronecker product of small matrices. In this case, the polarization is defined with respect to the successive cancellation decoder, where the marginal probability of input bit is calculated with the prior knowledge of the bits $1, \ldots, i-1$.

A broad family of codes building on the powerful graphical calculus developed in the field of quantum many-body physics has been previously developed. In this field, the encoding circuit associated to Polar codes are a restricted form of branching multi-scale entanglement renormalization ansatz (branching MERA) tensor networks. More precisely, they correspond to branching MERA networks with half of the tensors being trivial identity gates, resulting in an object that could be called a 'branching tree'. In the present disclosure, focus is put on the branching MERA code family, which contains all the codes obtained from an encoding circuit with the topology of the branching MERA, and includes the Polar code as a special case with many trivial gates. While Polar codes use a sequence of polarization steps, each composed of a product of gates operating on non-intersecting, finite-size blocks, the generalization considered here goes beyond this scheme by using a convolutional structure at every polarization step (lading to Convolutional Polar codes).

With Polar codes, Arikan was able to give the first concrete example of a provably efficient and capacity-achieving code for symmetric channels, generating significant interest and stimulating further work on improvements and generalizations. In particular, the limitations of Polar Codes have been investigated, with the notable result that while keeping the decomposability into Kronecker products, the asymptotic block error performance of Polar codes is optimal considering underlying matrices with small dimension. In fact, the dimension has to be raised to at least 15 to improve the asymptotic error exponent. Convolutional Polar codes re-open the investigation of optimal behavior by abandoning the block-structure-limited polarization in favor of a more general polarization structure.

Convolutional Polar codes form one example of generalization of Polar codes, and inherit many of their properties including a successive cancellation decoder that produces a tensor contractible in log-linear time. While the decoding algorithm is slower by a small, constant numerical factor, it has been observed that a significant improvement in both the channel polarization and the error-correction performance is achievable. While an important practical limitation of Polar code is their important finite-size effects, it has been observed that Convolutional Polar codes display a steeper waterfall region, thus suppressing such finite-size effects.

Abstractly, a gate, such as a CNOT, can be viewed as a tensor $A^{\alpha\beta\gamma}\ldots$ with a certain number of indices denoted $\alpha$, $\beta$, $\gamma$, $\ldots$, each taking values in a finite set, that we will assume henceforth to be $\mathbb{Z}_2$. The number of indices is the rank of the tensor. For instance, the CNOT gate is a rank-four tensor $N^{\alpha\beta\delta\gamma}$ with indices $\alpha$ and $\delta$ representing the two input bits and $\delta$ and $\gamma$ representing the two output bits. The value of the tensor is given by: $N^{\alpha\beta\delta\gamma}=1$ when $\gamma=\alpha$ and $\delta=\alpha\oplus\beta$ and $N^{\alpha\beta\delta\gamma}=0$ otherwise. A tensor can be graphically represented as a vertex and its indices as edges, with the degree of the vertex equal to the rank of the tensor. In that setting, an edge linking two vertices represents a tensor contraction defined by the following equation:

$$\begin{aligned} &= \sum A^{\alpha\mu_1\mu_2\cdots} B^{\alpha\nu_1\nu_2\cdots} \\ &= C^{\mu_1\mu_2\cdots\nu_1\nu_2\cdots} \\ &= \end{aligned} \quad (1)$$

Tensor contraction is a generalization of matrix multiplication. A (closed) graph represents a tensor network (TN) with all edges contracted and, hence, a scalar. A graph with one open edge (an edge with one end not connected to a vertex) represents a tensor network with one uncontracted index, and thus a vector; and so forth. Such objects, and particularly their graphical representations, are also called a factor graph, where some vertices may be identified as variables. Normal factor graphs provide a better analogy to open tensor networks.

Reference is now made to the drawings in which FIG. 1 provides a generalized encoding circuit for 16 bits. In the example of FIG. 1A-1G, the input of logical bits enter into the top of the circuit, and the encoded message appears at the bottom. For easier presentation, instead of "stretching" the CNOT gates across different bits of the input signal, the logical bits of the input signal are shown as being conveyed to different levels of CNOT gates of the encoding circuit. Skilled people will understand that the signal lines crossing each other does not indicate a physical connection therebetween. For the sake of clarity, FIG. 1 has been split into FIGS. 1A-1G showing the different levels of CNOT gates for the generalized encoding circuit. Different simpler encoding circuits can be provided depending on selection of the levels being used therein. FIG. 1B presents a first level of CNOT gates 10 that are part of every encoding circuit. Because the first level of CNOT gates 10 is used in all encoding circuits, it is repeated on all FIGS. 1C-1G. However, skilled persons will understand that they are not unduly replicated when the levels are used together.

Figure 1C:
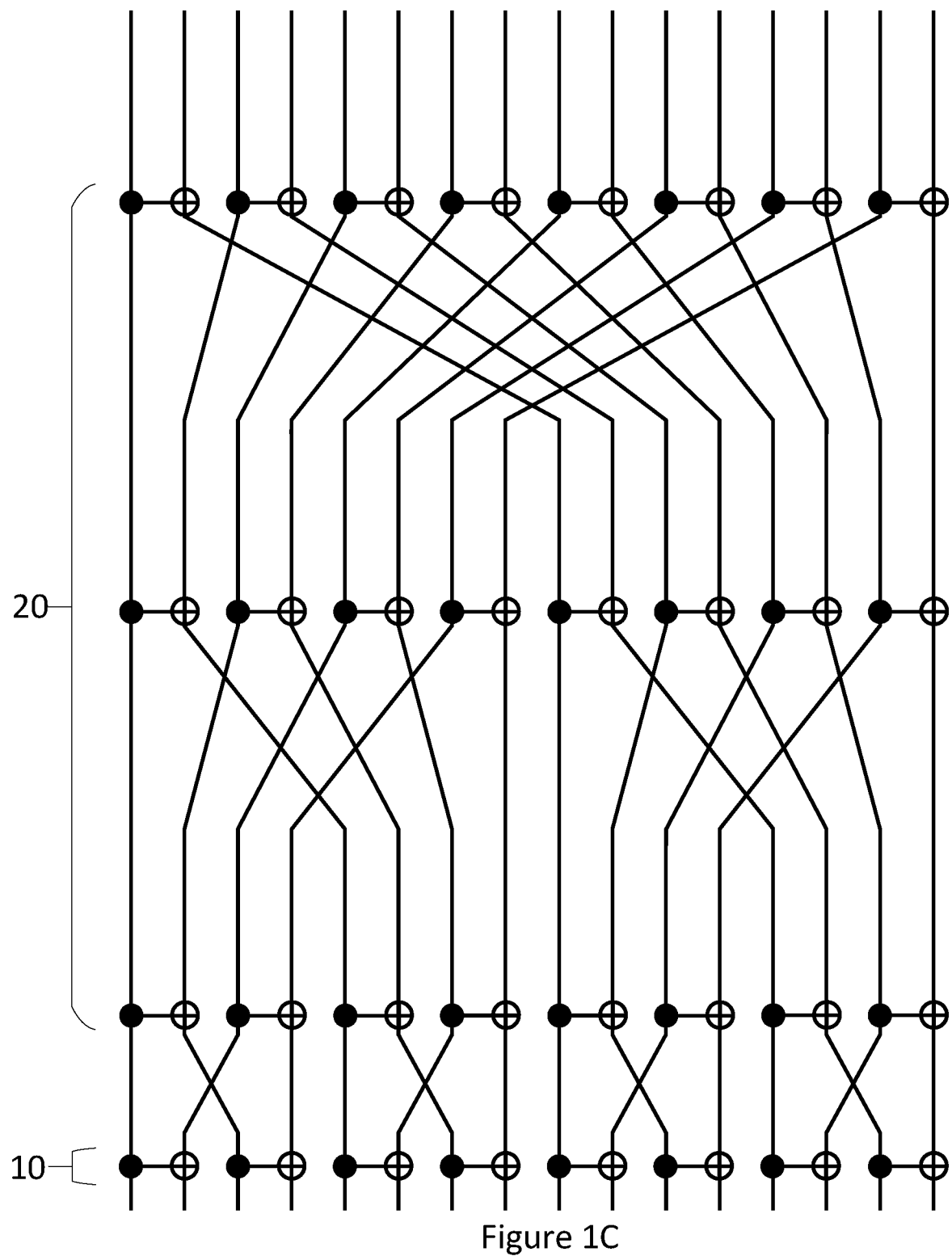
Figure 1C:
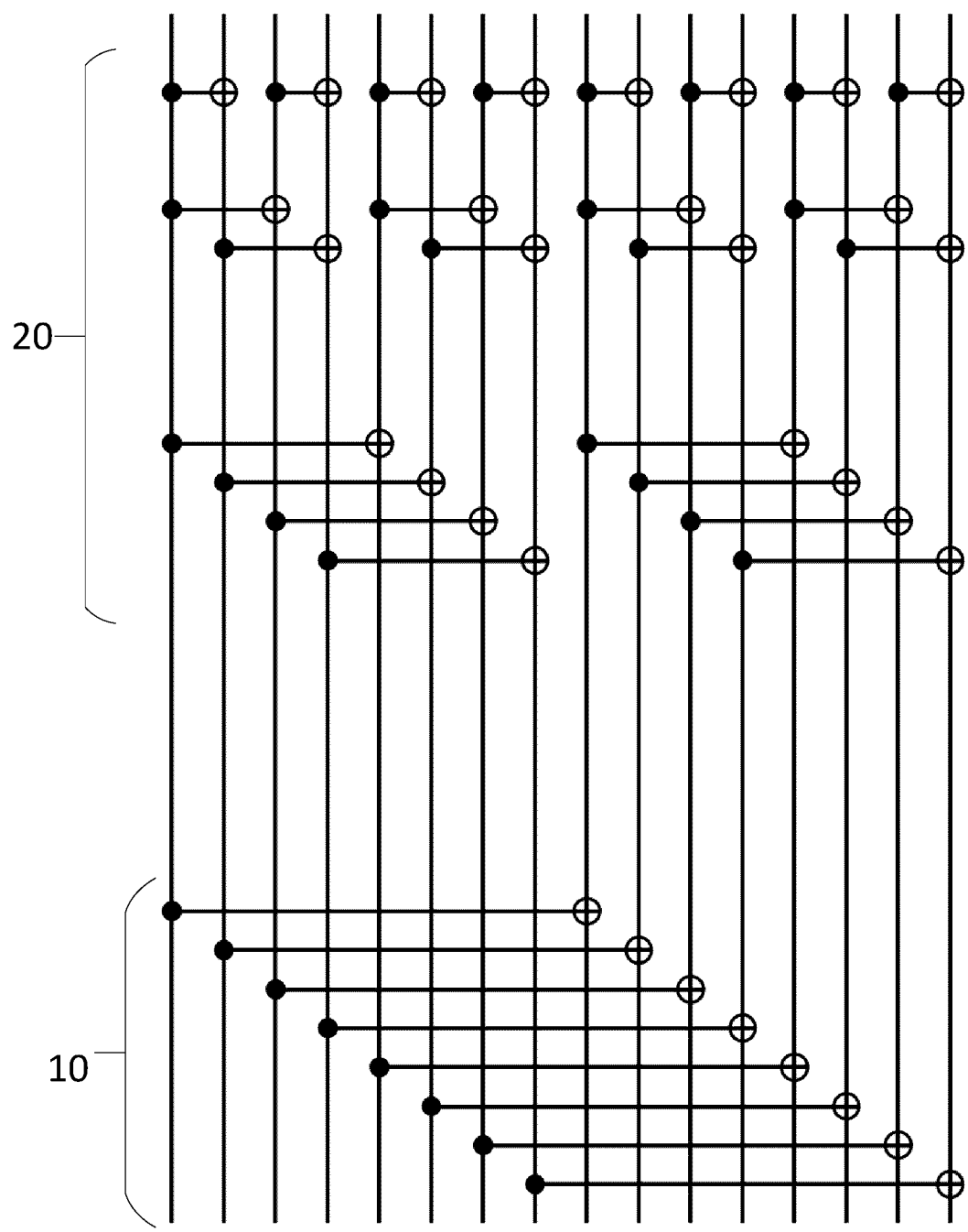
Figure 1D:
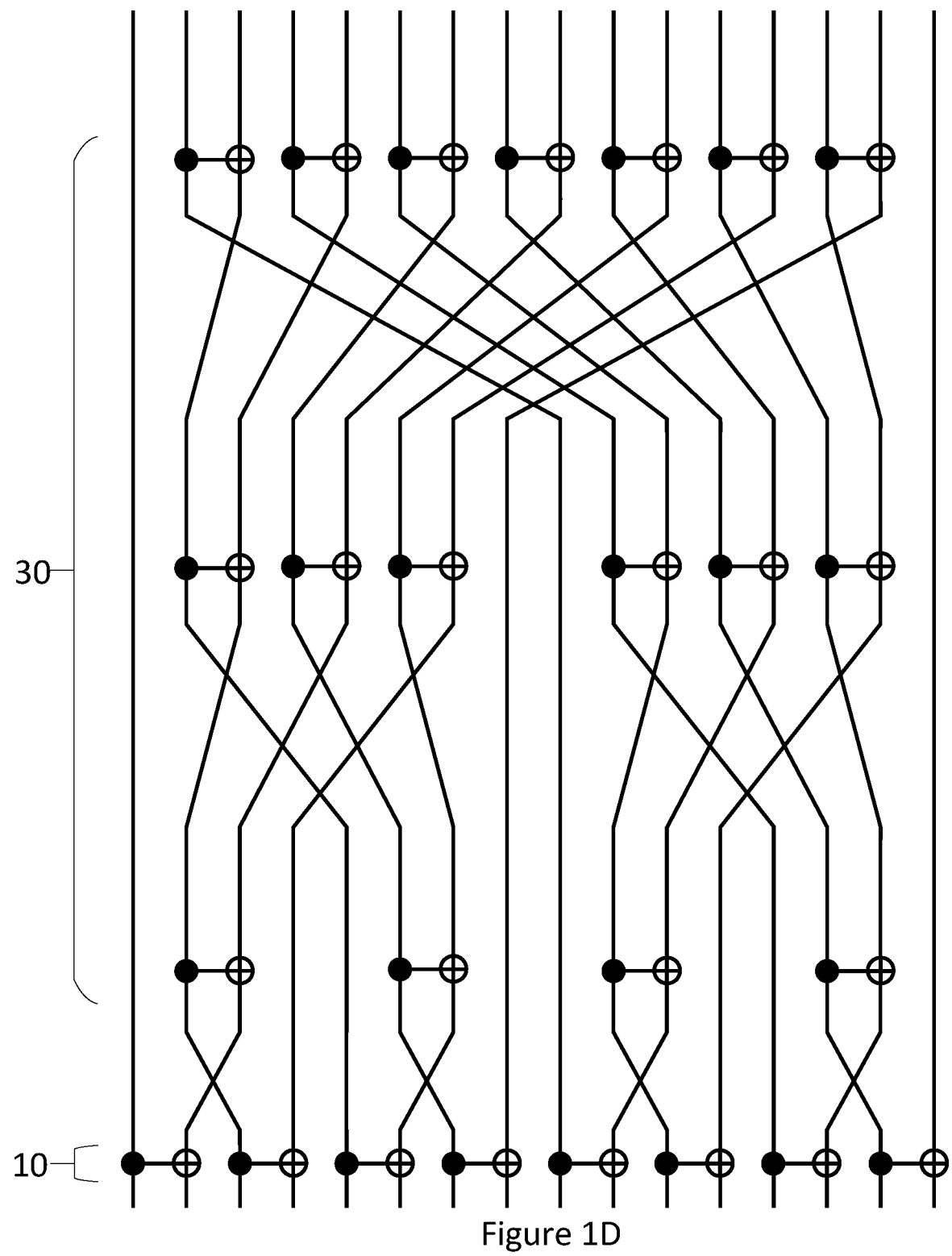
Figure 1D:
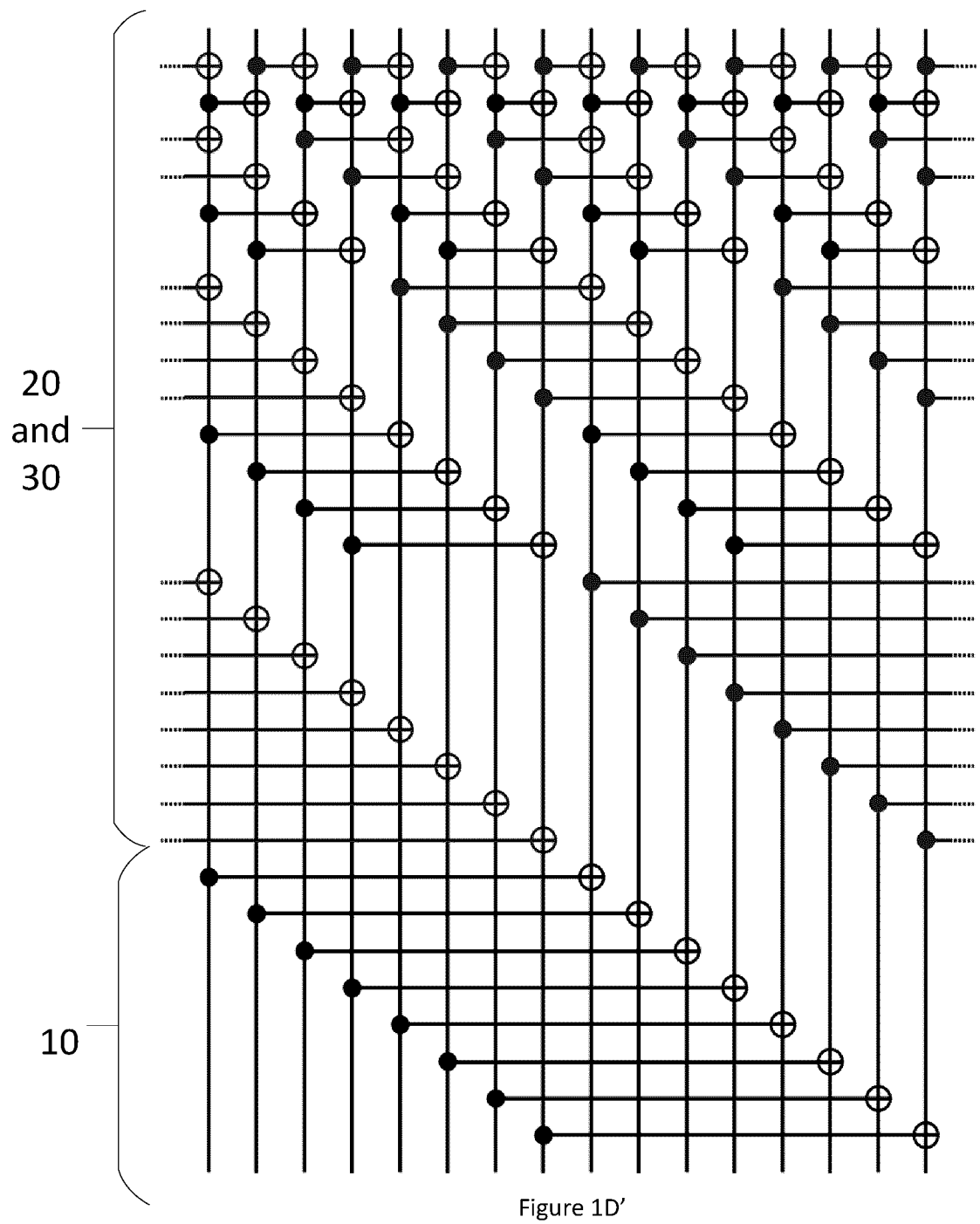
Figure 1E:
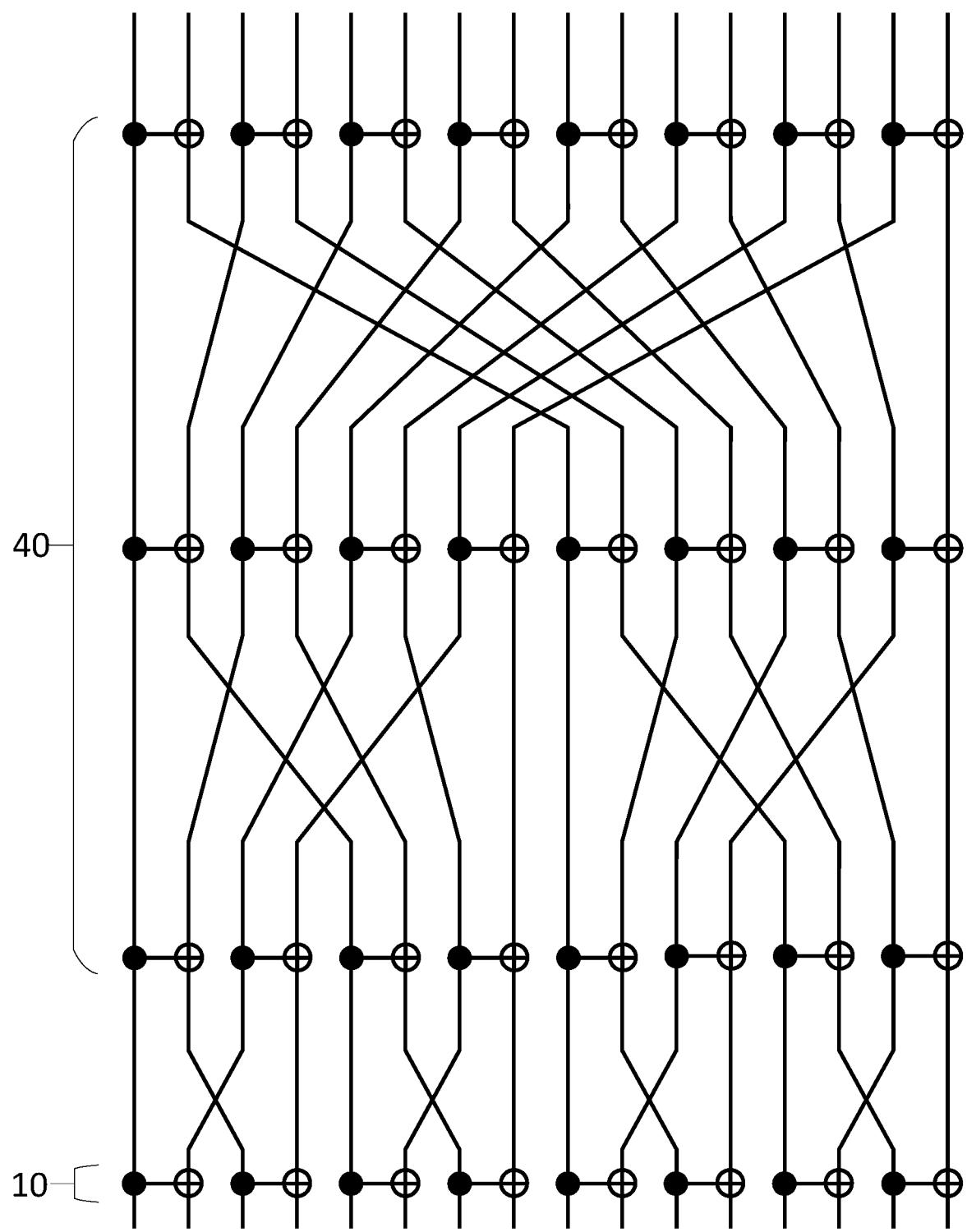
Figure 1F:
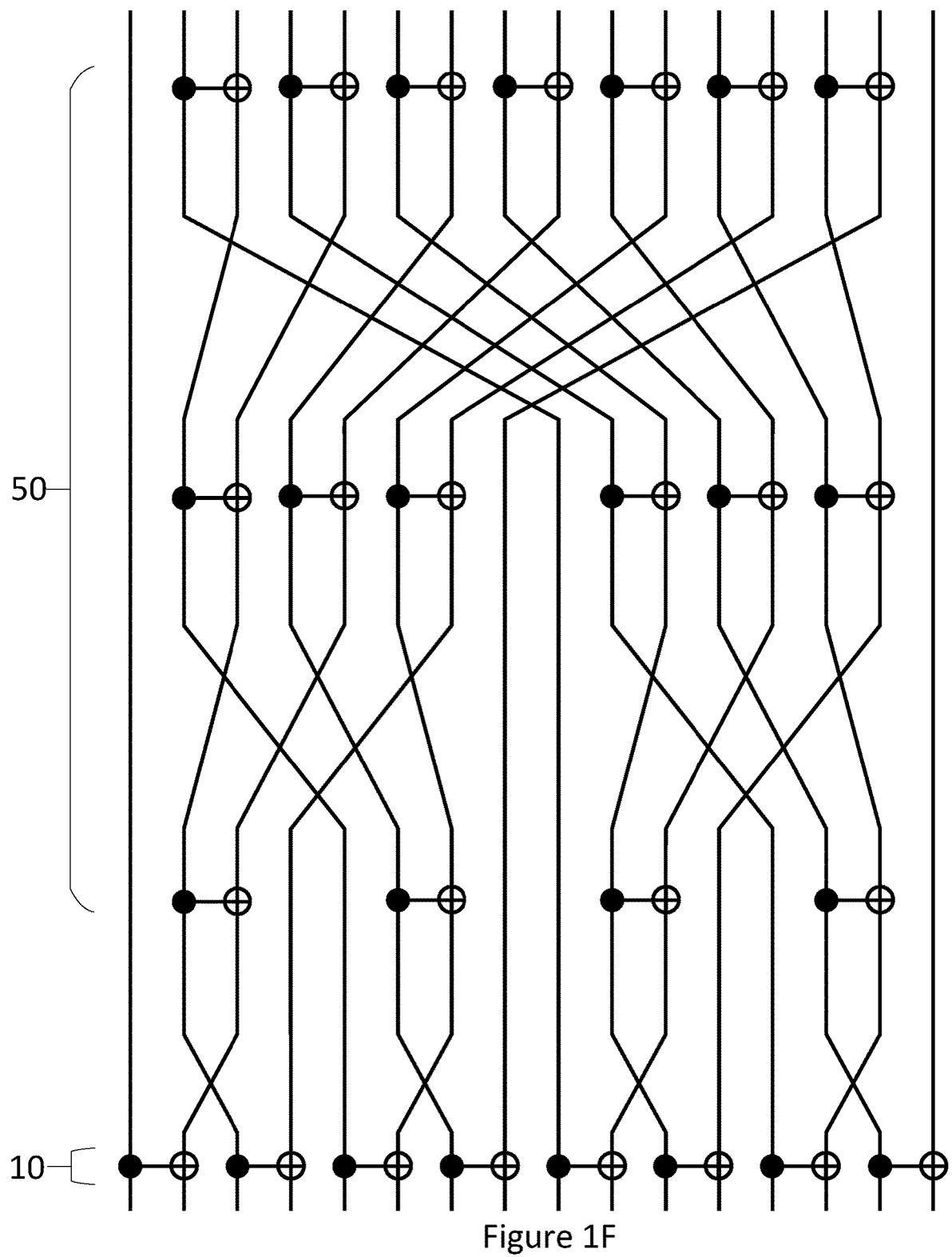
Figure 1G:
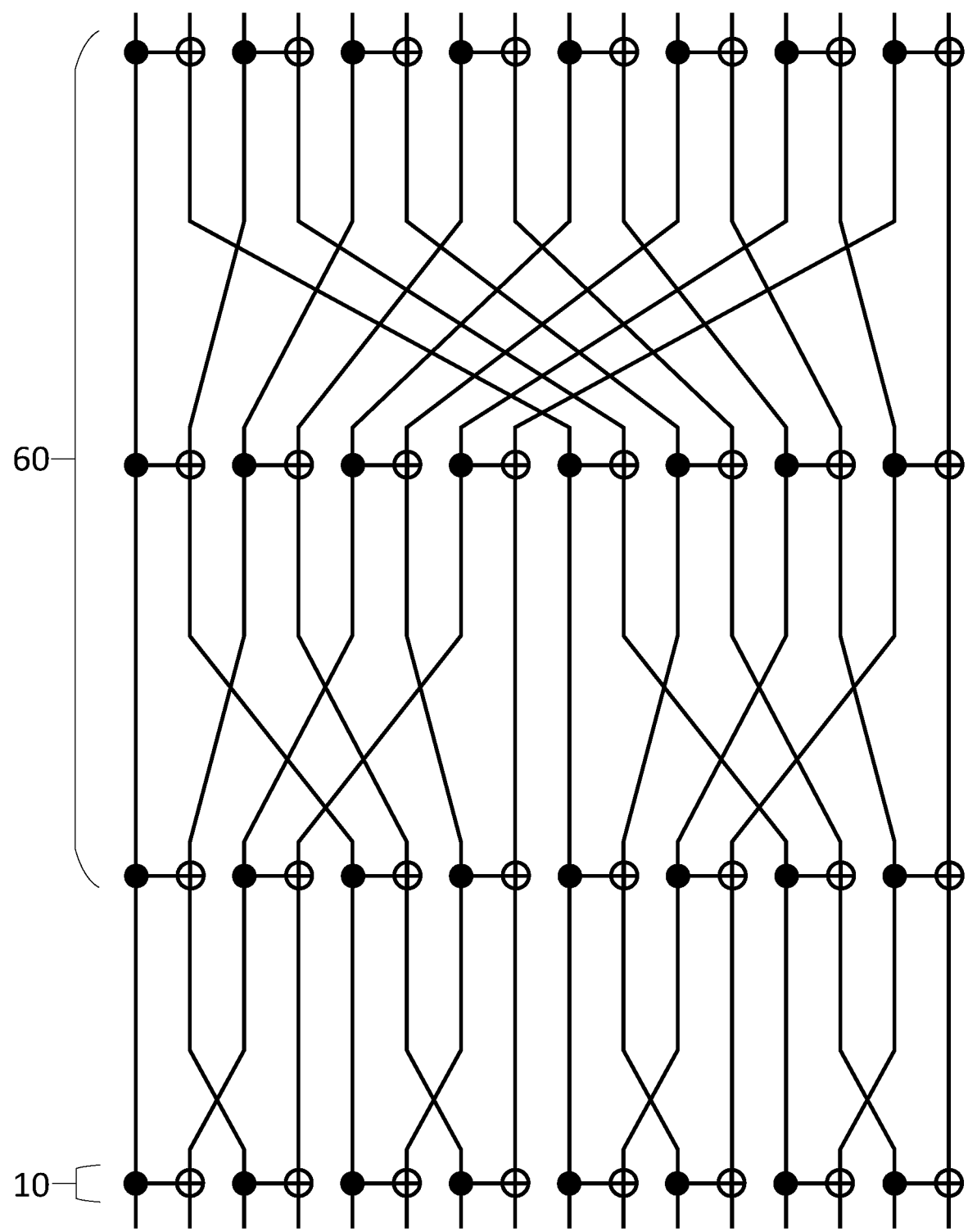
Figure 2:
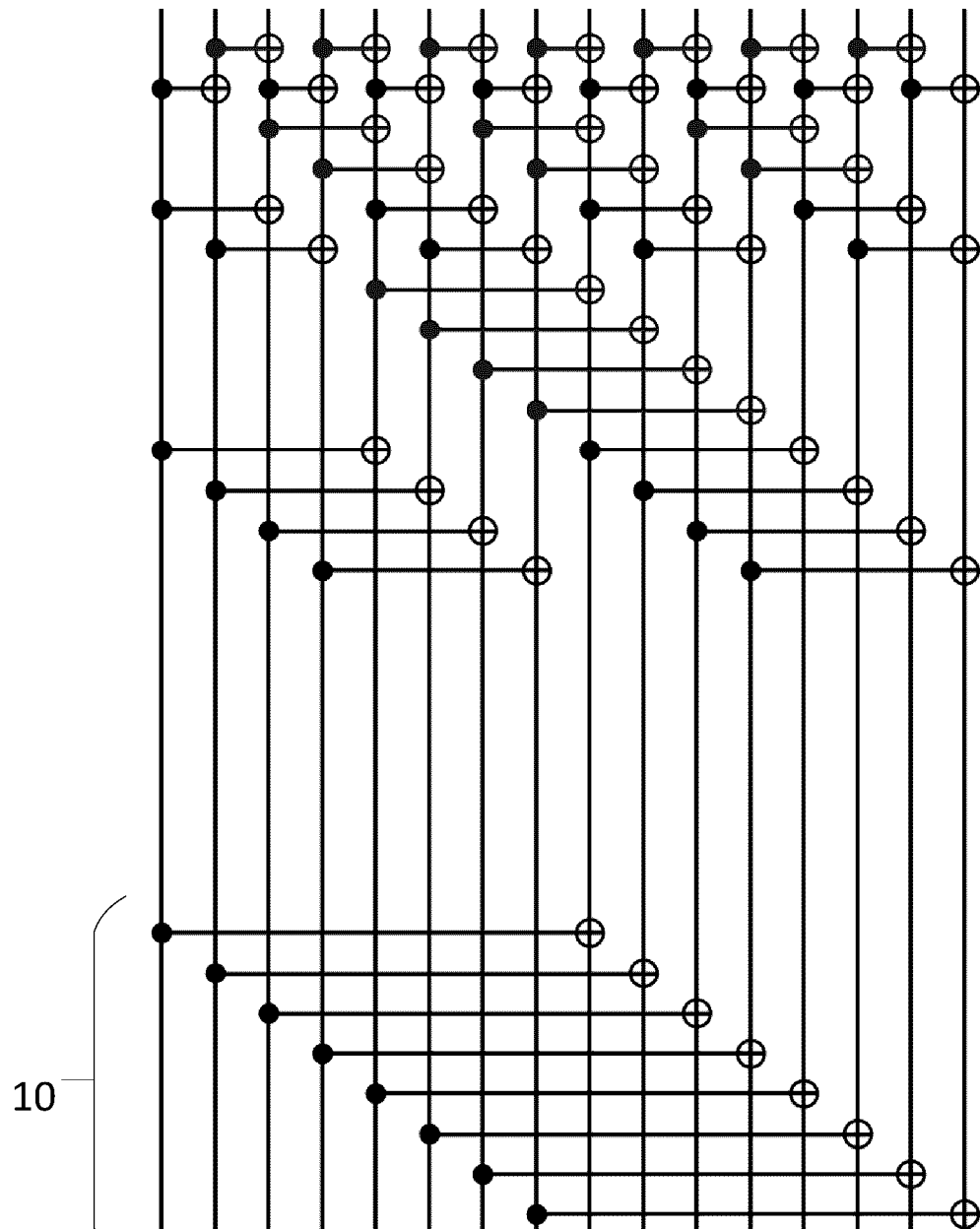
FIG. 2 is a logical view of an exemplary open boundary convolutional polar code encoding circuit in accordance with the teachings of the present invention.

Different encoding circuits can be built from the levels depicted in FIGS. 1B-1F. For instance, a generalized polar code encoding circuit is shown on FIG. 1C and contains the first level of gates 10 and a second level of CNOT gates 20. FIG. 1C' presents the same circuit as FIG. 1C in different logical representation. FIG. 1D shows a third level of CNOT gates 30. A generalized convolutional polar code encoding circuit is composed of the levels of CNOT gates 10, 20 and 30. FIG. 1D' presents a different logical representation of the generalized convolutional polar code encoding circuit also referred to herein as the periodic convolutional polar code or simply polar code. FIG. 1E shows a fourth level of CNOT gates 40. A "1-2 code" encoding circuit can be composed of the levels of CNOT gates 10, 30 and 40. A "1-2-1 code" encoding circuit can be composed of the levels of CNOT gates 10, 20, 30 and 40. FIG. 1F shows a fifth level of CNOT gates 50. A "2-1-2 code" encoding circuit can be composed of the levels of CNOT gates 10, 30, 40 and 50. A "2-1-2-1 code" encoding circuit can be composed of the levels of CNOT gates 10, 20, 30, 40 and 50. FIG. 1G shows a sixth level of CNOT gates 60. A "1-2-1-2 code" encoding circuit can be composed of the levels of CNOT gates 10, 30, 40, 50 and 60. FIG. 2 shows a graphical representation of an encoding circuit of the Convolutional Polar code with open boundaries. The Polar code contains half of the gates of the periodic Convolutional Polar code.

The presented generalization extends to higher dimensional fields and to codes with a larger branching ratio. In many of these cases, this opens up the possibility of using nonlinear gates for kernel. Efficient coding and decoding is expected for all of these extensions. It should be noted that not all branching MERA codes, according to the above definition, exhibit channel polarization—that will depend on the choice of gates used.

Figure 3A:
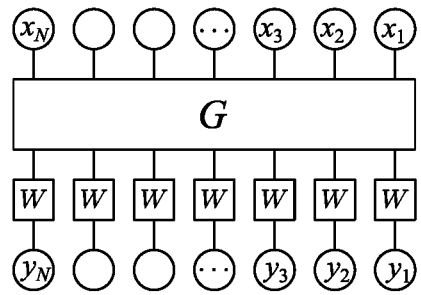
FIG. 3A, FIG. 3B, FIG. 3C, herein referred to concurrently as FIG. 3, are logical views of exemplary noisy transmission channels in accordance with the teachings of the present invention.
Figure 3B:
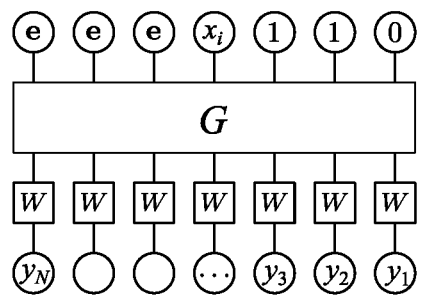
Figure 3C:
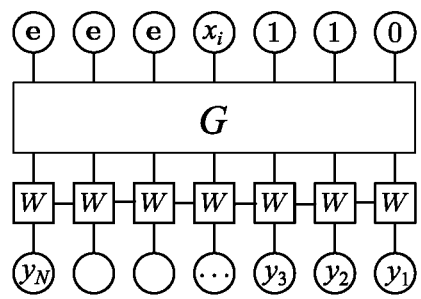

Viewing the encoding circuit of a code, such as the Convolutional Polar code encoding circuit shown at FIG. 1D', allows to recast the decoding problem as a Tensor Network (TN) contraction problem. FIG. 3A represents a TN diagram (or factor graph) of the generic decoding problem. The N input bits $x_i$ are a combination of k data bits and N−k frozen bits, which are passed through the encoding circuit G. Given the received output bits $y_i$ and the symmetric noise model W, the purpose of the decoding becomes to determine the most likely configuration of data bits. The unnormalized probability P(x|y) is given by contracting the TN of FIG. 3A, but this has computational complexity exponential with k. In FIG. 3B, the successive cancellation decoder iteratively determines input bits in a right-to-left order. To determine the relative probabilities of bit i, the bits to the right are frozen by design or using prior knowledge, while remaining completely ignorant about the states to the left, where "e" represents the uniform mixture (1, 1). In FIG. 3C, the tensor graph represents sequential decoding in the presence of correlated noise (as shown by the noise model W being interrelated between the bits).

The encoding circuit G is a rank-2N tensor, with N indices representing N input bits and N indices representing N output bits, where some of the input bits are fixed (frozen) to 0. It is to be noted that freezing the bits to 1 would also work and deciding to freeze the bits to 0 or 1 might be justified in presence or expectation of non-symmetric noise over the channel. Finally, the probability distribution over the value of a single bit can be represented as a rank-one tensor, with the tensor "0"=(1, 0) representing the bit value 0 and tensor "1"=(0, 1) representing the bit value 1. Given these tensors, the probability of the input bit string x= $(x_1, \ldots, x_N)$, given the observed output y=$(y_1, \ldots, y_N)$, can be represented as the TN shown at FIG. 3.

In general, not all TNs can be efficiently contracted. Referring to Eq. (1) where tensor A has rank 6 and tensor B has rank 5, the resulting tensor C from their contraction has rank 6+5−2=9. Thus, while tensor A is specified by $2^6$ entries and tensor B is specified by $2^5$ entries, tensor C contains $2^9 \gg 2^6+2^5$ entries. A TN composed of bounded-rank tensors (e.g., a circuit with only two-bit gates) can be specified efficiently. However, the tensors obtained at intermediate steps of the TN contraction schedule can be of very high rank r, and so its contraction will produce an intractable amount of data $2^r$. The contraction schedule that minimizes the intermediate tensor rank defines the treewidth of the graph, so generally the cost of contracting a TN is exponential with its treewidth.

Figure 4A:
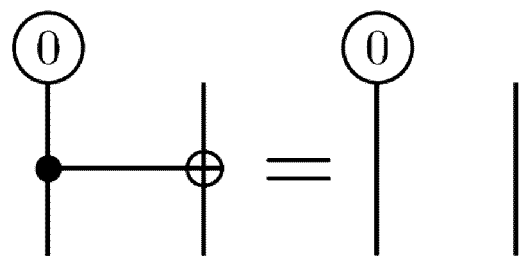
FIG. 4A, FIG. 4B and FIG. 4C, herein referred to concurrently as FIG. 4, are logical views of exemplary decoding calculation simplifiers, also referred to as identities, in accordance with the teachings of the present invention.
Figure 4B:
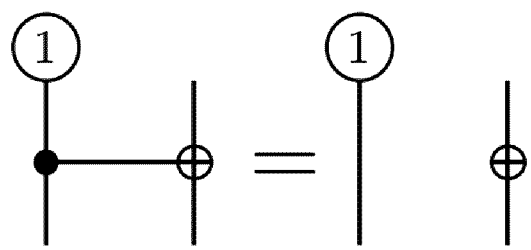
Figure 4C:
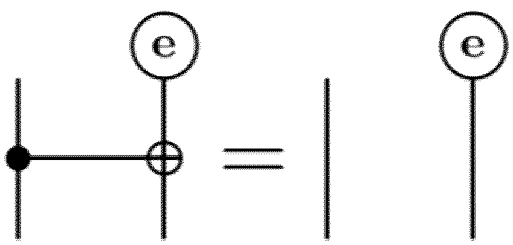

Encoding circuits that produce TNs with finite treewidth can therefore be efficiently decoded. This is the case for instance of Convolutional polar codes, whose corresponding TN is simply a chain, and therefore have a constant treewidth. However, it can sometimes be possible to efficiently decode even when the encoding circuit has a large treewidth by making use of special circuit identities that simplify the TN, which are depicted FIG. 4. For instance, FIG. 4A shows that a CNOT gate with a 0 entry on the controlled bit is equivalent to the identity. FIG. 4B shows that a CNOT gate with a 1 entry on the controlled bit is equivalent to the NOT gate on the target bit. The combination of such circuit identities provides a powerful graphical calculus that can be used to contract highly complex TNs. In particular, sequential cancellation decoding can be recast in this graphical calculus as an efficient TN contraction that relies precisely on identities.

The equivalence between several TNs families developed in the context of quantum many-body physics and encoding circuits of various classical and quantum error correcting codes exists. In particular, the computational techniques applicable in physics and coding theory to evaluate quantities of interest (e.g. magnetization in physics, bit likelihood in coding theory) are often identical. Of particular interest here are TNs called branching MERA, which are applied in physics both as a conceptual and numerical tool to understand the properties of potentially highly entangled physical systems, which exhibit separation of degrees of freedom at low energies. The graph representing this TN has a richer structure than the encoding circuit of Polar code, but yet it remains efficiently contractible. This is the key observation which enables a generalization of Polar codes.

The definition of a branching MERA code relies purely on the topology of the encoding circuit. For the special case of Polar and Convolutional Polar codes with two sublayers (or levels), these definitions are:

Definition 1: A code is said to be a Polar or Convolutional Polar code over N=$2^n$ bits (labelled 1 . . . N) if and only if its encoding circuit can be constructed recursively using the following rules. If N−1, we begin with the trivial code. An encoding circuit for a code of size N=$2^n$ can be constructed from those of two codes of size $2^n-1$ by interleaving the logical channels and adding the following two-bit gates to the beginning of the circuit.

As mentioned previously, in FIG. 1C and FIG. 1C' present the encoding circuit of the Polar code and FIG. 1D' presents the encoding circuit of the Convolutional Polar code with periodic boundaries, for $2^4$=16 sites. The logical bits enter into the top of the circuit, and the encoded message appears at the bottom.

For the Convolutional Polar code, we begin with a sublayer (or level) of $2^n-1$ CNOT gates, where the ith gate connects bits $2^i$ to $2^i+1$ (for i≠$2^n-1$). The final gate connects bit N with bit 1. If this gate is non-trivial, the Convolutional Polar code is said to be periodic (otherwise it is described as non-periodic or having open boundary conditions). For either the Polar or Convolutional Polar code, we next apply $2^n-1$ CNOT gates, where the ith gate connects bits $2^i-1$ to $2^i$. Adding more sublayers (or levels) lead to further generalizations of the convolutional polar code.

For the sake of simplicity only the Convolutional Polar code with two levels (or sublayers) example will be discussed further in terms of encoding and decoding. As will be shown, efficient decoding is performed by contracting the tensor network and examples will be provided for the Convolutional Polar code. It will become apparent to the skilled persons that the generalized encoding circuits can be decoded efficiently by contracting the corresponding tensor network. The contraction rules for the generalized encoding circuits are obtained by a straightforward generalization of the ones applicable for the Convolutional Polar code.

The encoding circuit for a Convolutional Polar code over N bits can be applied with a computation cost scaling as N $\log_2$ N, and when parallel processing is considered, only takes time scaling as $\log_2$ N. The total number of two-bit gates to encode using the Polar code is simply N/2 $\log_2$ N. The periodic Convolutional Polar code has precisely twice as many gates introduced at each layer, making for a total of N log$_2$ N. From the construction, it is clear that only one (Polar) or two (Convolutional Polar) layers of gates are applied every time the code size doubles, so the circuit depth is logarithmic: log$_2$ N for the Polar code and 2 log$_2$ N for the Convolutional Polar code.

The Convolutional Polar codes can be defined with periodic or open boundary conditions. The open boundary code is obtained from the periodic boundary code simply by removing the gate which connects bit $2^n$ to bit 1 in the n-th level of polarization. While such boundary conditions lead to two distinct encoding circuits, it has been noted that under successive cancellation decoding, the periodic and the open boundary Convolutional Polar codes become almost identical. Skilled persons will appreciate that minor modifications need to be applied for Open-boundary Convolutional Polar code when compared to periodic Convolutional Polar code.

The decoding problem requires a successive cancellation scheme in order to significantly simplify its resolution. In a successive cancellation decoder, the goal is to determine a single bit at the time, moving from right-to-left, by assuming complete ignorance of the input bits to the left, and total confidence in the value of the input bits to the right (either because they are frozen in the code, or because they have been previously decoded). A generic, optimal decoder will locate the codeword with maximal likelihood—that is, the most probable input $x=(x_1, \ldots, x_N)$, given the observed output $y=(y_1, \ldots, y_N)$, error model W, and a set of frozen bits $A^c$.

However, for many codes determining the most probable codeword exactly is a hard problem, and a range of (usually iterative) approximations are used. The successive cancellation decoder begins with the rightmost non-frozen bit at position i, and determines its value by maximizing the probability:

$$\max_{x_i} P(x_i | y, \{x_k, k=i-1, i-2, \ldots 1\})$$

For the purpose of the above calculation, the bits to the left of i (i.e. i+1, i+2, ... N) are considered unknown, even if they are frozen bits. The bits to the right of i (i.e. i−1, i−2, ... 1) are known, either because they are frozen or because they were decoded in a previous step. In this sense, the successive cancellation decoder is not an optimal decoder, because it does not take advantage of all the available information at every step. Once a bit is determined, the successive cancellation decoder proceeds to the next non-frozen bit, and so on, until the complete message has been determined.

Figure 5:
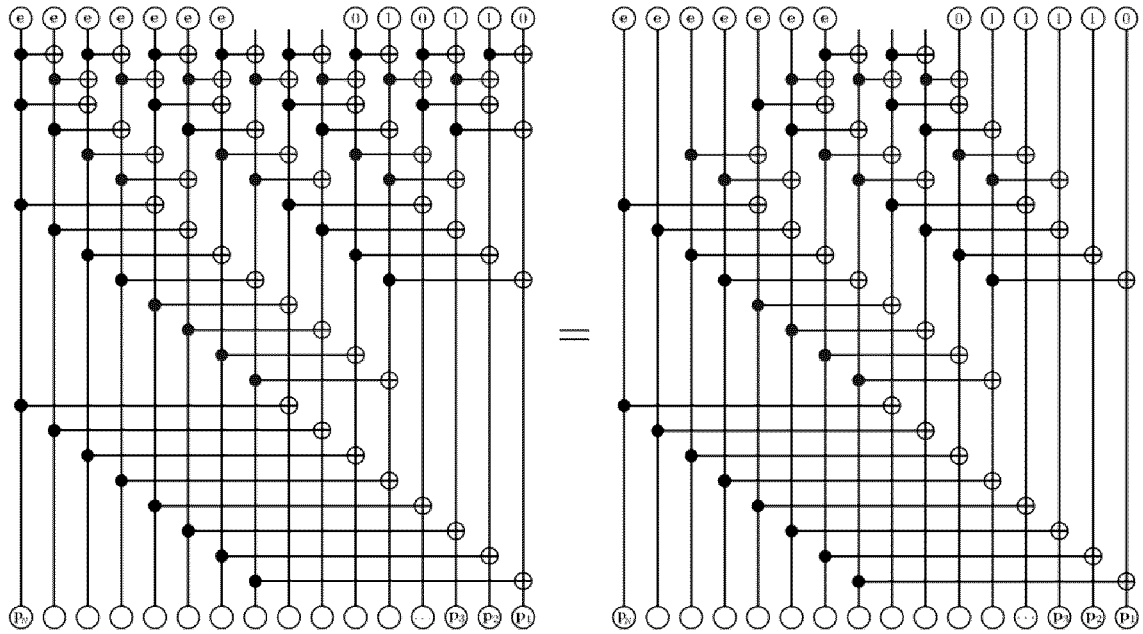
FIG. 5 is a logical view of decoding example with certain bits being determined and in which decoding calculation simplifiers are applied in accordance with the teachings of the present invention.

The CNOT gate has a very simple action on some states, such that it does not introduce any correlations to the joint distribution. Circuit identities have been previously introduced in FIG. 4 and define the action of a CNOT gate on the distributions "0", "1", and e. Generically, similar identities hold for all reversible (i.e. deterministic, one-to-one) gates—even non-linear gates. Applying these identities to the Polar code and Convolutional Polar code results in a vast simplification. In fact, most of the CNOT gates are removed, as illustrated at FIG. 5 for the Convolutional Polar code. In the example of FIG. 5, certain bits are determined and the decoding calculation simplifiers are applied to simplify the graph. As can be appreciated, the effect of the simplification may actually lead to the previously determined bits to change value (see $4^{th}$ bit). The number of remaining gates drops from N log$_2$ N to N.

For the Polar code, probing a single bit in the code results in effectively probing a single bit in two smaller codes, one layer below. This is not the case for the Convolutional Polar code, but a similar structure emerges when more bits are considered—probing a three-bit distribution in one layer can be mapped to probing three-bit distributions in two smaller codes below. To decode bits i, i+1 and i+2 using successive cancellation on the Convolutional Polar code of N bits, strictly less than 5N gates remain in the tensor network diagram.

Due to the construction of the Convolutional Polar code the odd and even sites can be split into two effective Convolutional Polar codes, each of which have three bits connected to the CNOTs above. The bits to the left are unknown, and the bits to the right are fully determined, and so the process iterates. Another 5 gates will remain in both the 'odd' and 'even' sub-code. For the bottom two layers, the number of bits in each code becomes fewer than 6, so the iteration ends. At the second-bottom layer, there are only four gates total, while there are just two in the lowest—in both cases less than five. The total number of gates is upper-bounded by 5(N−1).

Now that the tensor network diagram has been simplified, it remains to be shown that it can be contracted efficiently. While the gate cancellation is done from top-to-bottom, the tensor network contraction is done from bottom-to-top. To see how this is done, it is useful to highlight a few contraction identities, which are depicted in FIGS. 6A, 6B, 7A, 7B, 8 and 9 (referred to herein as FIGS. 6 to 9). In contrast to the circuit identities of FIG. 4 the contraction identities of FIGS. 6 to 9 are graphical in that they do not depend on the nature of the gates being contracted but only on the underlying graph structure. For instance, the CNOT gates used in these contraction identities could be replaced by any other rank-four tensor and preserve the identities. Applying these graphical identities repeatedly starting from the bottom of the diagrams of FIG. 5 and working upwards yields an efficient contraction schedule. The depicted contraction identities apply to arbitrary tensors. The tensor q depends on the specific tensor network being considered. On FIGS. 6 to 9, the tensor q conveys the number of open bits to which it can be reduced.

The Convolutional Polar code typically combines two bits at the lowest layer. The distributions can then be combined to a 3-bit distribution. The 3-bit to 3-bit transformation is a natural fixed point of the branching MERA. When the input bit is near the boundary, the lower layers may make several 2-bit to 2-bit transformations before moving to the 3-bit ones in. A single step of successive cancellation decoding in the N-bit Convolutional Polar code has computational cost linear in N. A full sweep of successive cancellation decoding can therefore be performed with computational cost $N^2$ log$_2$ for both the Polar and Convolutional Polar codes.

A full sweep of successive cancellation decoding can be performed at a reduced cost N log$_2$ N by storing in memory the contractions steps leading to successive cancellation decoder. Indeed, the TN representing the successive cancelation decoding of bit i and of bit i−1 only differ at log$_2$ N locations. Thus, if the result of the computations leading to the decoding of bit i−1 are stored in memory, the complexity of decoding bit i is only log$_2$ N, leading to a total complexity N log$_2$ N to decode all N bits.

It has been shown that the CNOT gate used in a polarization step transforms two erasure channels with erasure rates $\epsilon L$ and $\epsilon R$ (on the left and right, respectively) into two new effective erasure channels with erasure rates $\epsilon'_L = \epsilon_L \epsilon_R$ and $\epsilon'_R = \epsilon_L + \epsilon_R - \epsilon_L \epsilon_R$. The transformation is slightly more complicated for the Convolutional Polar, but can nonetheless be performed efficiently.

Under the erasure channel, the value of a bit is either known or not. Slightly more complex situations are to be considered. For instance the sum of two-bit values may be known while not knowing either. In general, the state of knowledge can be summarized by linear constraints. In the above example, the constraints would be expressed as $(1, 1)\cdot(x_1, x_2)=a$. In general, for a collection of n bits, the state of knowledge can be written $C_x=a$ where C is a k×n matrix with k≤n and a is a k-bit vector. Note that the actual value of the vector a is not important in our analysis since the purpose is to determine whether a quantity is known or not, and not its actual value.

Figure 7A:
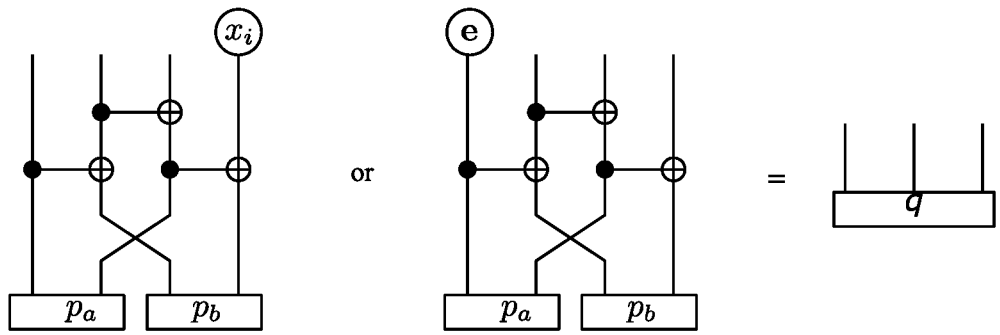
FIG. 7A, FIG. 7B and FIG. 7C, herein referred to concurrently as FIG. 7, are logical views of exemplary tensor circuits resulting in three open bits, in accordance with the teachings of the present invention.
Figure 7B:
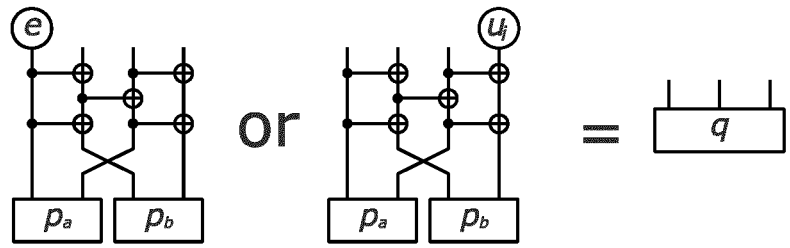
Figure 7C:
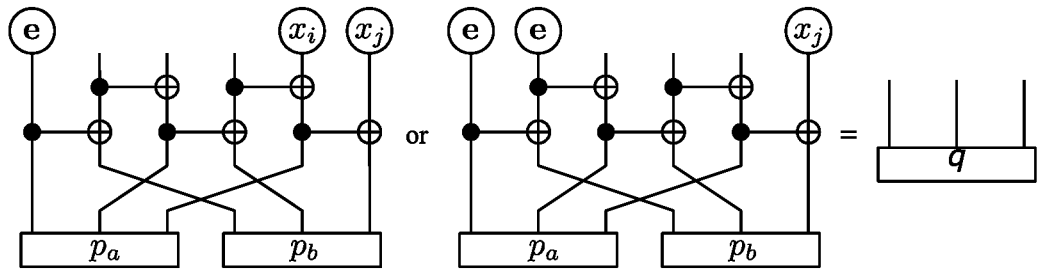
Figure 8:
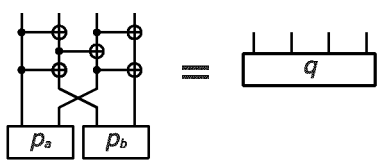
FIG. 8 is a logical view of exemplary tensor circuits resulting in 4 open bits, in accordance with the teachings of the present invention.
Figure 9A:
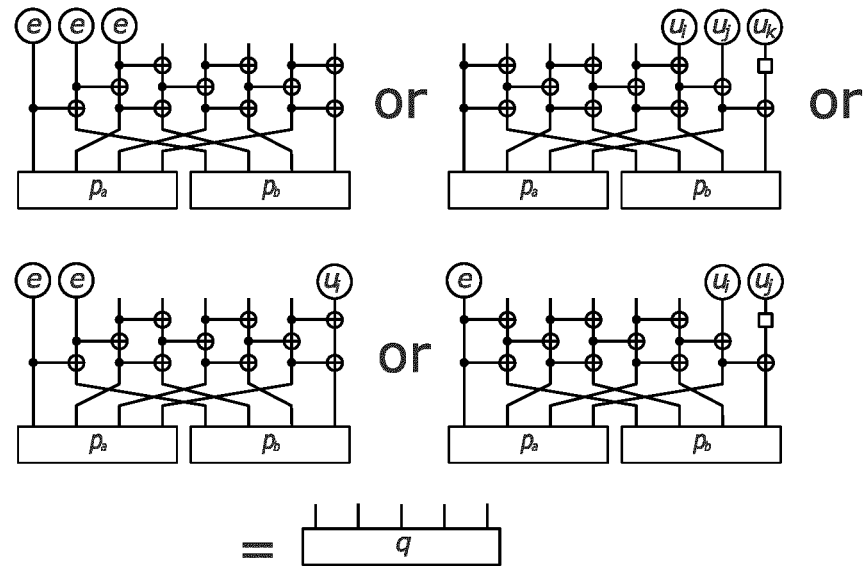
FIG. 9A and FIG. 9B, herein referred to concurrently as FIG. 9, are logical views of exemplary tensor circuits resulting in five open bits, in accordance with the teachings of the present invention.
Figure 9B:
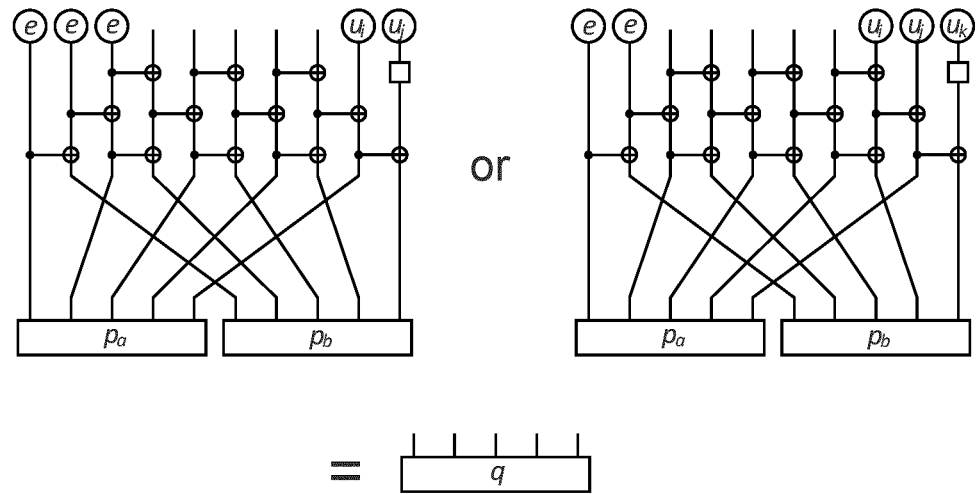

Consider the convolved polar transforms illustrated on FIG. 7C. They take as input two 3-bit probability distributions $p_a$ and $p_b$ which can be combined into a 6-bit distribution $q=p_a \otimes p_b$ and performs a linear invertible transformation M from 3 CNOT gates. Suppose that prior to the application of M, the state of knowledge of the 6 input bit was described by the equation $C_x=a$. Then, the state of knowledge of the output y=Mx is described by C'y=a where $C'=CM^{-1}$. Focusing on the transformation on the left of FIG. 7C, after the linear transformation, the first two bits are fixed to known values $x_1$ and $x_2$ while the last bit is ignored. To understand the effect of this on the state of knowledge, the matrix C' can be put in a standard form using the following row manipulations:

$$C' \sim \left( \begin{array}{c|c|c} A_{(k-u)\times 2} & B_{(k-u)\times 3} & 0_{(k-u)\times 1} \\ \hline D_{u\times 2} & E_{u\times 3} & 1_u \end{array} \right)$$

In these row manipulations, the subscript indicates the dimension of the matrix size, u=0 or 1, and $1_u$ denotes the u×u identity matrix. The matrix B represents the new state of knowledge for bits $y_3$, $y_4$ and $y_5$. A similar reasoning applies to the transformation on the right of FIG. 7C, the difference being that only the first bit is fixed and the last two bits are ignored. In that case, u can take the value 0, 1 or 2, and the dimensions are adjusted to $A_{(k-u)\times 1}$ and $D_{u\times 1}$.

There are 16 matrices C of dimensions k×3 for k≤3 which are distinct under row manipulations. Our study of the erasure channel is based on assigning probabilities to these 16 possible states of knowledge, and evolving these distributions through convolutional polar transforms as described above. Initially, each bit is erased with probability p, so a collection of 3 bits has the following distribution of states of knowledge:

$$p_1 = p^3, \quad B_1 = \emptyset.$$

$$p_2 = (1-p)p^2, \quad B_2 = (1 \quad 0 \quad 0).$$

$$p_3 = (1-p)p^2, \quad B_3 = (0 \quad 1 \quad 0).$$

$$p_4 = (1-p)p^2, \quad B_4 = (0 \quad 0 \quad 1).$$

$$p_9 = (1-p)^2 p, \quad B_9 = \begin{pmatrix} 1 & 0 & 0 \\ 0 & 1 & 0 \end{pmatrix}.$$

$$p_{10} = (1-p)^2 p, \quad B_{10} = \begin{pmatrix} 1 & 0 & 0 \\ 0 & 0 & 1 \end{pmatrix}.$$

$$p_{11} = (1-p)^2 p, \quad B_{11} = \begin{pmatrix} 0 & 1 & 0 \\ 0 & 0 & 1 \end{pmatrix}.$$

$$p_{15} = (1-p)^3, \quad B_{15} = \begin{pmatrix} 1 & 0 & 0 \\ 0 & 1 & 0 \\ 0 & 0 & 1 \end{pmatrix}.$$

All 9 other $p_j=0$. Our technique proceeds by combining pairs of knowledge $B_a$ and $B_b$ into a 6-bit state of knowledge $C=B_a \otimes B_b$ with probability $p_a p_b$, and applying either the procedure corresponding to the right or left of FIG. 7C to produce a new state of knowledge B. The resulting transformations on the states of knowledge can then be determined. More specifically, for a single bit $x_1$ under the erasure channel, there are only two states of knowledge: the value of $x_1$ is either known or unknown. For two bits $x_1$, $x_2$ (under the erasure channel followed by a linear circuit), there are 5 possible states of knowledge: both values $\{x_1, x_2\}$ are known, a single value $\{x_1\}$ or $\{x_2\}$ is known, their sum $\{x1+x2\}$ is known or nothing is known. Each of the 5 different states have its own probability of occurring. The application of a linear circuit (such as CNOT) permute the single-bit knowledge states $x_1$, $x_2$ and $x_1+x_2$, and their associated probabilities. In general, these states of knowledge correspond to the fact that erasure channels quantize trivially.

In the example of the Convolutional Polar code under successive cancellation, decoding can be represented as a tensor network with tree width equal to 3. States of knowledge over 3 bits is therefore to be addressed. For convenience all 15 states are enumerated hereinafter:

$$s_1 = \emptyset$$

$$s_2 = \{x_1\}$$

$$s_3 = \{x_2\}$$

$$s_4 = \{x_3\}$$

$$s_5 = \{x_1+x_2\}$$

$$s_6 = \{x_1+x_3\}$$

$$s_7 = \{x_2+x_3\}$$

$$s_8 = \{x_1+x_2+x_3\}$$

$$s_9 = \{x_1, x_2\}$$

$$s_{10} = \{x_1, x_3\}$$

$$s_{11} = \{x_2, x_3\}$$

$$s_{12} = \{x_1, x_2+x_3\}$$

$$s_{13} = \{x_2, x_1+x_3\}$$

$$s_{14} = \{x_3, x_1+x_2\}$$

$$s_{15} = \{x_1+x_2, x_2+x_3\}$$

$$s_{16} = \{x_1, x_2, x_3\}$$

Figure 6A:
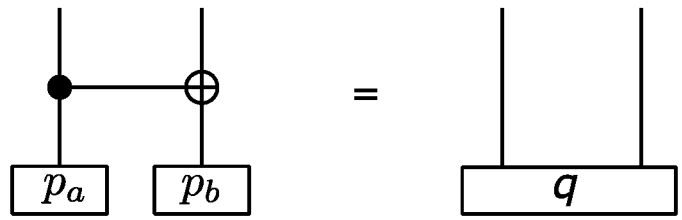
FIG. 6A and FIG. 6B, herein referred to concurrently as FIG. 6, are logical views of exemplary tensor circuits resulting in two open bits, in accordance with the teachings of the present invention.
Figure 6B:
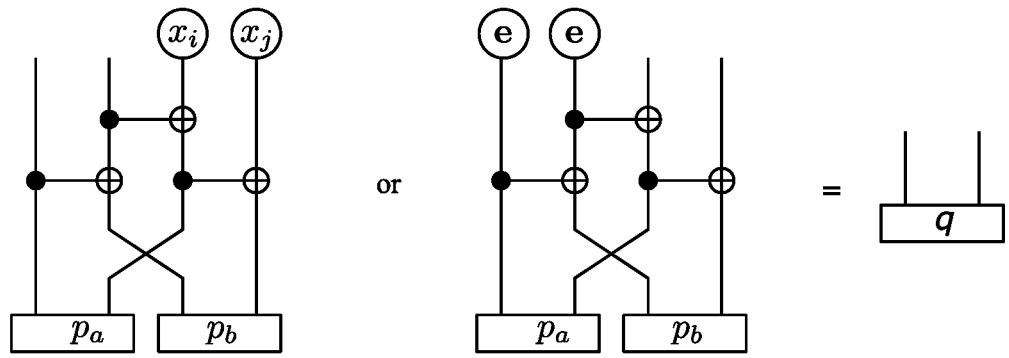

The transformation of the probabilities $p_i$ associated with states under each layer of the Convolutional Polar code in the bulk, can be determined (e.g., following FIG. 6A). Analogous to the Polar code, each layer of the Convolutional Polar code combines two identical channels—however in this case these are 3-bit channels. Two distinct transformations given by the location of the 3 logical bits being decoded exist. These are illustrated on the left and right of FIG. 6A. These transformations are.

$$p'_1 = p_1 p_1 + p_1 p_2 + p_1 p_5 + p_1 p_6 + p_1 p_8 + p_2 p_1 + p_5 p_1 + p_6 p_1 + p_8 p_1$$

$$p'_2 = p_2 p_2 + p_5 p_8 + p_6 p_6 + p_8 p_5$$

$p'_3 = p_2p_8 + p_5p_2 + p_6p_5 + p_8p_6$ $p'_4 = p_1p_4 + p_1p_{10} + p_1p_{14} + p_2p_4 + p_4p_1 + p_4p_2 + p_4p_4 + p_4p_5 + p_4p_6 + p_4p_8 + p_4p_{10} + p_4p_{14} + p_5p_4 + p_6p_4 + p_8p_4 + p_{10}p_1 + p_{10}p_4 + p_{14}p_1 + p_{14}p_4$ $p'_5 = p_1p_7 + p_1p_{12} + p_1p_{15} + p_2p_7 + p_3p_1 + p_3p_2 + p_3p_5 + p_3p_6 + p_3p_7 + p_3p_8 + p_3p_{12} + p_3p_{15} + p_5p_7 + p_6p_7 + p_8p_7 + p_9p_1 + p_9p_7 + p_{13}p_1 + p_{13}p_7$ $p'_6 = p_2p_6 + p_5p_5 + p_6p_2 + p_8p_8$ $p'_7 = p_2p_5 + p_5p_6 + p_6p_8 + p_8p_2$ $p'_8 = p_1p_3 + p_1p_9 + p_1p_{13} + p_2p_3 + p_5p_3 + p_6p_3 + p_7p_1 + p_7p_2 + p_7p_3 + p_7p_5 + p_7p_6 + p_7p_8 + p_7p_9 + p_7p_{13} + p_8p_3 + p_{12}p_1 + p_{12}p_3 + p_{15}p_1 + p_{15}p_3$ $p'_9 = p_2p_{12} + p_5p_{12} + p_6p_{15} + p_8p_{15} + p_9p_2 + p_9p_8 + p_9p_{12} + p_{13}p_5 + p_{13}p_6 + p_{13}p_{15}$ $p'_{10} = p_2p_{10} + p_5p_{14} + p_6p_{10} + p_8p_{14} + p_{10}p_2 + p_{10}p_6 + p_{10}p_{10} + p_{14}p_5 + p_{14}p_8 + p_{14}p_{14}$ $p'_{11} = p_2p_{14} + p_5p_{10} + p_6p_{14} + p_8p_{10} + p_{10}p_5 + p_{10}p_8 + p_{10}p_{14} + p_{14}p_2 + p_{14}p_6 + p_{14}p_{10}$ $p'_{12} = p_2p_9 + p_5p_{13} + p_6p_{13} + p_8p_9 + p_{12}p_2 + p_{12}p_5 + p_{12}p_9 + p_{15}p_6 + p_{15}p_8 + p_{15}p_{13}$ $p'_{13} = p_2p_{13} + p_5p_9 + p_6p_9 + p_8p_{13} + p_{12}p_6 + p_{12}p_8 + p_{12}p_{13} + p_{15}p_2 + p_{15}p_5 + p_{15}p_9$ $p'_{14} = p_1p_{11} + p_1p_{16} + p_2p_{11} + p_3p_3 + p_3p_4 + p_3p_9 + p_3p_{10} + p_3p_{11} + p_3p_{13} + p_3p_{14} + p_3p_{16} + p_4p_3 + p_4p_7 + p_4p_9 + p_4p_{11} + p_4p_{12} + p_4p_{13} + p_4p_{15} + p_4p_{16} + p_5p_{11} + p_6p_{11} + p_7p_4 + p_7p_7 + p_7p_{10} + p_7p_{11} + p_7p_{12} + p_7p_{14} + p_7p_{15} + p_7p_{16} + p_8p_{11} + p_9p_3 + p_9p_4 + p_9p_{11} + p_{10}p_3 + p_{10}p_7 + p_{10}p_{11} + p_{11}p_1 + p_{11}p_2 + p_{11}p_3 + p_{11}p_4 + p_{11}p_5 + p_{11}p_6 + p_{11}p_7 + p_{11}p_8 + p_{11}p_9 + p_{11}p_{10} + p_{11}p_{11} + p_{11}p_{12} + p_{11}p_{13} + p_{11}p_{14} + p_{11}p_{15} + p_{11}p_{16} + p_{12}p_4 + p_{12}p_7 + p_{12}p_{11} + p_{13}p_3 + p_{13}p_4 + p_{13}p_{11} + p_{14}p_3 + p_{14}p_7 + p_{14}p_{11} + p_{15}p_4 + p_{15}p_7 + p_{15}p_{11} + p_{16}p_1 + p_{16}p_3 + p_{16}p_4 + p_{16}p_7 + p_{16}p_{11}$ $p'_{15} = p_2p_{15} + p_5p_{15} + p_6p_{12} + p_8p_{12} + p_9p_5 + p_9p_6 + p_9p_{15} + p_{13}p_2 + p_{13}p_8 + p_{13}p_{12}$ $p'_{16} = p_2p_{16} + p_5p_{16} + p_6p_{16} + p_8p_{16} + p_9p_9 + p_9p_{10} + p_9p_{13} + p_9p_{14} + p_9p_{16} + p_{10}p_9 + p_{10}p_{12} + p_{10}p_{13} + p_{10}p_{15} + p_{10}p_{16} + p_{12}p_{10} + p_{12}p_{12} + p_{12}p_{14} + p_{12}p_{15} + p_{12}p_{16} + p_{13}p_9 + p_{13}p_{10} + p_{13}p_{13} + p_{13}p_{14} + p_{13}p_{16} + p_{14}p_9 + p_{14}p_{12} + p_{14}p_{13} + p_{14}p_{15} + p_{14}p_{16} + p_{15}p_{10} + p_{15}p_{12} + p_{15}p_{14} + p_{15}p_{15} + p_{15}p_{16} + p_{16}p_2 + p_{16}p_5 + p_{16}p_6 + p_{16}p_8 + p_{16}p_9 + p_{16}p_{10} + p_{16}p_{12} + p_{16}p_{13} + p_{16}p_{14} + p_{16}p_{15} + p_{16}p_{16}$

Evaluation of the erasure probability iterates these transformations following the contraction schedule of the tensor network associated to the code.

As such, similar procedures can be derived for the other combinations shown on FIG. 6 to 9. Using this procedure, given as input an independent erasure probability p, the probability $p_i$, that outputs bit $x_i$ is erased, can be exactly computed, conditioned on the fact that none of the bits $x_j, i < j$ were erased, that is, the probability that bit j is the first to be erased under successive cancellation decoding.

Figure 10:
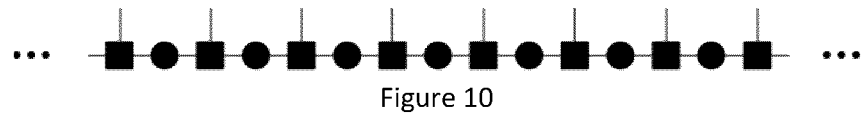
FIG. 10 is a logical view of an exemplary correlated noise tensor in accordance with the teachings of the present invention.

A decoding procedure can also be provided for Convolutional Polar codes in the presence of correlated errors. The suggested technique is applicable to Polar codes, Convolutional Polar codes and their generalizations based on the branching MERA tensor network. The technique can be applied to any finite-state memory channel. Equivalently, it is applicable to any noise model which can be described by a tensor network which has the topology of a chain. Our model involves two types of different tensor. One representing the transition probabilities (stochastic matrix), a rank-2 tensor and one representing the states of the Markov process describe by a rank-3 tensor (rank-2 for boundary). FIG. 10 provides a logical representation of noise as a tensor network. Two types of bonds are represented in the tensor network model, that is, the physical bonds and the logical bonds. There is a physical bond per state tensor. Also, the physical bond dimension equals to the dimension of the alphabet. The size of the code gives the number of physical bonds. Logical bonds link the transition matrices (circles) with the state tensors (squares). The logical bond dimension represents the number of memory states of the channel.

Figure 11:
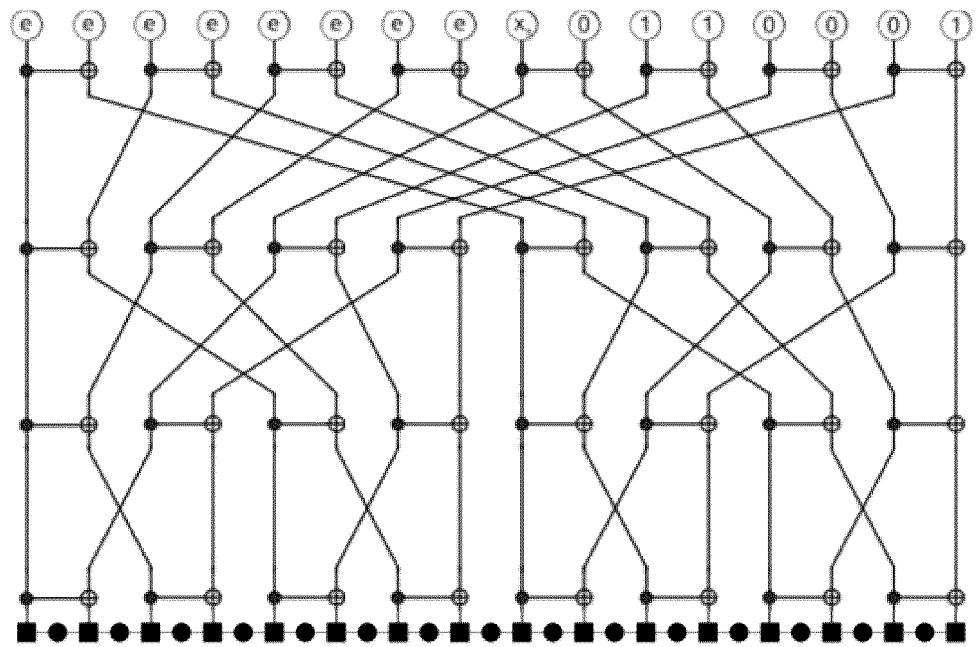
FIG. 11 is a logical view of an exemplary decoding problem for the $8^{th}$ bit of a 16 bit string in presence of correlated noise, in accordance with the teachings of the present invention.

Some noise models are correlated, meaning that when a given bit is affected, it is likely that neighboring bits are also affected (e.g., burst-noise channel). The proposed decoding technique under correlated noise is based on a tensor network contraction algorithm that is schematically represented by a contraction of the noise model tensor network and the code encoding circuit using a successive cancellation scheme. As an example, FIG. 11 presents the tensor network that is involved in the decoding of the bit in position 8 for a convolutional polar code of size N=16 bits.

Figure 12A:
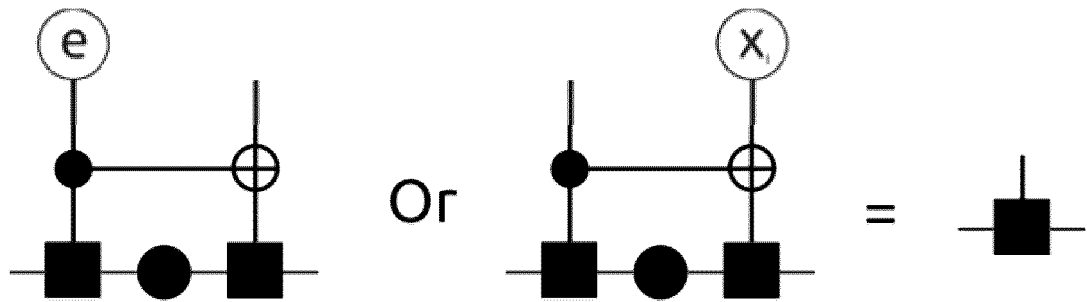
FIG. 12A, FIG. 12B, FIG. 12C and FIG. 12D, herein referred to concurrently as FIG. 12, are logical decoding representations in presence of correlated noise, in accordance with the teachings of the present invention.
Figure 12B:
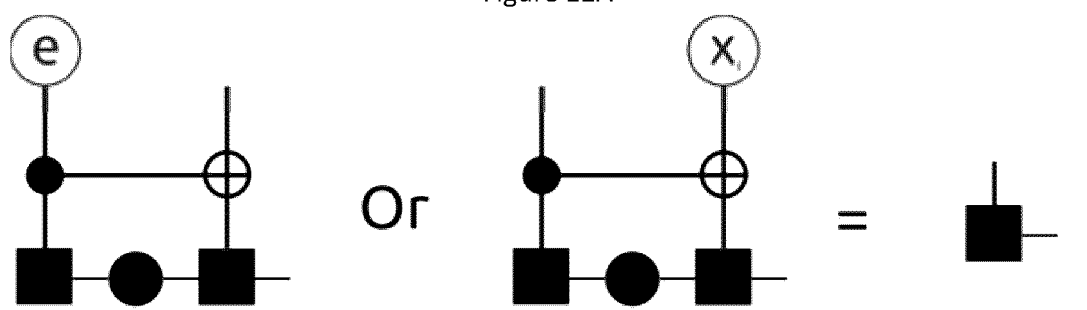
Figure 12C:
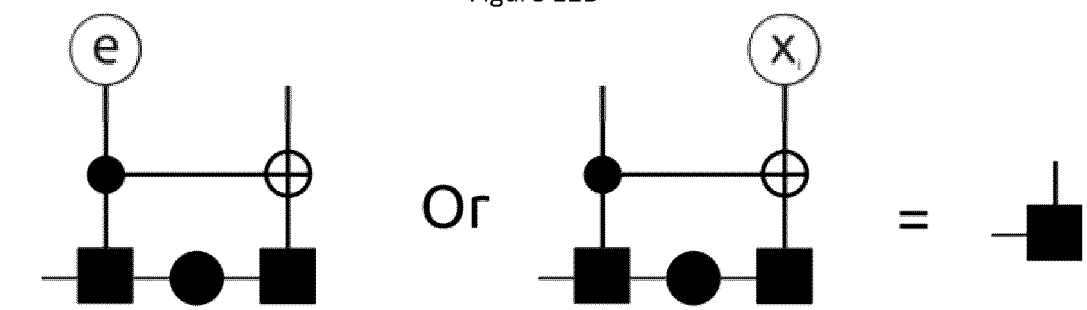
Figure 12D:
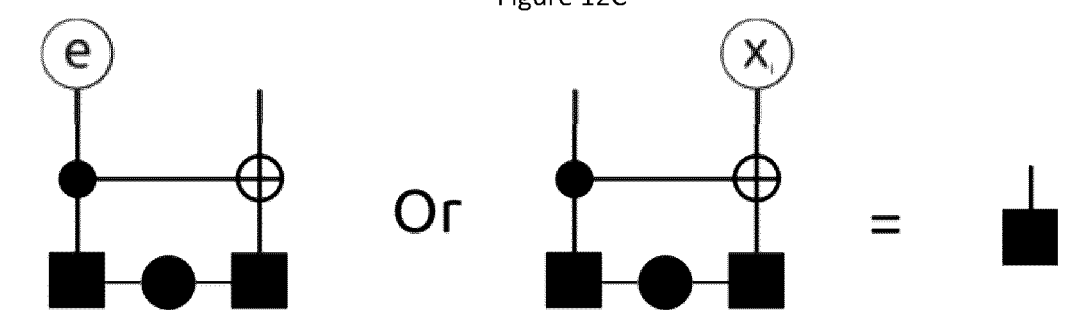

The first step in the technique is propagation of the bit states at the top of the circuit (tree tensor network attach to the noise model). In the second step, the simple contraction detailed in FIG. 12 is applied, from bottom to top. in the second step, the purpose is to simplify the graph to obtain a single probability vector (FIG. 12D). In the third step, iteration is performed in accordance with the successive cancellation decoder until the complete message is decoded.

An example of the decoding technique is illustrated in FIG. 13A to FIG. 13F for a polar code of size N=8 bits where the bit in position 5 is to be decoded. The result, in FIG. 13F, is a probability vector indicating the probability that the value of the bit in position 5 is 0 and the probability that the value of the bit in position 5 is 1. The highest probability is used to determine the value of the bit at position 5 and the decoding iterates with the bit in position 6, applying knowledge from bits 1 to 5.

Figure 14:
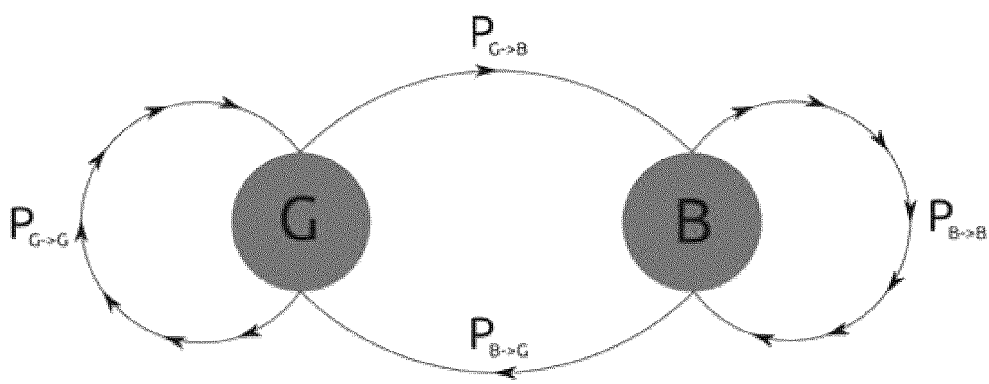
FIG. 14 is a logical view of an exemplary correlated noise model in accordance with the teachings of the present invention.

The decoding strategy in presence of correlated noise is adapted for any finite-state memory error model. For concreteness, a two state model is illustrated in FIG. 14. The depicted noise model is based on the Gilbert-Elliot channel. This noise is a 2-state Markov chain with constant transition probabilities. The model allows to simulate burst-noise when using the right parameters. This Markov chain is based on two states, that is the state G for Good and the state B for Bad. One can think of the two states G and B as two internal states of a memory along the channel. When the channel is in state G, the transmitted bits are affected by a Binary Symmetric Channel BSC($h_G$) which has a low error rate. When the channel is in state B, the transmitted bits are affected by BSC($h_B$) which is noisier, i.e. $h_G < h_B$. The memory of the channel transitions from Good to Bad with probability $P_{G \to B}$ at every time step and from Bad to Good with probability $P_{B \to G}$.

Given the transition probabilities, a stochastic matrix can be defined and it becomes possible to find the fraction of time spent in state G and B. To do so, a stationary distribution of the process is necessary. It corresponds to the eigenvector associate with the eigenvalue $\lambda=1$. Let P(B) be the fraction of time spend in the state B in average. Then, the average error probability of the channel is simply given by hP(B). Then $P(B) = P_{G \to B}/(P_{G \to B} + P_{B \to G})$ so that the average error probability is given by $P_e = hP_{G \to B}/(P_{G \to B} + P_{B \to G})$ Some metric may be used to quantify the correlation strength. In this noise model, $l_B$ is defined as a random variable that measure the length of a consecutive stay in state B referred to herein as the burst-length. That random variable is defined with a geometric distribution so we have $\langle l_B \rangle = 1/P_{B \to G}$.

Another metric that can be useful is the average number of transition $N_t$ between state G and B. This quantity is given by $\langle N_t \rangle = 2NP_{G \to B} P_{B \to G}/(P0_{G \to B} + P_{B \to G})$.

TABLE 1

Noise model parameters

| $P_{G \to B}$ | $P_{B \to G}$ | $\langle l_B \rangle$ | $\langle N_t \rangle$ |
|---|---|---|---|
| 0.01 | 0.04 | 25.00 | 16.384 |
| 0.02 | 0.08 | 12.50 | 32.768 |
| 0.03 | 0.12 | 8.33 | 49.152 |
| 0.04 | 0.16 | 6.25 | 65.536 |
| 0.05 | 0.20 | 5.00 | 81.920 |
| 0.06 | 0.24 | 4.17 | 98.304 |
| 0.07 | 0.28 | 3.57 | 114.688 |
| 0.08 | 0.32 | 3.13 | 131.072 |
| 0.09 | 0.36 | 2.78 | 147.456 |
| 0.10 | 0.40 | 2.50 | 163.840 |

During numerical simulation, the burst noise model in both a low-noise and a high-noise regimes have been measured. In the low-noise regime, the p probability of Bad is set to h=0.1. In the high-noise regime, the p probability is set to h=0.5 for the state Bad. In both regimes, the decoding technique proposed herein significantly outperforms the standard polar code constructions as well as the interleave construction. Indeed, the observed frame error rate (FER) and bit error rate (BER) are always significantly lower when using the decoding technique presented herein.

FIGS. 20A-20B, FIGS. 21A-21B, FIGS. 22A-22B and FIGS. 23A-23B present performance curves in presence of correlated noise for a code size of $2^{10}$ (1024) bits according to the burst-length and the transition of the channel for 3 types of decoding techniques. For the graphs on FIGS. 20A-20B and FIGS. 21A-21B, the probability of error in the bad state h=0.5 and in the good state h=0. For the graphs on FIGS. 22A-22B and FIGS. 23A-23B, the probability of error in the bad state h=0.1 and in the good state h=0. For all graphs, the 3 types of decoding techniques are 1) Correlated Polar Codes (adapted to correlated noise and in presence thereof); 2) Polar Code in presence of correlated noise (pc); and 3) Polar Codes when a random interleaver is added.

A Convolutional Polar code similar to the one depicted in the example of FIG. 1D' (composed of the levels of CNOT gates 10, 20 and 30), but generalized to 1024 bits will now be discussed. As skilled persons will have understood from the discussion above, once characteristics of a channel are predicted or known, it is possible to determine the most efficient position of each of the frozen bits using the above technique. For instance, the next table provides the worst positions when coding a message of 512 bits from the 1024 bits over a channel having a symmetrical probability of error equal, for every bit, to 0.5. Said differently, the following table provides the position of the 512 frozen bits. The position numbers have been ordered and are presented over multiple columns, for easier reference:

TABLE 2

Ordered worst positions for the convolutional polar code; erasure = ½, h = 0.5

| 1 | 26 | 51 | 76 | 101 | 126 | 151 | 176 | 379 | 511 | 633 | 707 | 759 | 815 | 855 | 886 | 913 | 938 | 963 | 988 | 1013 |
|---|---|---|---|---|---|---|---|---|---|---|---|---|---|---|---|---|---|---|---|---|
| 2 | 27 | 52 | 77 | 102 | 127 | 152 | 177 | 381 | 527 | 635 | 709 | 761 | 816 | 856 | 887 | 914 | 939 | 964 | 989 | 1014 |
| 3 | 28 | 53 | 78 | 103 | 128 | 153 | 178 | 383 | 535 | 637 | 711 | 763 | 817 | 857 | 888 | 915 | 940 | 965 | 990 | 1015 |
| 4 | 29 | 54 | 79 | 104 | 129 | 154 | 191 | 399 | 539 | 639 | 715 | 765 | 819 | 859 | 889 | 916 | 941 | 966 | 991 | 1016 |
| 5 | 30 | 55 | 80 | 105 | 130 | 155 | 253 | 415 | 541 | 643 | 717 | 767 | 821 | 860 | 891 | 917 | 942 | 967 | 992 | 1017 |
| 6 | 31 | 56 | 81 | 106 | 131 | 156 | 255 | 431 | 543 | 647 | 719 | 771 | 823 | 861 | 892 | 918 | 943 | 968 | 993 | 1018 |
| 7 | 32 | 57 | 82 | 107 | 132 | 157 | 287 | 439 | 559 | 651 | 723 | 773 | 824 | 862 | 893 | 919 | 944 | 969 | 994 | 1019 |
| 8 | 33 | 58 | 83 | 108 | 133 | 158 | 303 | 443 | 567 | 653 | 725 | 775 | 825 | 863 | 894 | 920 | 945 | 970 | 995 | 1020 |
| 9 | 34 | 59 | 84 | 109 | 134 | 159 | 311 | 445 | 571 | 655 | 727 | 779 | 827 | 864 | 895 | 921 | 946 | 971 | 996 | 1021 |
| 10 | 35 | 60 | 85 | 110 | 135 | 160 | 315 | 447 | 573 | 663 | 729 | 781 | 828 | 865 | 896 | 922 | 947 | 972 | 997 | 1022 |
| 11 | 36 | 61 | 86 | 111 | 136 | 161 | 317 | 463 | 575 | 665 | 731 | 783 | 829 | 867 | 897 | 923 | 948 | 973 | 998 | 1023 |
| 12 | 37 | 62 | 87 | 112 | 137 | 162 | 319 | 471 | 583 | 667 | 733 | 787 | 831 | 869 | 899 | 924 | 949 | 974 | 999 | 1024 |
| 13 | 38 | 63 | 88 | 113 | 138 | 163 | 335 | 475 | 591 | 669 | 735 | 789 | 832 | 871 | 900 | 925 | 950 | 975 | 1000 | |
| 14 | 39 | 64 | 89 | 114 | 139 | 164 | 343 | 477 | 599 | 671 | 737 | 791 | 833 | 872 | 901 | 926 | 951 | 976 | 1001 | |
| 15 | 40 | 65 | 90 | 115 | 140 | 165 | 347 | 479 | 603 | 679 | 739 | 793 | 835 | 873 | 902 | 927 | 952 | 977 | 1002 | |
| 16 | 41 | 66 | 91 | 116 | 141 | 166 | 349 | 487 | 605 | 683 | 741 | 795 | 837 | 875 | 903 | 928 | 953 | 978 | 1003 | |
| 17 | 42 | 67 | 92 | 117 | 142 | 167 | 351 | 491 | 607 | 685 | 743 | 797 | 839 | 876 | 904 | 929 | 954 | 979 | 1004 | |
| 18 | 43 | 68 | 93 | 118 | 143 | 168 | 359 | 493 | 611 | 687 | 745 | 799 | 841 | 877 | 905 | 930 | 955 | 980 | 1005 | |
| 19 | 44 | 69 | 94 | 119 | 144 | 169 | 363 | 495 | 615 | 691 | 747 | 801 | 843 | 878 | 906 | 931 | 956 | 981 | 1006 | |
| 20 | 45 | 70 | 95 | 120 | 145 | 170 | 365 | 499 | 619 | 693 | 749 | 803 | 845 | 879 | 907 | 932 | 957 | 982 | 1007 | |
| 21 | 46 | 71 | 96 | 121 | 146 | 171 | 367 | 501 | 621 | 695 | 751 | 805 | 847 | 880 | 908 | 933 | 958 | 983 | 1008 | |
| 22 | 47 | 72 | 97 | 122 | 147 | 172 | 371 | 503 | 623 | 697 | 752 | 807 | 848 | 881 | 909 | 934 | 959 | 984 | 1009 | |
| 23 | 48 | 73 | 98 | 123 | 148 | 173 | 373 | 505 | 627 | 699 | 753 | 809 | 849 | 883 | 910 | 935 | 960 | 985 | 1010 | |
| 24 | 49 | 74 | 99 | 124 | 149 | 174 | 375 | 507 | 629 | 701 | 755 | 811 | 851 | 884 | 911 | 936 | 961 | 986 | 1011 | |
| 25 | 50 | 75 | 100 | 125 | 150 | 175 | 377 | 509 | 631 | 703 | 757 | 813 | 853 | 885 | 912 | 937 | 962 | 987 | 1012 | |

It is also important to note that, in all likelihood, certain bits listed herein have probability of error very close to some of the bits that are indicated as unfrozen and that changing these interchanging these bits would mostly have negligible effect on the overall performance. To illustrate this, the same position numbers as provided above are provided again, but this time from worst position number to best position number. Again, they are presented over multiple columns, for easier reference:

TABLE 3

Unordered worst positions for the convolutional polar code; erasure = ½

| | | | | | | | | | | | | | | | | | | | | |
|---|---|---|---|---|---|---|---|---|---|---|---|---|---|---|---|---|---|---|---|---|
| 1007 | 995 | 951 | 939 | 883 | 942 | 731 | 851 | 447 | 904 | 864 | 505 | 487 | 399 | 17 | 42 | 67 | 92 | 117 | 142 | 167 |
| 1015 | 959 | 943 | 765 | 735 | 909 | 699 | 797 | 821 | 729 | 849 | 287 | 906 | 303 | 18 | 43 | 68 | 93 | 118 | 143 | 168 |
| 1019 | 1000 | 976 | 970 | 703 | 755 | 783 | 507 | 918 | 697 | 679 | 894 | 930 | 311 | 19 | 44 | 69 | 94 | 119 | 144 | 169 |
| 1021 | 975 | 1002 | 879 | 944 | 383 | 575 | 835 | 819 | 781 | 629 | 737 | 828 | 335 | 20 | 45 | 70 | 95 | 120 | 145 | 170 |
| 1022 | 993 | 994 | 863 | 958 | 827 | 867 | 897 | 934 | 833 | 878 | 914 | 902 | 343 | 21 | 46 | 71 | 96 | 121 | 146 | 171 |
| 1023 | 1014 | 767 | 763 | 877 | 948 | 727 | 807 | 367 | 892 | 860 | 805 | 475 | 709 | 22 | 47 | 72 | 97 | 122 | 147 | 172 |
| 1024 | 1010 | 969 | 966 | 929 | 940 | 695 | 795 | 813 | 573 | 824 | 793 | 371 | 253 | 23 | 48 | 73 | 98 | 123 | 148 | 173 |
| 1017 | 979 | 972 | 925 | 861 | 917 | 637 | 753 | 745 | 779 | 627 | 583 | 443 | 665 | 24 | 49 | 74 | 99 | 124 | 149 | 174 |
| 1013 | 1006 | 974 | 889 | 639 | 928 | 901 | 543 | 932 | 896 | 876 | 501 | 463 | 773 | 25 | 50 | 75 | 100 | 125 | 150 | 175 |
| 1011 | 1004 | 893 | 931 | 761 | 907 | 845 | 503 | 916 | 725 | 856 | 541 | 801 | 1 | 26 | 51 | 76 | 101 | 126 | 151 | 176 |
| 991 | 981 | 963 | 960 | 903 | 839 | 719 | 381 | 351 | 693 | 653 | 787 | 643 | 2 | 27 | 52 | 77 | 102 | 127 | 152 | 177 |
| 1003 | 985 | 953 | 945 | 847 | 749 | 926 | 946 | 319 | 571 | 621 | 499 | 365 | 3 | 28 | 53 | 78 | 103 | 128 | 153 | 178 |
| 999 | 998 | 927 | 759 | 875 | 823 | 687 | 825 | 811 | 723 | 651 | 539 | 439 | 4 | 29 | 54 | 79 | 104 | 129 | 154 | |
| 1020 | 996 | 986 | 964 | 859 | 924 | 635 | 938 | 669 | 817 | 619 | 832 | 471 | 5 | 30 | 55 | 80 | 105 | 130 | 155 | |
| 1018 | 977 | 982 | 831 | 962 | 815 | 873 | 880 | 711 | 691 | 415 | 789 | 848 | 6 | 31 | 56 | 81 | 106 | 131 | 156 | |
| 1005 | 973 | 891 | 952 | 871 | 747 | 843 | 905 | 775 | 591 | 886 | 377 | 816 | 7 | 32 | 57 | 82 | 107 | 132 | 157 | |
| 1016 | 992 | 965 | 923 | 950 | 936 | 857 | 791 | 741 | 567 | 605 | 493 | 363 | 8 | 33 | 58 | 83 | 108 | 133 | 158 | |
| 1012 | 957 | 968 | 956 | 921 | 671 | 631 | 495 | 667 | 717 | 615 | 535 | 431 | 9 | 34 | 59 | 84 | 109 | 134 | 159 | |
| 1009 | 895 | 949 | 978 | 855 | 881 | 655 | 379 | 255 | 685 | 771 | 900 | 317 | 10 | 35 | 60 | 85 | 110 | 135 | 160 | |
| 1001 | 971 | 941 | 911 | 757 | 920 | 623 | 912 | 908 | 559 | 872 | 752 | 349 | 11 | 36 | 61 | 86 | 111 | 136 | 161 | |
| 983 | 955 | 980 | 919 | 511 | 733 | 869 | 865 | 739 | 633 | 603 | 862 | 359 | 12 | 37 | 62 | 87 | 112 | 137 | 162 | |
| 989 | 988 | 947 | 751 | 829 | 743 | 607 | 922 | 910 | 647 | 707 | 491 | 611 | 13 | 38 | 63 | 88 | 113 | 138 | 163 | |
| 987 | 984 | 887 | 885 | 799 | 913 | 853 | 837 | 663 | 715 | 527 | 373 | 809 | 14 | 39 | 64 | 89 | 114 | 139 | 164 | |
| 997 | 967 | 935 | 933 | 915 | 701 | 888 | 479 | 803 | 683 | 884 | 445 | 315 | 15 | 40 | 65 | 90 | 115 | 140 | 165 | |
| 1008 | 990 | 961 | 937 | 954 | 899 | 509 | 375 | 191 | 841 | 599 | 477 | 347 | 16 | 41 | 66 | 91 | 116 | 141 | 166 | |

It can be noted that the first 178 bits (up to bit number 178) and the last 126 bits (from bit number 899 onwards) are frozen to 0 while the remaining frozen bits are scattered therebetween. However, the first 178 bits have a probability of error that is difficult to discriminate compare to the other remaining unfrozen bits and have therefore been chosen in numerical order rather than varying probability of error.

A second example is provided in the following table for the previously discussed "2-1-2 code" (composed of the levels of CNOT gates 10, 30, 40 and 50) generalized over 1024 bits. Again, the worst positions are provided when coding a message of 512 bits from the 1024 bits for the generalized "2-1-2 code" over a channel having a symmetrical probability of error equal, for every bit, to 0.5. Again, the position numbers have been ordered and are presented over multiple columns, for easier reference:

TABLE 4

Ordered worst positions for the "2-1-2 code"; erasure = ½

| | | | | | | | | | | | | | | | | | | | | |
|---|---|---|---|---|---|---|---|---|---|---|---|---|---|---|---|---|---|---|---|---|
| 191 | 257 | 307 | 357 | 407 | 457 | 507 | 557 | 607 | 657 | 707 | 757 | 807 | 838 | 863 | 888 | 913 | 938 | 963 | 988 | 1013 |
| 193 | 259 | 309 | 359 | 409 | 459 | 509 | 559 | 609 | 659 | 709 | 759 | 809 | 839 | 864 | 889 | 914 | 939 | 964 | 989 | 1014 |
| 195 | 261 | 311 | 361 | 411 | 461 | 511 | 561 | 611 | 661 | 711 | 761 | 811 | 840 | 865 | 890 | 915 | 940 | 965 | 990 | 1015 |
| 197 | 263 | 313 | 363 | 413 | 463 | 513 | 563 | 613 | 663 | 713 | 763 | 813 | 841 | 866 | 891 | 916 | 941 | 966 | 991 | 1016 |
| 199 | 265 | 315 | 365 | 415 | 465 | 515 | 565 | 615 | 665 | 715 | 765 | 815 | 842 | 867 | 892 | 917 | 942 | 967 | 992 | 1017 |
| 201 | 267 | 317 | 367 | 417 | 467 | 517 | 567 | 617 | 667 | 717 | 767 | 817 | 843 | 868 | 893 | 918 | 943 | 968 | 993 | 1018 |
| 203 | 269 | 319 | 369 | 419 | 469 | 519 | 569 | 619 | 669 | 719 | 769 | 819 | 844 | 869 | 894 | 919 | 944 | 969 | 994 | 1019 |
| 205 | 271 | 321 | 371 | 421 | 471 | 521 | 571 | 621 | 671 | 721 | 771 | 820 | 845 | 870 | 895 | 920 | 945 | 970 | 995 | 1020 |
| 223 | 273 | 323 | 373 | 423 | 473 | 523 | 573 | 623 | 673 | 723 | 773 | 821 | 846 | 871 | 896 | 921 | 946 | 971 | 996 | 1021 |
| 225 | 275 | 325 | 375 | 425 | 475 | 525 | 575 | 625 | 675 | 725 | 775 | 822 | 847 | 872 | 897 | 922 | 947 | 972 | 997 | 1022 |
| 227 | 277 | 327 | 377 | 427 | 477 | 527 | 577 | 627 | 677 | 727 | 777 | 823 | 848 | 873 | 898 | 923 | 948 | 973 | 998 | 1023 |
| 229 | 279 | 329 | 379 | 429 | 479 | 529 | 579 | 629 | 679 | 729 | 779 | 824 | 849 | 874 | 899 | 924 | 949 | 974 | 999 | 1024 |
| 231 | 281 | 331 | 381 | 431 | 481 | 531 | 581 | 631 | 681 | 731 | 781 | 825 | 850 | 875 | 900 | 925 | 950 | 975 | 1000 | |
| 233 | 283 | 333 | 383 | 433 | 483 | 533 | 583 | 633 | 683 | 733 | 783 | 826 | 851 | 876 | 901 | 926 | 951 | 976 | 1001 | |
| 235 | 285 | 335 | 385 | 435 | 485 | 535 | 585 | 635 | 685 | 735 | 785 | 827 | 852 | 877 | 902 | 927 | 952 | 977 | 1002 | |
| 237 | 287 | 337 | 387 | 437 | 487 | 537 | 587 | 637 | 687 | 737 | 787 | 828 | 853 | 878 | 903 | 928 | 953 | 978 | 1003 | |
| 239 | 289 | 339 | 389 | 439 | 489 | 539 | 589 | 639 | 689 | 739 | 789 | 829 | 854 | 879 | 904 | 929 | 954 | 979 | 1004 | |
| 241 | 291 | 341 | 391 | 441 | 491 | 541 | 591 | 641 | 691 | 741 | 791 | 830 | 855 | 880 | 905 | 930 | 955 | 980 | 1005 | |
| 243 | 293 | 343 | 393 | 443 | 493 | 543 | 593 | 643 | 693 | 743 | 793 | 831 | 856 | 881 | 906 | 931 | 956 | 981 | 1006 | |
| 245 | 295 | 345 | 395 | 445 | 495 | 545 | 595 | 645 | 695 | 745 | 795 | 832 | 857 | 882 | 907 | 932 | 957 | 982 | 1007 | |
| 247 | 297 | 347 | 397 | 447 | 497 | 547 | 597 | 647 | 697 | 747 | 797 | 833 | 858 | 883 | 908 | 933 | 958 | 983 | 1008 | |
| 249 | 299 | 349 | 399 | 449 | 499 | 549 | 599 | 649 | 699 | 749 | 799 | 834 | 859 | 884 | 909 | 934 | 959 | 984 | 1009 | |
| 251 | 301 | 351 | 401 | 451 | 501 | 551 | 601 | 651 | 701 | 751 | 801 | 835 | 860 | 885 | 910 | 935 | 960 | 985 | 1010 | |
| 253 | 303 | 353 | 403 | 453 | 503 | 553 | 603 | 653 | 703 | 753 | 803 | 836 | 861 | 886 | 911 | 936 | 961 | 986 | 1011 | |
| 255 | 305 | 355 | 405 | 455 | 505 | 555 | 605 | 655 | 705 | 755 | 805 | 837 | 862 | 887 | 912 | 937 | 962 | 987 | 1012 | |

A third example is provided in the following table for the previously discussed Polar Code depicted on FIGS. 1C and 1C' (composed of the levels of CNOT gates 10, 20). Again, the worst positions are provided when coding a message of 512 bits from the 1024 bits, but this time over a channel exhibiting memory effects (correlated noise) in which the probability of error in the bad state, for every bit, is 0.5 and the probability of error in the good state is 0 with a probability of transition Pgb=0.01 (from good to bad) and Pbg=0.04 (from bad to good). Again, the position numbers have been ordered and are presented over multiple columns, for easier reference:

TABLE 5

Ordered worst positions for the polar code under correlated noise;
h = 0.5 in the bad state; h = 0 in the good state; Pgb = 0.01 and Pbg = 0.04

| 1 | 26 | 51 | 120 | 239 | 351 | 428 | 475 | 506 | 573 | 638 | 712 | 751 | 792 | 828 | 874 | 904 | 935 | 963 | 988 | 1013 |
|---|----|----|-----|-----|-----|-----|-----|-----|-----|-----|-----|-----|-----|-----|-----|-----|-----|-----|-----|------|
| 2 | 27 | 52 | 122 | 240 | 352 | 430 | 476 | 507 | 574 | 639 | 716 | 752 | 794 | 829 | 875 | 906 | 936 | 964 | 989 | 1014 |
| 3 | 28 | 53 | 123 | 244 | 360 | 431 | 477 | 508 | 575 | 640 | 718 | 754 | 795 | 830 | 876 | 907 | 938 | 965 | 990 | 1015 |
| 4 | 29 | 54 | 124 | 246 | 364 | 432 | 478 | 509 | 576 | 656 | 719 | 755 | 796 | 831 | 877 | 908 | 939 | 966 | 991 | 1016 |
| 5 | 30 | 55 | 125 | 247 | 366 | 436 | 479 | 510 | 592 | 664 | 720 | 756 | 797 | 832 | 878 | 909 | 940 | 967 | 992 | 1017 |
| 6 | 31 | 56 | 126 | 248 | 367 | 438 | 480 | 511 | 600 | 668 | 724 | 757 | 798 | 840 | 879 | 910 | 941 | 968 | 993 | 1018 |
| 7 | 32 | 57 | 127 | 250 | 368 | 439 | 484 | 512 | 603 | 670 | 726 | 758 | 799 | 844 | 880 | 911 | 942 | 969 | 994 | 1019 |
| 8 | 33 | 60 | 128 | 251 | 372 | 440 | 486 | 528 | 604 | 671 | 727 | 759 | 800 | 846 | 882 | 912 | 943 | 970 | 995 | 1020 |
| 9 | 34 | 62 | 160 | 252 | 374 | 442 | 487 | 536 | 605 | 672 | 728 | 760 | 807 | 847 | 883 | 914 | 944 | 971 | 996 | 1021 |
| 10 | 35 | 63 | 176 | 253 | 375 | 443 | 488 | 540 | 606 | 680 | 730 | 761 | 808 | 848 | 884 | 915 | 946 | 972 | 997 | 1022 |
| 11 | 36 | 64 | 184 | 254 | 376 | 444 | 490 | 542 | 607 | 684 | 731 | 762 | 810 | 852 | 885 | 916 | 947 | 973 | 998 | 1023 |
| 12 | 37 | 80 | 188 | 255 | 378 | 445 | 491 | 543 | 608 | 686 | 732 | 763 | 811 | 854 | 886 | 917 | 948 | 974 | 999 | 1024 |
| 13 | 38 | 88 | 189 | 256 | 379 | 446 | 492 | 544 | 616 | 687 | 733 | 764 | 812 | 855 | 887 | 918 | 949 | 975 | 1000 | |
| 14 | 39 | 92 | 190 | 272 | 380 | 447 | 493 | 552 | 620 | 688 | 734 | 765 | 813 | 856 | 888 | 919 | 950 | 976 | 1001 | |
| 15 | 40 | 94 | 191 | 288 | 381 | 448 | 494 | 556 | 622 | 692 | 735 | 766 | 814 | 858 | 889 | 920 | 951 | 977 | 1002 | |
| 16 | 41 | 95 | 192 | 304 | 382 | 456 | 495 | 558 | 623 | 694 | 736 | 767 | 815 | 859 | 890 | 921 | 952 | 978 | 1003 | |
| 17 | 42 | 96 | 208 | 312 | 383 | 460 | 496 | 559 | 624 | 695 | 740 | 768 | 816 | 860 | 891 | 922 | 953 | 979 | 1004 | |
| 18 | 43 | 104 | 216 | 316 | 384 | 462 | 498 | 560 | 628 | 696 | 742 | 776 | 820 | 861 | 892 | 923 | 954 | 980 | 1005 | |
| 19 | 44 | 108 | 220 | 318 | 400 | 463 | 499 | 564 | 630 | 698 | 743 | 780 | 821 | 862 | 893 | 924 | 955 | 981 | 1006 | |
| 20 | 45 | 110 | 222 | 319 | 408 | 464 | 500 | 566 | 631 | 699 | 744 | 782 | 822 | 863 | 894 | 925 | 956 | 982 | 1007 | |
| 21 | 46 | 111 | 223 | 320 | 412 | 468 | 501 | 567 | 632 | 700 | 746 | 783 | 823 | 864 | 895 | 926 | 957 | 983 | 1008 | |
| 22 | 47 | 112 | 224 | 336 | 414 | 470 | 502 | 568 | 634 | 701 | 747 | 784 | 824 | 868 | 896 | 927 | 958 | 984 | 1009 | |
| 23 | 48 | 116 | 232 | 344 | 415 | 471 | 503 | 570 | 635 | 702 | 748 | 788 | 825 | 870 | 900 | 928 | 959 | 985 | 1010 | |
| 24 | 49 | 118 | 236 | 348 | 416 | 472 | 504 | 571 | 636 | 703 | 749 | 790 | 826 | 871 | 902 | 932 | 960 | 986 | 1011 | |
| 25 | 50 | 119 | 238 | 350 | 424 | 474 | 505 | 572 | 637 | 704 | 750 | 791 | 827 | 872 | 903 | 934 | 962 | 987 | 1012 | |

Of course, skilled persons will readily understand that these three tables represent only a selected few from thousands of possibilities. However, the method for determining the position of the frozen bits can be generalized. Firstly, the channel bandwidth needs to be determined. The generalized convolutional polar codes exemplified herein are best conveyed over $2^n$ number of bits, but an adapted encoder and decoder could be designed for any specific number of bits. For instance, given the tolerability of the generalized convolutional polar codes bitloss, one could design an encoder that is "wider" than the channel bandwidth and consequently consider the "extra" bits as lost during transmission (e.g., 1024 bit encoder or a 1000 bit-wide channel or 8192 bit encoder for a 6500 bit-wide channel). Secondly, apart from the channel bandwidth, the number of bits for the message needs to be determined (i.e., how many message bits). Considering the channel bandwidth, the number frozen bits can be computed. A determination that provides the probability of erasure for the channel is required (e.g., can be arbitrary, but should be as close as possible to the actual channel behavior). In some cases, the actual channel is best represented using the memory effect, which then provides different probabilities of erasure for the channel depending on the (good or bad) state and depending on the probability of transition between the good and the bad state and between the bad and the good state. The actual channel may or may not be best characterized as an erasure channel, but will nevertheless be characterized as such for the purpose of the present embodiment. Thirdly, once the (generalized) polar encoding circuit and an equivalent decoder is determined together with erasure characteristics for the channel, the worst positions can be orderly determined, for a given number of message bits.

The polar code and, more generally, the generalized convolutional polar code, may be particularly suited as a channel coding mechanism for the control channel (e.g., in the 5G standard). It is conceivable that different (generalized) polar code encoding and decoding schemes may be supported and/or made available for communications between mobile devices and the core network. A single (symmetrical) coding and decoding scheme may be used for uplink and downlink transmissions or, e.g., given the different physical capabilities of a mobile node compared to the core network, different schemes may be used in different directions. The mobile device and the core network may also be able to negotiate the selection of the proper scheme (e.g., default scheme complemented with capacity to update to a better suited scheme). Alternatively or in addition, the scheme may be imposed by the core network or may be imposed by the mobile device (e.g., physical limitations for coding/decoding capabilities). The scheme may be also be selected based on measured characteristics by the core network and/or the mobile device (e.g., radio characteristics and/or responsiveness metrics, etc.). That is, the core network may be responsible for dynamically determining the best coding scheme based on measured performance with a specific mobile node or, generally, with the mobile nodes surrounding a given base station or, even more generally, with the mobile nodes surrounding the base stations for one or more base station controllers.

Figure 24:
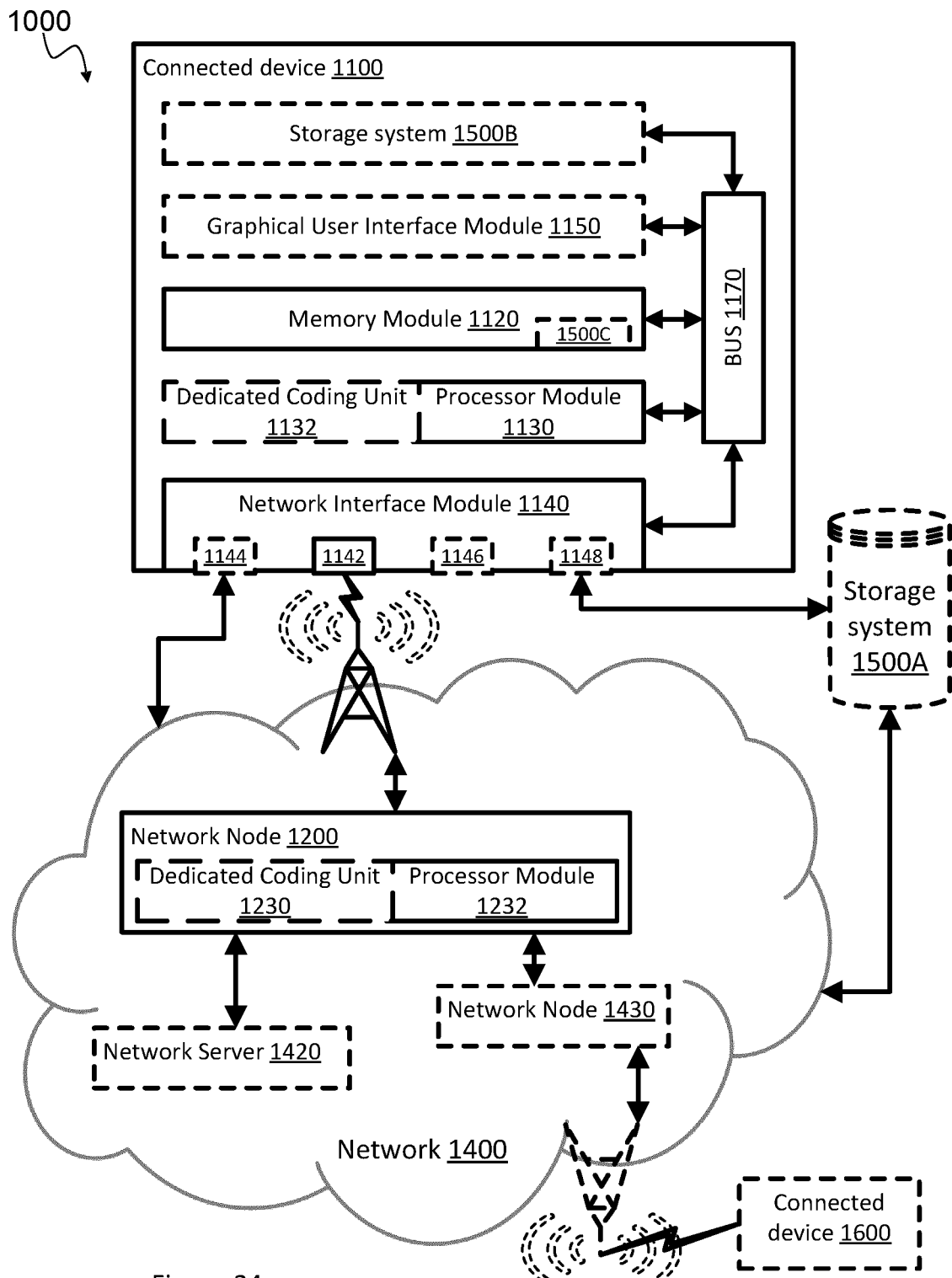
FIG. 24 is a logical modular view of an exemplary communication system in accordance with the teachings of the present invention.

FIG. 24 shows a logical modular representation of an exemplary computer telecommunications system 1000 enabling one or more electronic communication, in accordance with the teachings of the present invention (such as a conversation between two phones, telemetry data gathering by a measurement apparatus, data download from a cloud server, satellite communication between two ground stations or with a remote spacecraft, etc.). The computer telecommunications system 1000 comprises a connected device 1100, which may be involved in one or more of the interactive computer simulations.

In the depicted example of FIG. 1, the connected device 1100 comprises a memory module 1120, a processor module 1130 and a network interface module 1140. The processor module 1130 may represent a single processor with one or more processor cores or an array of processors, each comprising one or more processor cores. In some embodiments, the processor module 1130 may also comprise a dedicated coding unit 1132. The dedicated coding unit 1132 may be required, for instance, when the computer telecommunications system 1000 implements a code-intensive communication standard, which requires extensive coding capabilities (i.e., quality and throughput) to maintain expected network performance (e.g., see 5G requirements). In some embodiments, each of multiple connected devices 1100, 1600 and/or network node 1200 comprise a processor module having a dedicated coding unit similar to the dedicated coding unit 1132. The dedicated coding unit 1132 may, for instance, be a coding processor or a reserved portion of another processor reserved for coding. The dedicated coding unit 1132 may also selectively support more than one coding scheme, selectable at runtime. The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the connected device 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the connected device 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit mentions of the memory module 1120 and/or the processor module 1130 are not made throughout the description of the various embodiments, persons skilled in the art will readily recognize that such modules are used in conjunction with other modules of the connected device 1100 to perform routine as well as innovative steps related to the present invention.

The connected device 1100 may also comprise a Graphical User Interface (GUI) module 1150 comprising one or more display screen(s). The display screens of the GUI module 1150 could be split into one or more touch or passive screens, but could also be any combination of flat and/or curved touch or passive screen made accessible to a user position.

The computer telecommunications system 1000 comprises a storage system 1500 that comprises data related to various systems and subsystems of the system 1000 and that may further log dynamic data while one or more communications is being handled. FIG. 24 shows examples of the storage system 1500 as a distinct database system 1500A, a distinct module 1500B of the connected device 1100 or a sub-module 1500C of the memory module 1120 of the connected device 1100. The storage system 1500 may also comprise storage modules (not shown) on the connected device 1600/network node 1200. The storage system 1500 may be distributed over different systems A, B, C and/or the devices 1100, 1600, 1200 or may be in a single system. The storage system 1500 may comprise one or more logical or physical as well as local or remote hard disk drive (HDD) (or an array thereof). The storage system 1500 may further comprise a local or remote database made accessible to the connected device 1100 by a standardized or proprietary interface or via the network interface module 1140. The variants of storage system 1500 usable in the context of the present invention will be readily apparent to persons skilled in the art.

In the depicted example of FIG. 1, the computer telecommunications system 1000 shows a network node 1200 and an optional connected device 1600, which may communicate through the network 1400 with the connected device 1100. The network node 1200 is part of a core network of the network 1400 that is responsible of different aspects of the connectivity of the connected device to the network 1400. The connected device 1100 may be associated to an ongoing communication with the connected device 1600 or with another device and/or server (not shown). The connected device 1100 may also communicate with the network node 1200 for the purpose of maintaining a connection to the network 1400 (e.g., control-related data) and with another network node (not shown) when involved in a user-content data communication. As such, other computing device(s) (not shown) may be involved and may further use the coding schemes suggested therein. The different devices may also be associated with one or multiple actual users without affecting the teachings of the resent invention.

In the context of the depicted embodiments, runtime execution, real-time execution or real-time priority processing execution corresponds to operations executed during a communication between the connected device 1100 and the network 1200 that may have an impact on actual and/or perceived quality of the communication from a system or from a user perspective. An operation performed at runtime, in real-time or using real-time priority processing thus typically needs to meet certain performance constraints that may be expressed, for instance, in terms of maximum time, maximum number of frames, and/or maximum number of processing cycles. For instance, different telecommunications standards provide for different performance requirements. Skilled persons will readily recognize that real-time processing may not actually be achievable in absolutely all circumstances in which it would be best. The real-time priority processing required for the purpose of the disclosed embodiments relates to the connected device sets out to respect and/or the quality of service as codified within the network and/or as perceived by the user of the connected device, and does not require absolute real-time processing.

A control network (e.g., the network 1400 itself or another network overlaid on the network 1400) may be used, to exchange control-related information. For instance, handoff procedure, address management, cell and/or channel attribution for the connected device 1100 and events related to interactions of a user of the connected device 1100 (e.g., data usage or the like) may be shared through the control network. Likewise, network-wide events (e.g., related to status of the network, etc.) may be shared through the control network from one or more centralized computer systems (not shown). In addition, the storage module 1500 (e.g., a networked database system) may be accessible to different components of the computer telecommunications system 1000.

Figure 25:
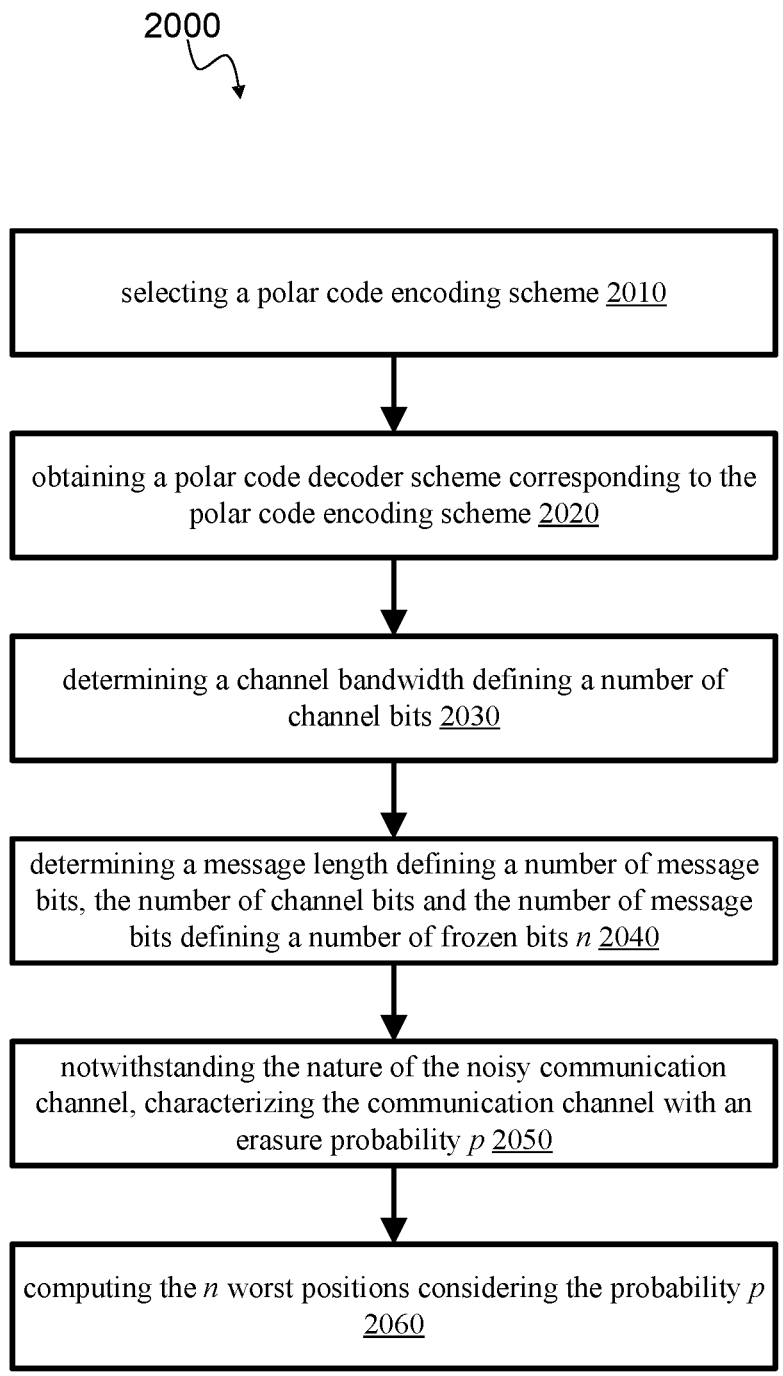
FIG. 25 is a flow chart of an exemplary method in accordance with the teachings of the present invention.

FIG. 25 shows a flow chart of an exemplary method 2000 for determining the n best positions of frozen bits in a channel decoder for a noisy communication channel. The method comprises selecting 2010 a polar code encoding scheme, obtaining 2020 a polar code decoder scheme corresponding to the polar code encoding scheme, determining 2030 a channel bandwidth defining a number of channel bits, determining 2040 a message length defining a number of message bits, the number of channel bits and the number of message bits defining a number of frozen bits n. The method also comprises, notwithstanding the nature of the noisy communication channel, characterizing 2050 the communication channel with an erasure probability p and computing 2060 then worst positions considering the probability p. The polar code encoding scheme may, for instance, be a convolutional polar code modeled using at least 2 levels of CNOT gates (as previously discussed as convolutional polar code, 1-2 code, 2-1-2 code, 1-2-1 code, 2-1-2-1 code, 1-2-1-2 code, etc.).

The polar code encoding scheme may have a number of bits k as a power of 2 and k may therefore be selected to be equal to or greater than the number of channel bits (considering resilience of the polar codes to erasure over the channel).

The polar code encoding scheme may alternatively comprise more than one sub-polar code, each comprising a number of coding bits expressed as a power of 2. (e.g., a $2^6$ code and a $2^7$ code for a total of 64+128=192 bits). The number of coding bits in each of the sub-polar code may then be selected such that the sum thereof is equal to or greater than the number of channel bits.

As previously discussed, the noisy communication channel may present correlated noise characteristics characterized by a good-state of erasure $p_2$, the probability of erasure p corresponding to a bad-state probability $p_1 \geq p_2$. The channel also provides a probability of transition between the good state and the bad state Pgb and between the good state and the bad state Pbg and computing the n worst positions further considers the probabilities $p_2$, Pgb and Pbg.

Another aspect of this exemplary embodiment may comprise a decoding method, building upon the exemplified method 2000, for implementing the polar code decoder scheme selected therein and having frozen bits at the n worst positions determined thereby. Likewise, a decoding processing unit supporting the polar code decoder scheme as per the method 2000 and having frozen bits at the n worst positions determined thereby may be provided.

Figure 26A:
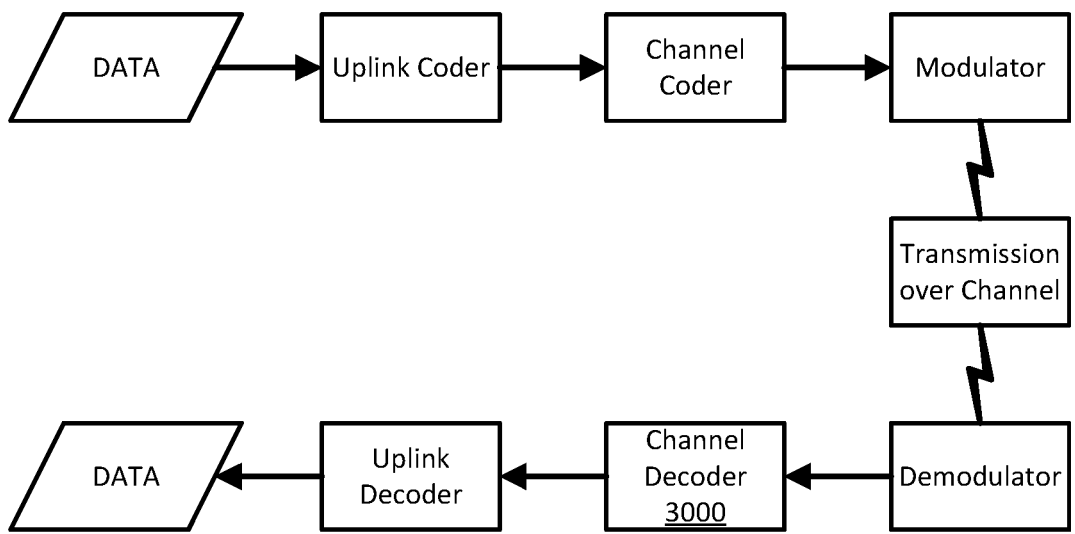
FIG. 26A, FIG. 26B, and FIG. 26C herein referred to concurrently as FIG. 26, are flow charts of exemplary methods in accordance with the teachings of the present invention.
Figure 26B:
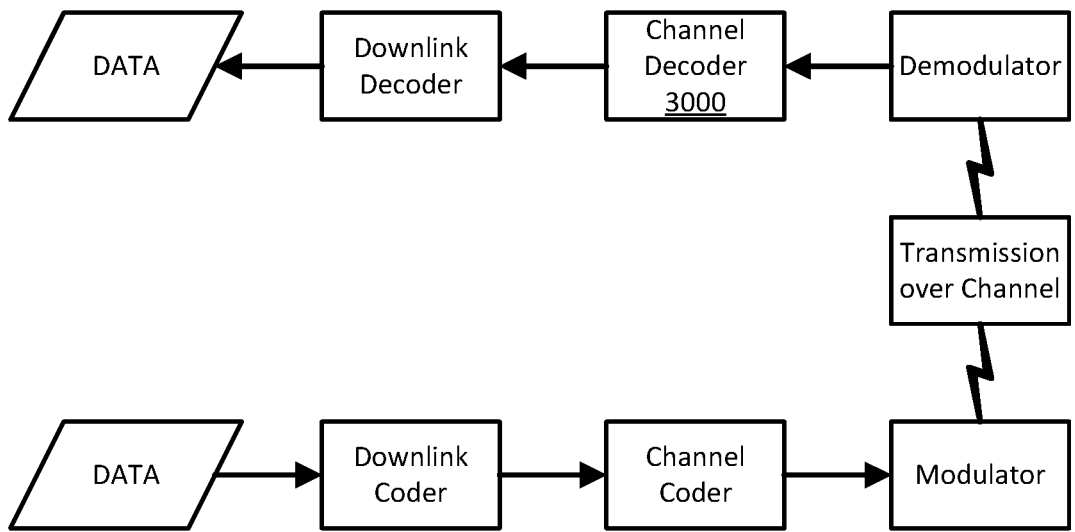
Figure 26C:
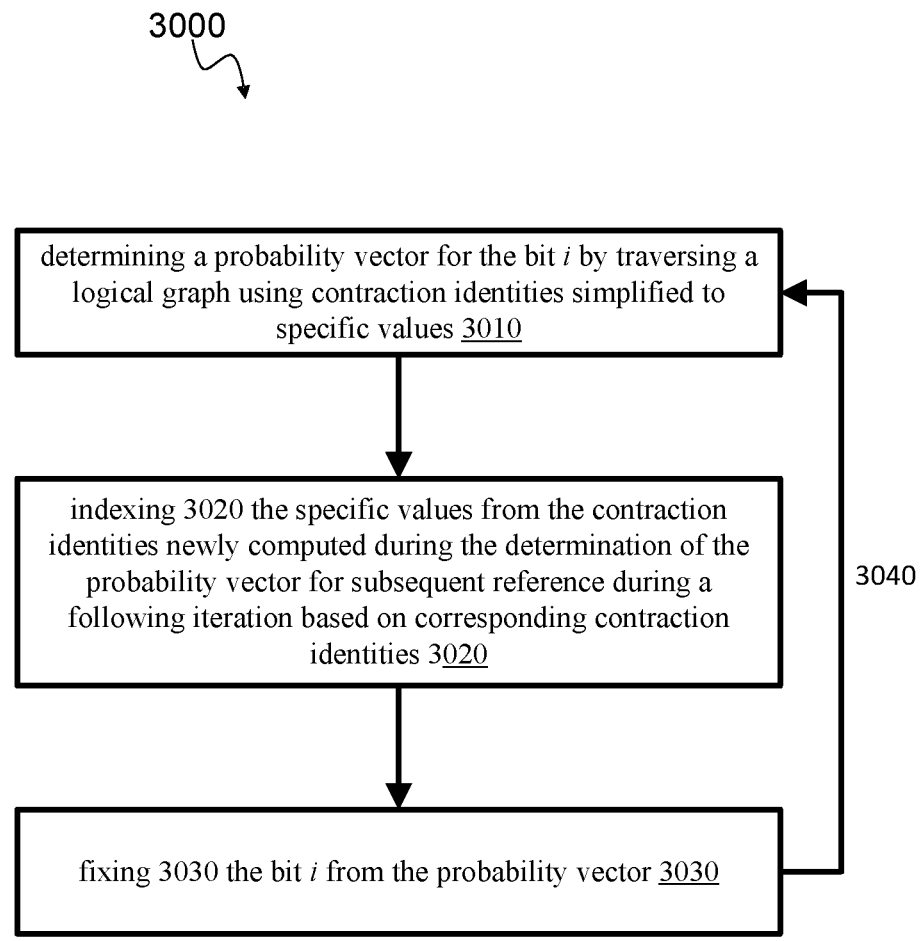

FIG. 26 depicts uplink (26A) and downlink (26B) encoding and decoding flowcharts. In one embodiment, a method 3000 is provided for iteratively decoding a message of n bits to obtain a message of m<n bits. The message is received over a noisy communication channel exhibiting correlated noise characterized by a bad-state probability of erasure $p_1$, a good-state of erasure $p_2$ with the probability $p_2 \leq p_1$. The channel further provides a probability of transition between the good state and the bad state Pgb and between the good state and the bad state Pbg. The method 3000 comprises iteratively, for each bit i from the n bits:
  determining 3010 a probability vector for the bit i by traversing a logical graph using contraction identities simplified to specific values;
  indexing 3020 the specific values from the contraction identities newly computed during the determination of the probability vector for subsequent reference during a following iteration based on corresponding contraction identities;
  fixing 3030 the bit i from the probability vector; and
  moving 3040 to bit i+1 until all n bits are fixed.

The newly computed contraction identities correspond to one or more sections of the logical graph (e.g., see the example of FIG. 13) replaced by the specific values during the determination of the probability vector. The indexed values are used during subsequent iterations to replace the same sections (e.g., as many sections are repeated multiple times during processing of the n bits). Such a solution limits the number of actual computation steps and ensuring increased efficiency The message is typically received over a network interface and the fixed bits are typically provided to a higher processing layer of a network stack. The dedicated coding processor 1132 may advantageously support the decoding method 3000.

Various network links may be implicitly or explicitly used in the context of the present invention. While a link may be depicted as a wireless link, it could also be embodied as a wired link using a coaxial cable, an optical fiber, a category 5 cable, and the like. A wired or wireless access point (not shown) may be present on the link between. Likewise, any number of routers (not shown) may be present and part of the link, which may further pass through the Internet.

The present invention is not affected by the way the different modules exchange information between them. For instance, the memory module and the processor module could be connected by a parallel bus, but could also be connected by a serial connection or involve an intermediate module (not shown) without affecting the teachings of the present invention.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

It is interesting to study channel polarization of the erasure channel under Polar and Convolutional Polar coding to get a better understanding of their comparative performance. In FIG. 15, results are presented regarding polarization of the logical channels under 1024-bit Polar and Convolutional Polar codes with the 50% erasure channel. More specifically, in FIGS. 15A and 15B, the accuracy of each channel, parameterized by effective erasure rate of the logical channels under successive cancellation decoding are depicted for the Polar code (FIG. 15A) and the Convolutional Polar code (FIG. 15B). On FIG. 15C, the same data is plotted in descending order for the Polar and Convolutional Polar codes. The dotted vertical line corresponds to the capacity at 50%. FIG. 15D shows the cumulative sum, which provides a simple upper bound to the frame-error rate (FER) for the specified number of data bits.

Figure 15A:
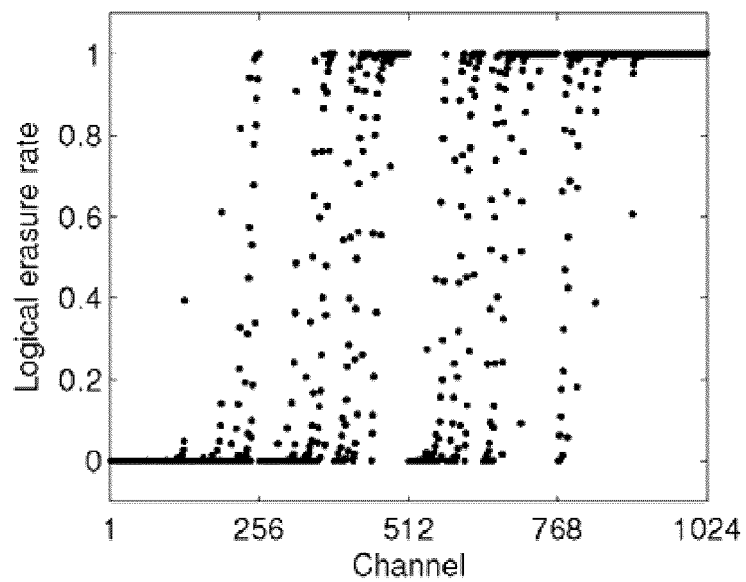
FIG. 15A, FIG. 15B, FIG. 15C and FIG. 15D, herein referred to concurrently as FIG. 15, are graphs presenting accuracy of each channel, parameterized by effective erasure rate of the logical channels under successive cancellation decoding.
Figure 15B:
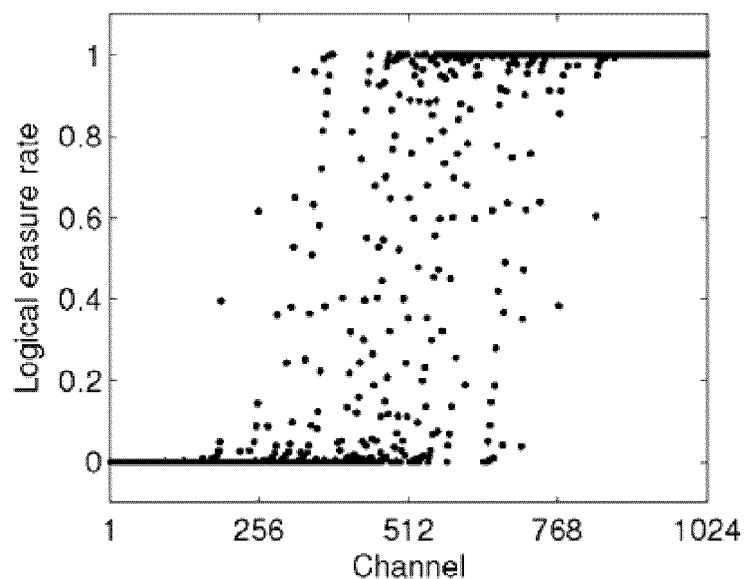
Figure 15C:
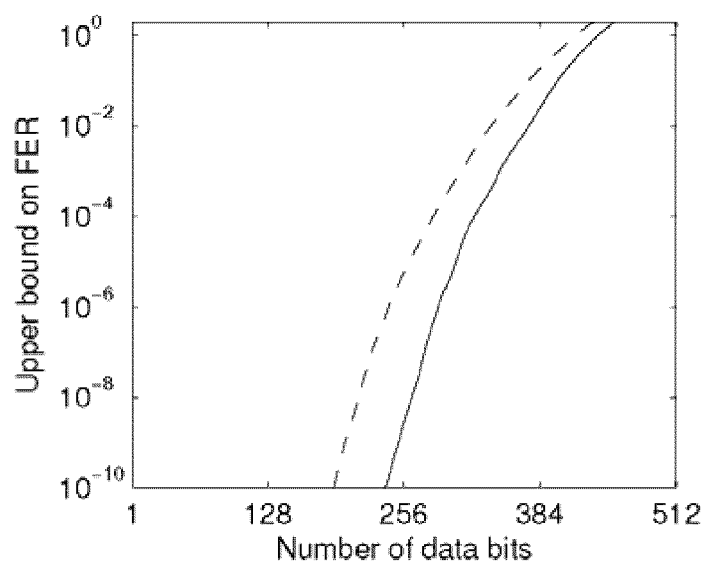
Figure 15D:
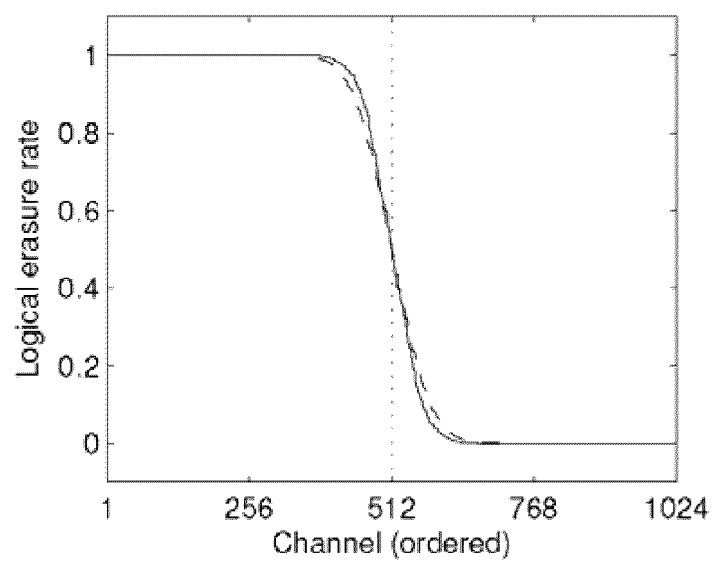

In FIGS. 15A, 15B and 15C, it can be observed that the Convolutional Polar code contains somewhat fewer channels in the intermediate area between the perfect and useless limits, and further, that the good channels are a little more strongly localized on the left (and conversely the bad channels are localized on the right). This latter fact is particularly significant for successive cancellation decoding because it means more information regarding the frozen bits is available to the decoder when determining the data bits, reducing the gap in performance between maximum likelihood and successive cancellation decoding.

Figure 16:
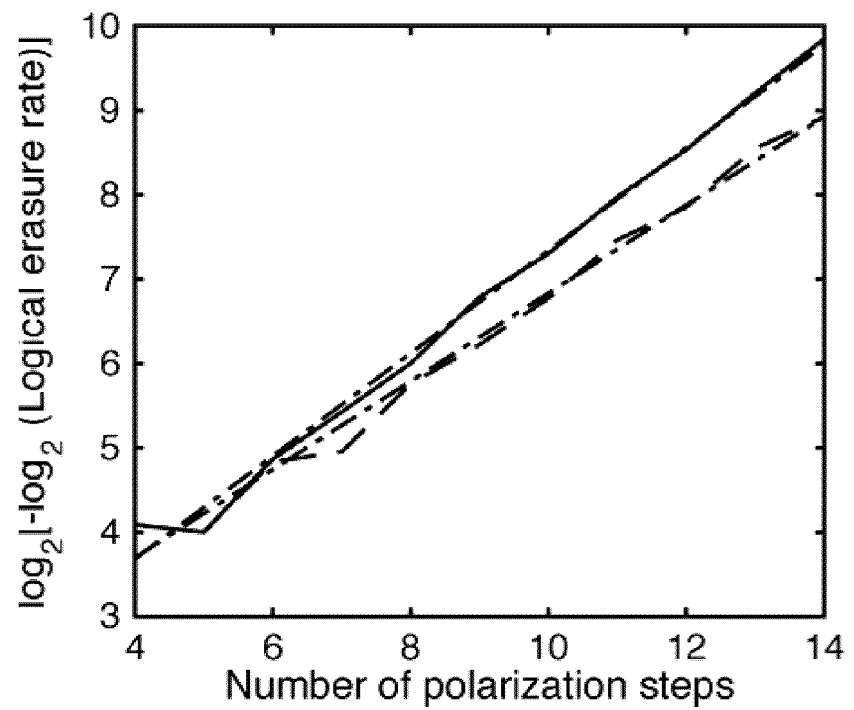
FIG. 16 is a graph showing estimates of the error exponent comparatively for the Polar and Convolutional Polar codes.

From these results is can also be deducted a simple upper bound on the probability of at least one error in the block, or frame-error rate (FER). By simply summing the probability of erasures over the k data channels and noting that the chance of an error is at most the sum of probabilities that a given data bit is the first to be decoded incorrectly, an (over)-estimate of the FER is obtained. In FIG. 15D this sum is shown for a range of data rates. Similarly, the maximum probability that a non-frozen bit is the first to be decoded incorrectly provides a lower bound on the FER. While only lower bounds are shown here, it is indistinguishable from the upper bound in most of the provided graphs, as skilled person will acknowledge. Thus, these bounds suggest that the Convolutional Polar code can deliver a significant increase in the amount of data sent for a fixed error rate (especially for small target error rates). FIG. 16 uses the upper bound (lower bound being indistinguishable) derived above to estimate the error exponent of the Polar and Convolutional Polar codes. As previously discussed, for a fixed encoding rate k/n (less than the capacity), both codes have asymptotic frame-error rates scaling as $2^{-N^\beta}$ with $\beta \le 1/2$ for Polar codes and $\beta \le 1/2 \log_2 3 \approx 0.79$ for Convolutional Polar codes. While these scalings are asymptotic, the finite size scaling observed on FIG. 16 reveals error exponents $\beta \approx 0.52$ for Polar codes and $\beta \approx 0.61$ for Convolutional Polar codes, providing good evidence that the enhance polarization is significant even at relatively small block sizes.

On FIG. 16, assuming that the FER scales as $P_e = 2^{-\gamma N^\beta}$ where the number of bits $N=2^n$ depends on the number of polarization steps n, it is determined that $\log_2[-\log_2(Pe)] = \log_2 \gamma + \beta n$. Using an upper bound for $P_e$, the graph plots $\log_2[-\log_2(Pe)]$ as a function of n for the Polar codes and the Convolutional Polar codes. Also shown are linear fits using $\gamma \approx 3.04$ and $\beta \approx 0.52$ for the Polar codes, and $\gamma \approx 2.37$ and $\beta \approx 0.61$ for Convolutional Polar codes. The encoding rate is 1/16.

The performance of the Polar and Convolutional Polar codes at protecting data from a variety of channels has been numerically compared, with particular focus on finite-code length effects on codes between 256 and 8192 bits. For all the simulations performed, a simplified channel selection scheme has been used that is independent of the details of the error model. The selected scheme uses the symmetric bit flip channel with probability p and evaluates, for each position j, the probability that bit $x_j$ is the first to be decoded incorrectly. It works by using an all-zero input and an output where the decoder believes each bit has an independent probability p of being a 1, and 1−p of being a 0. For each bit $x_j$, a corresponding tensor-network diagram is contracted, with $x_i=0$ for i<j and $x_i$ random for i>j. A more accurate estimate of the logical channel error rate for both the Polar code and Convolutional Polar code could be obtained by sampling, i.e. by sampling over the possible bit values $x_i$ with i<0 instead of fixing them to 0. Alternatively, more sophisticated techniques could also be used for Convolutional Polar codes. However, it has been observed that this simplified procedure gives adequate results over all investigated channels (for instance, performing better for the bit-flip channel than the data presented in FIG. 15, which derives from the erasure channel). A slight improvement in performance can be observed by using the channel selection tailored to the specific error model in question, but the comparative performance between the Polar and Convolutional Polar codes remains very similar, so this procedure is adequate for the purposes of comparison.

Figure 17A:
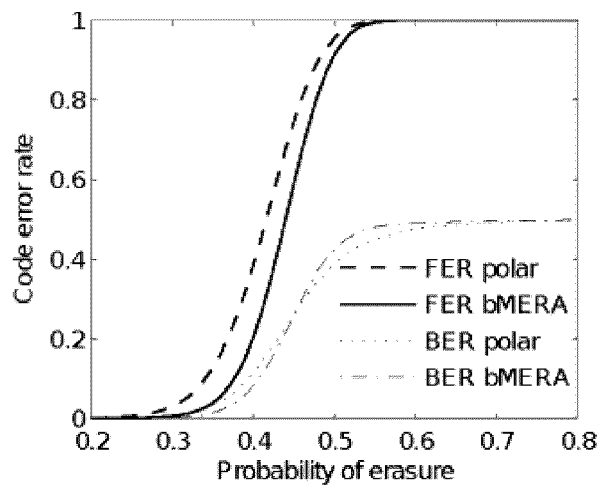
Figure 17B:
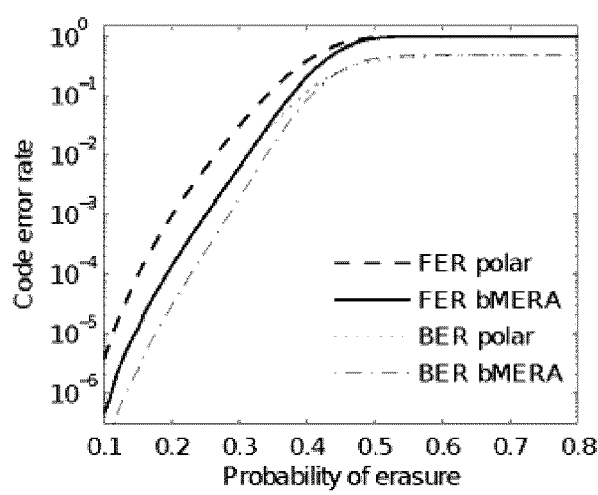
Figure 17C:
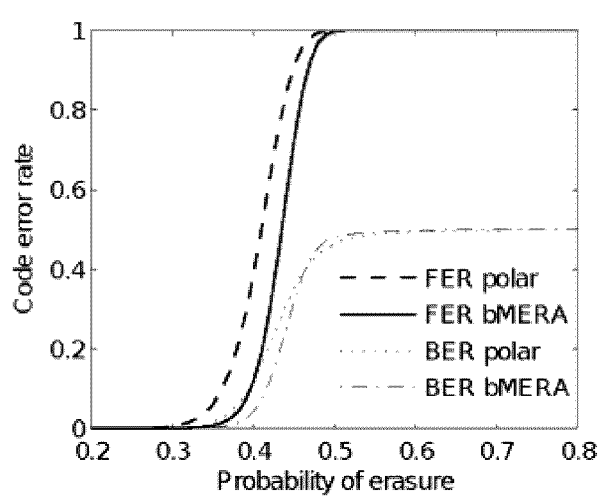
Figure 18A:
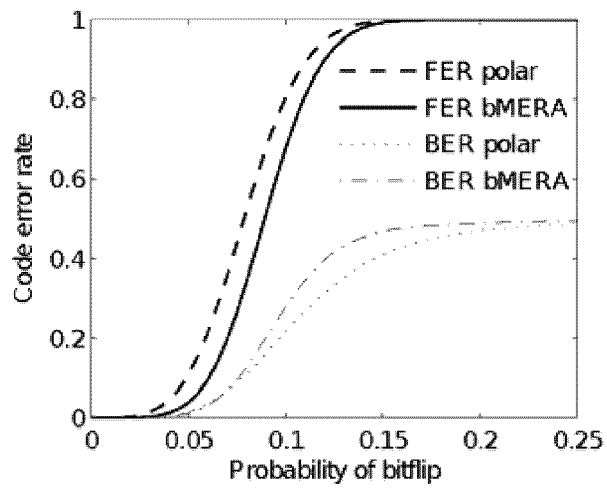
FIG. 18A, FIG. 18B, FIG. 18C, FIG. 18D, FIG. 18E and FIG. 18F, herein referred to concurrently as FIG. 18, are graphs showing a comparison of the performance of rate 1/2 Polar and Convolutional Polar codes of various sizes for the bit-flip channel.
Figure 18B:
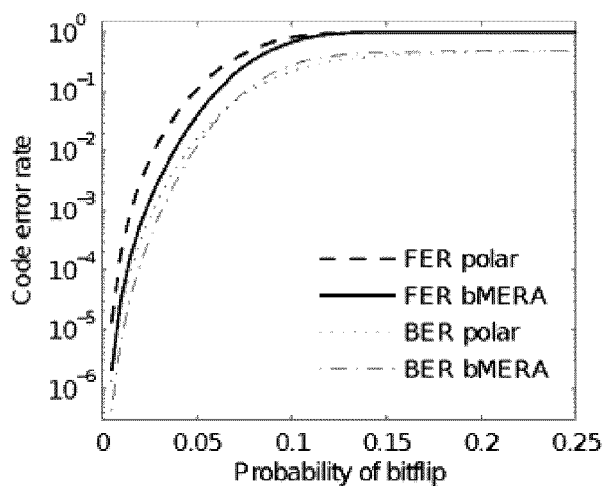
Figure 18C:
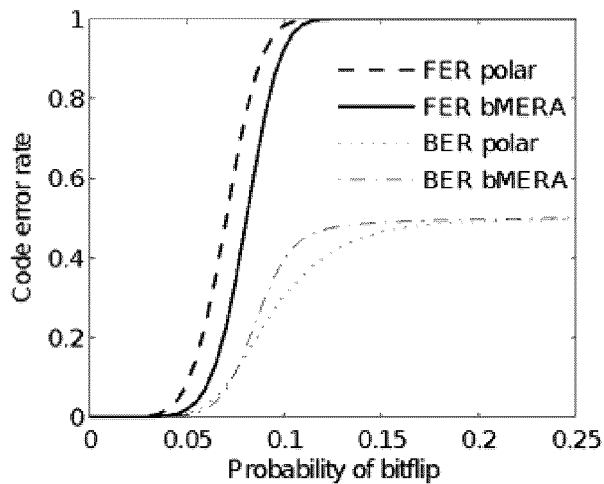
Figure 18D:
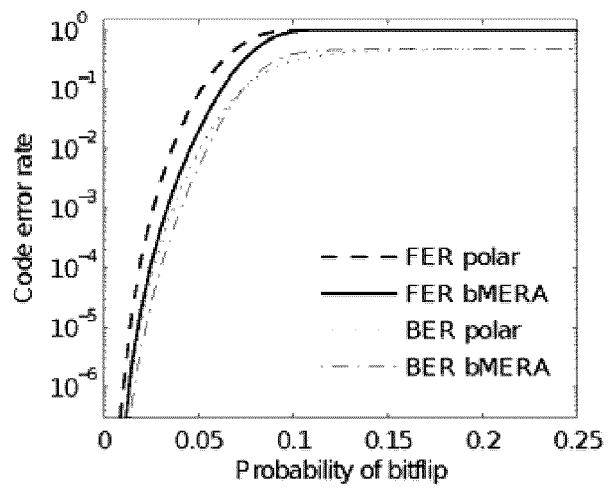
Figure 18E:
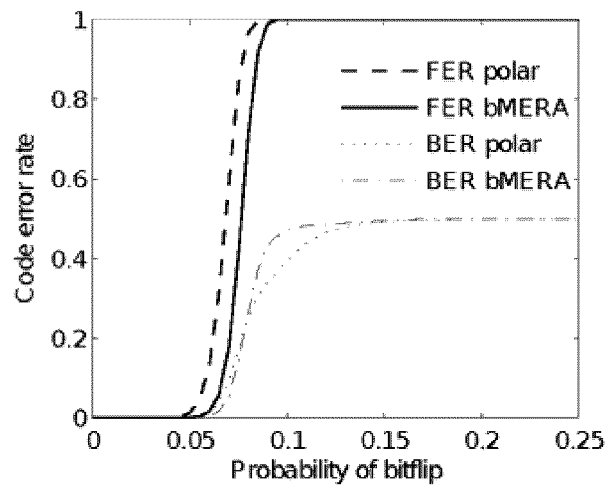
Figure 18F:
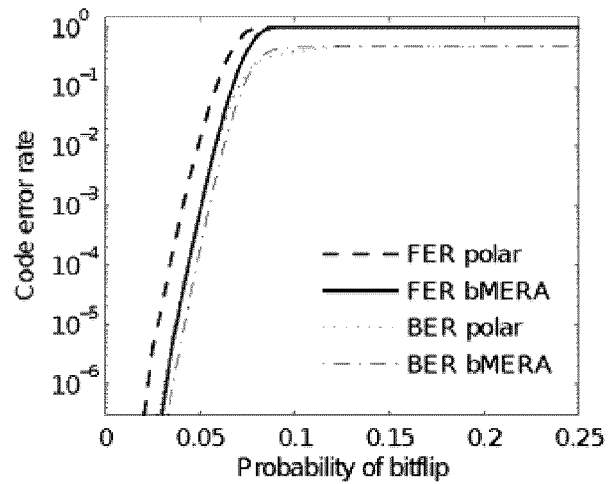
Figure 19A:
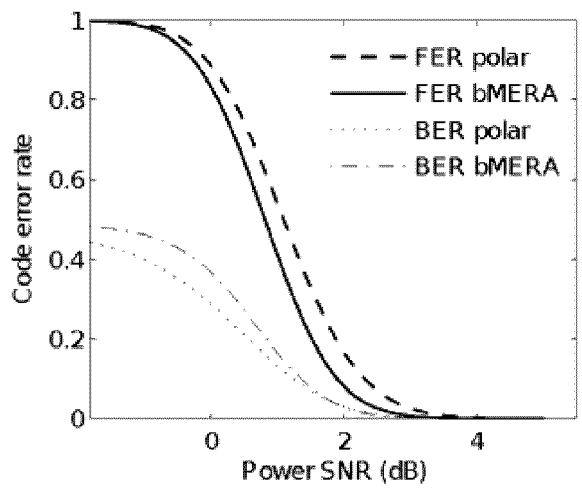
Figure 19B:
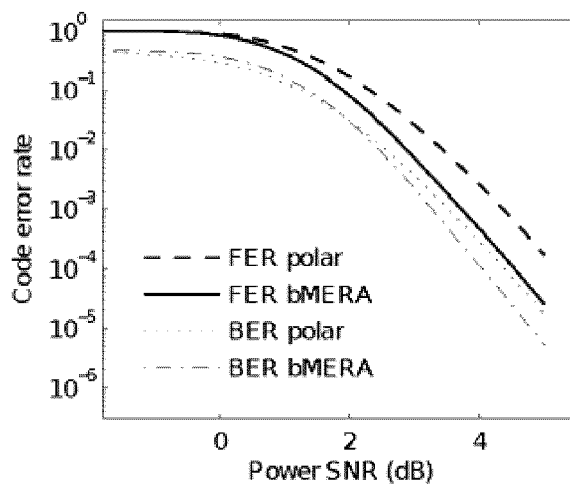
Figure 19C:
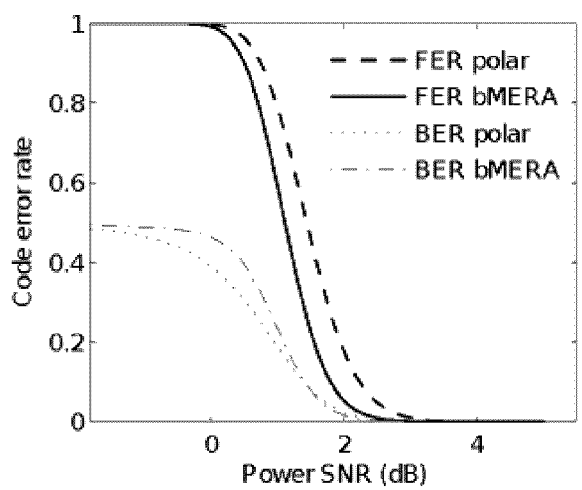
Figure 19D:
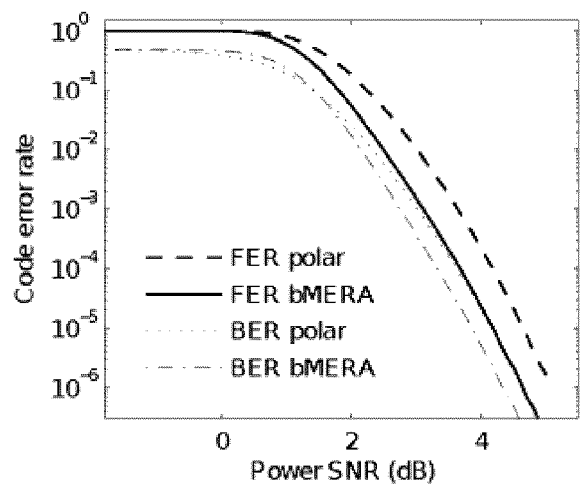
Figure 19F:
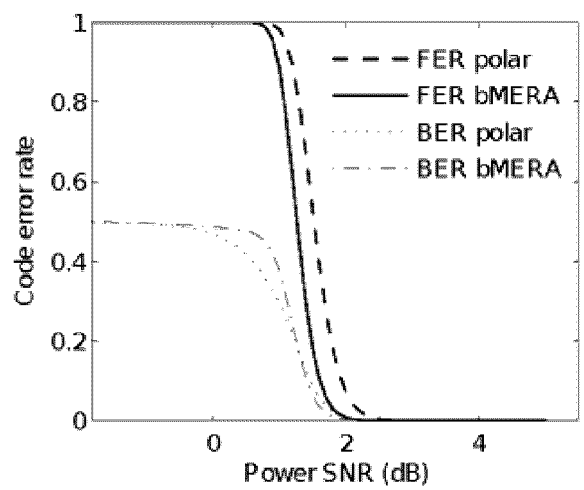
Figure 19F:
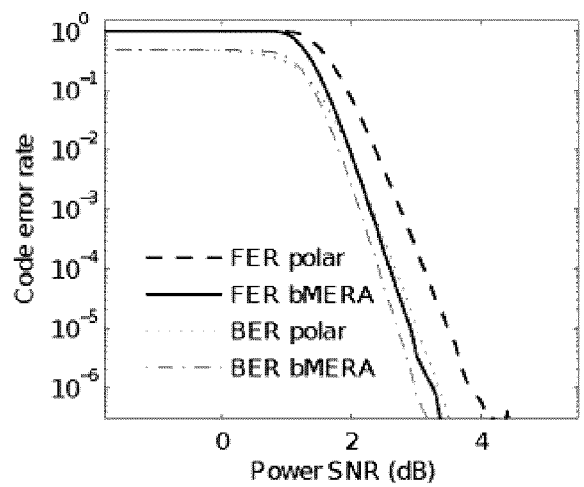
Figure 20A:
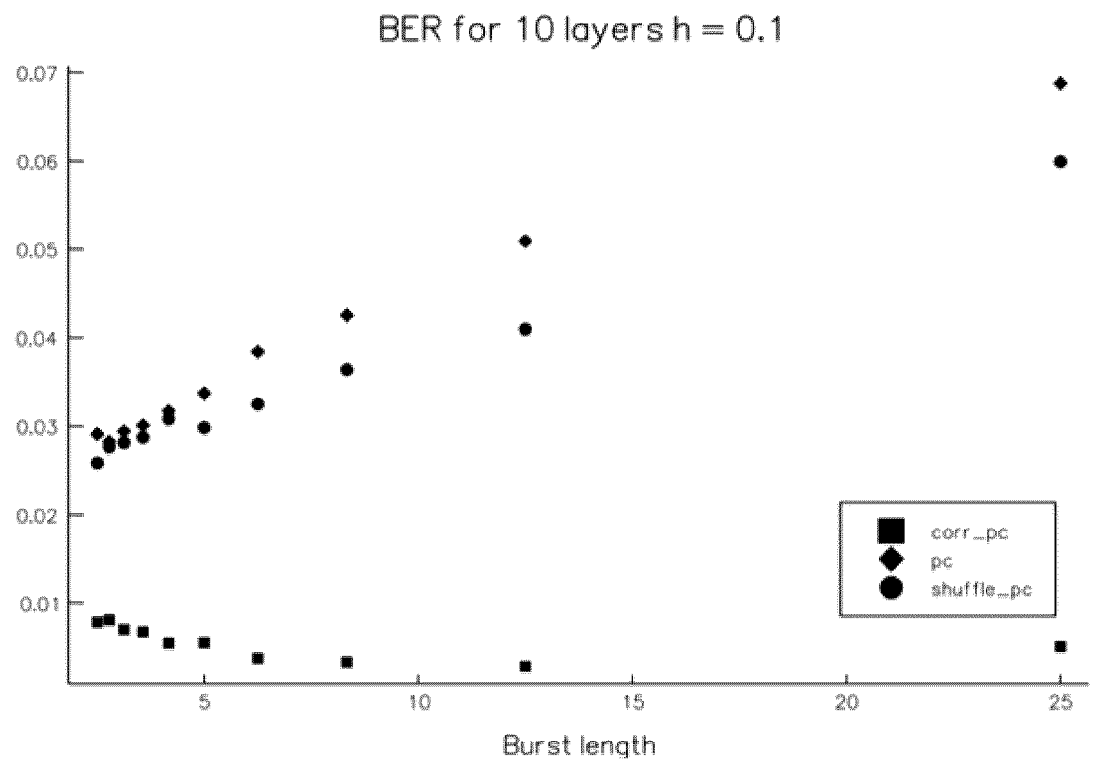
FIGS. 20A-20B, FIGS. 21A-21B, FIGS. 22A-22B and FIGS. 23A-23B present performance curves in presence of correlated noise for a code size of $2^{10}$ (1024) bits for 3 types of decoding techniques.
Figure 20B:
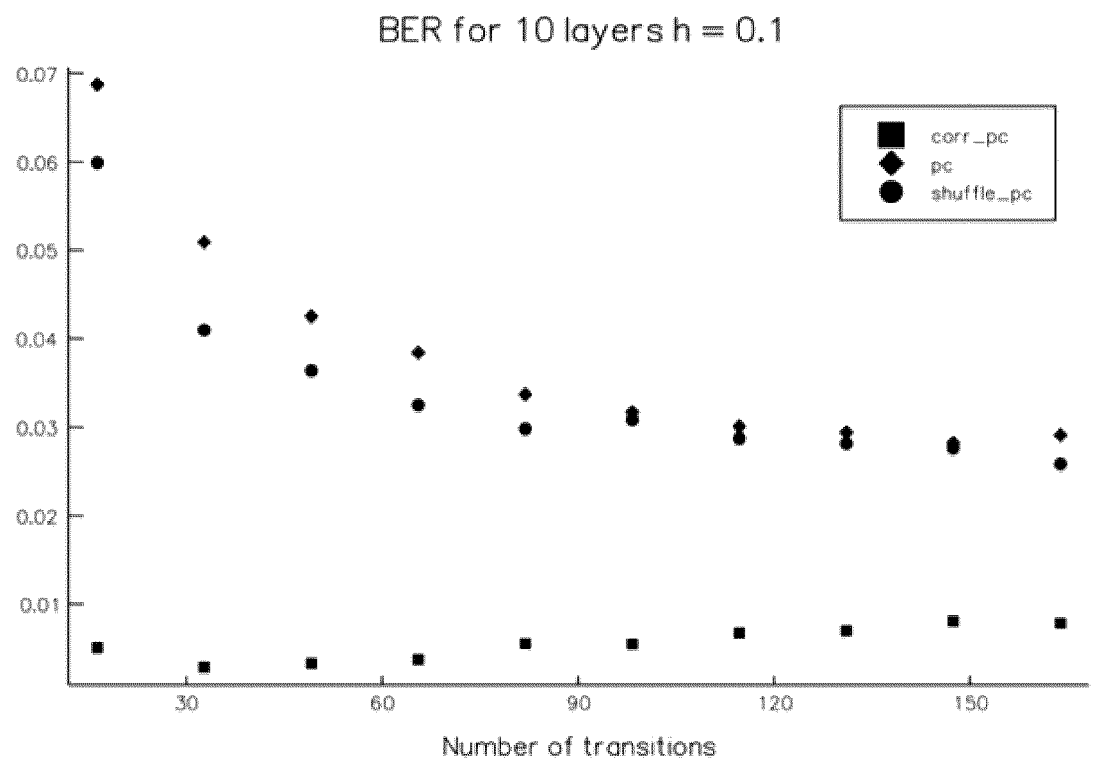
Figure 21A:
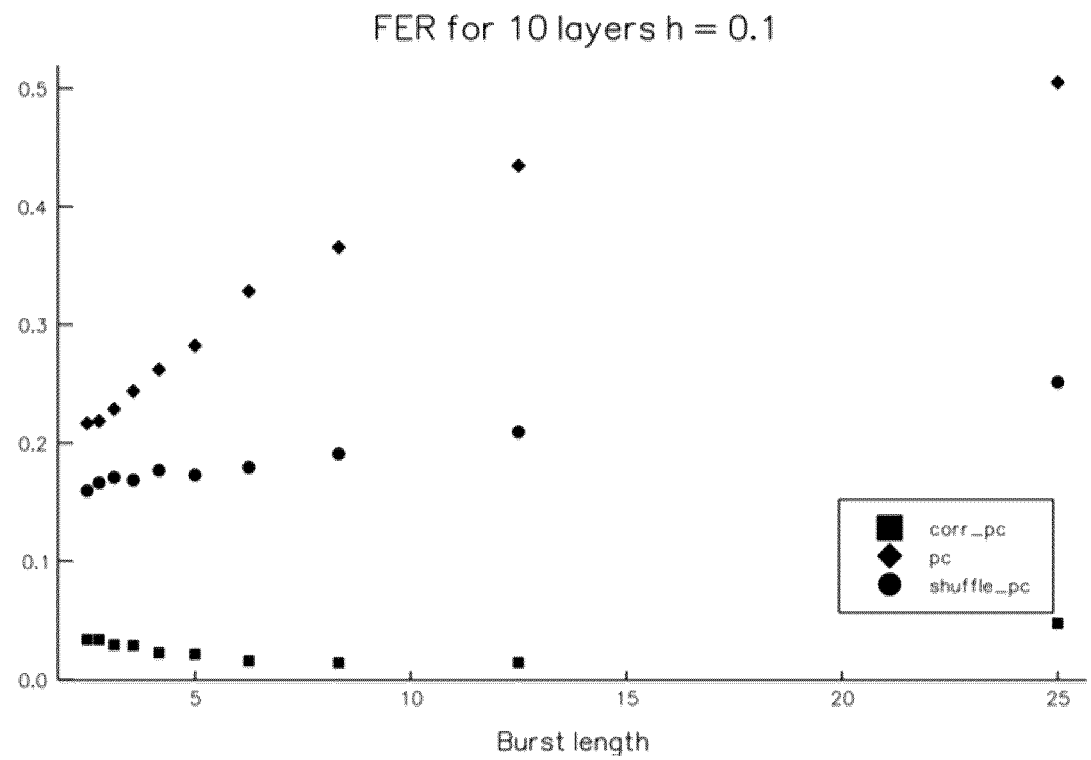
Figure 21B:
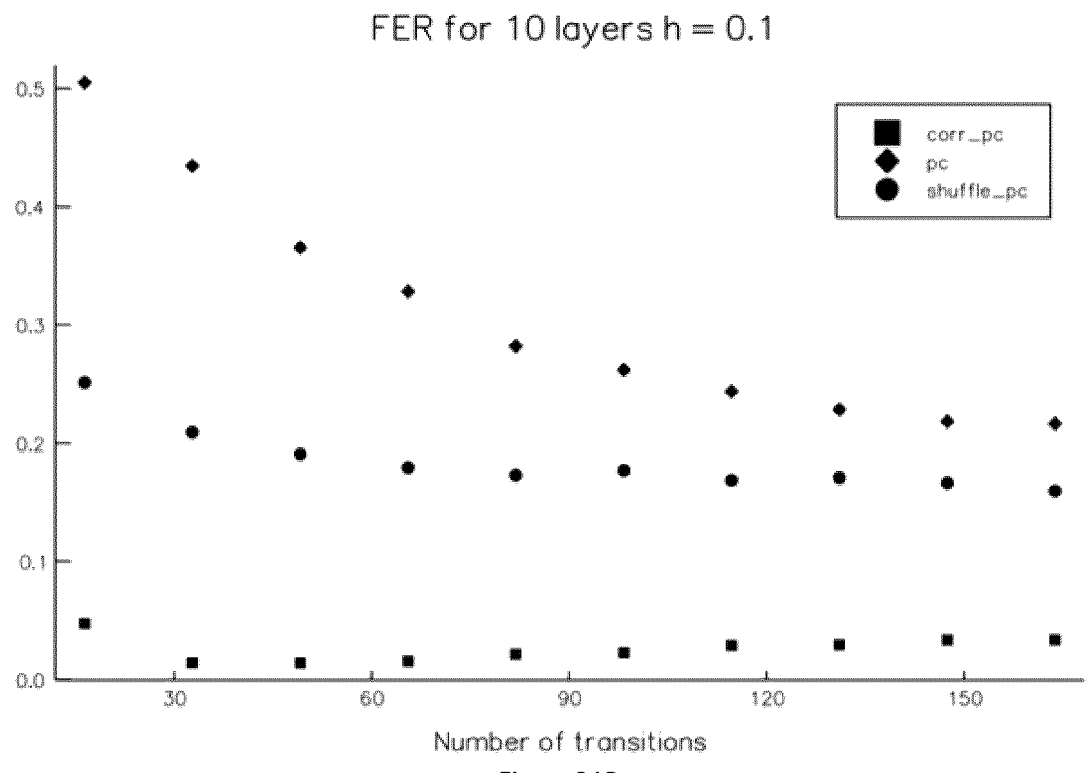
Figure 22A:
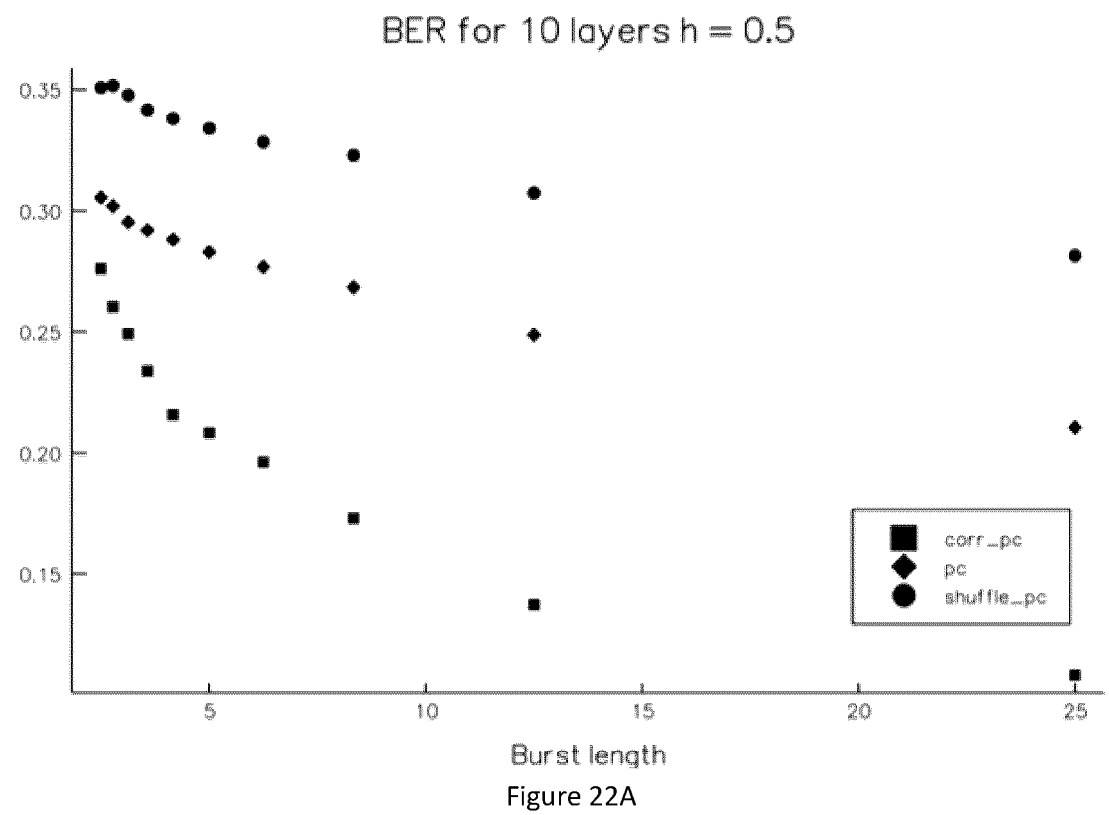
Figure 22B:
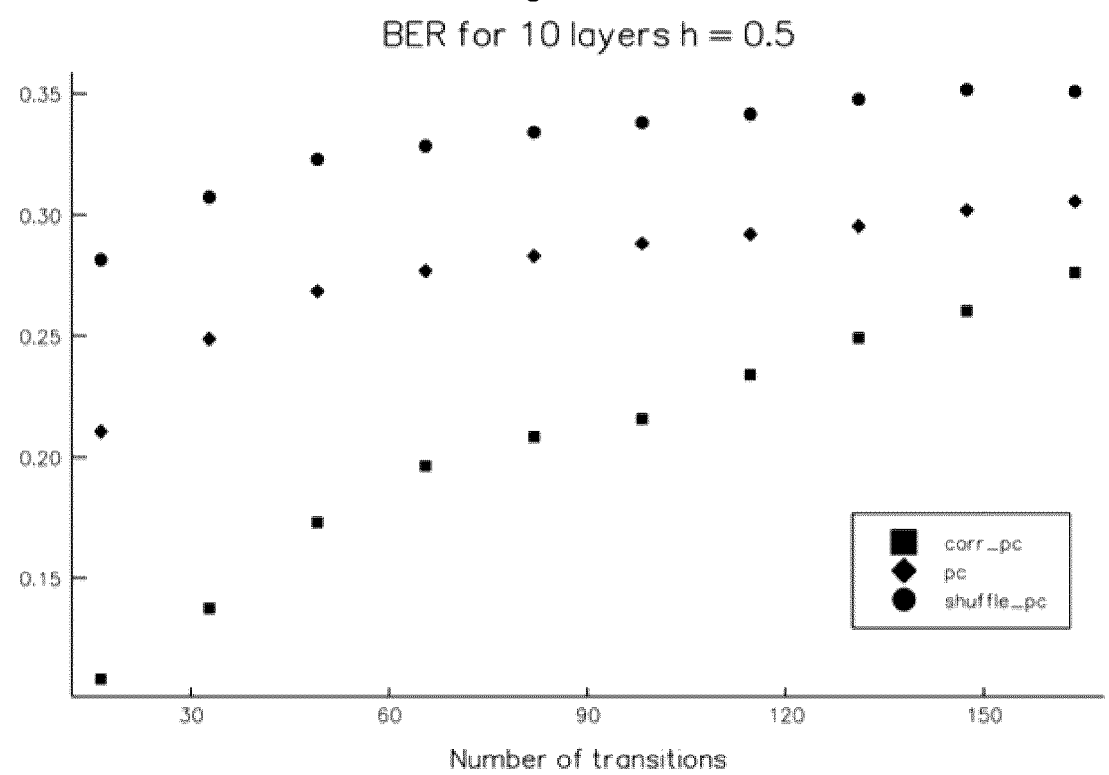
Figure 23A:
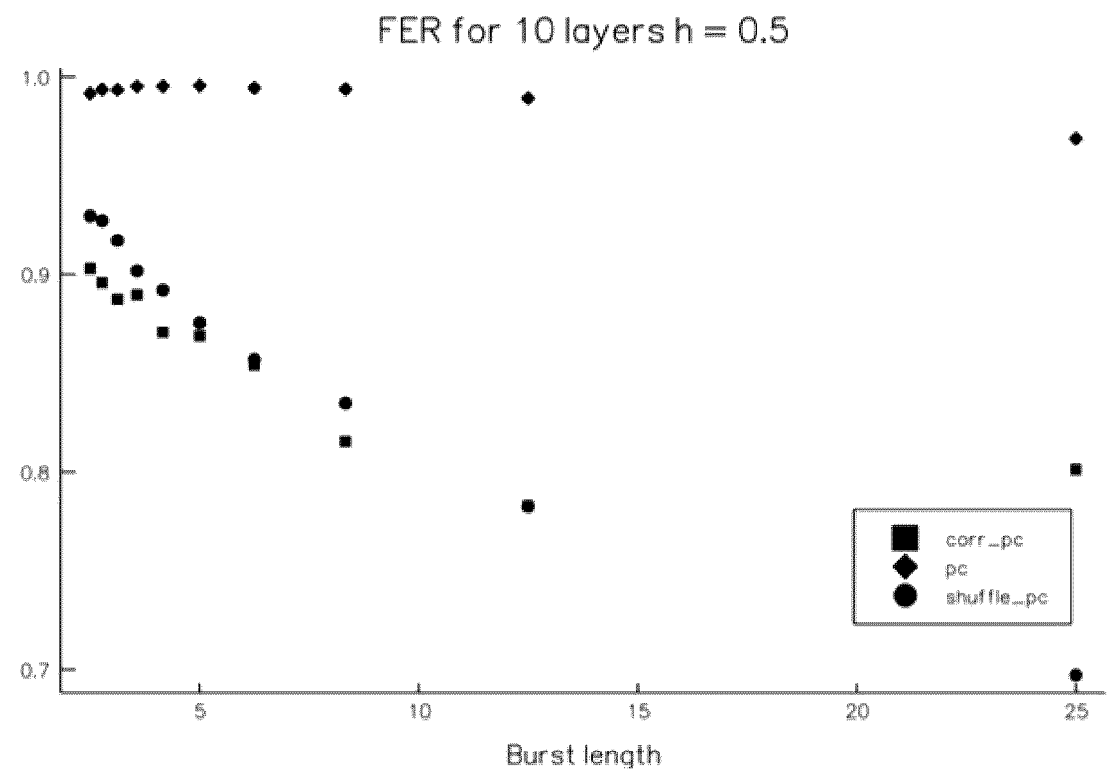
Figure 23B:
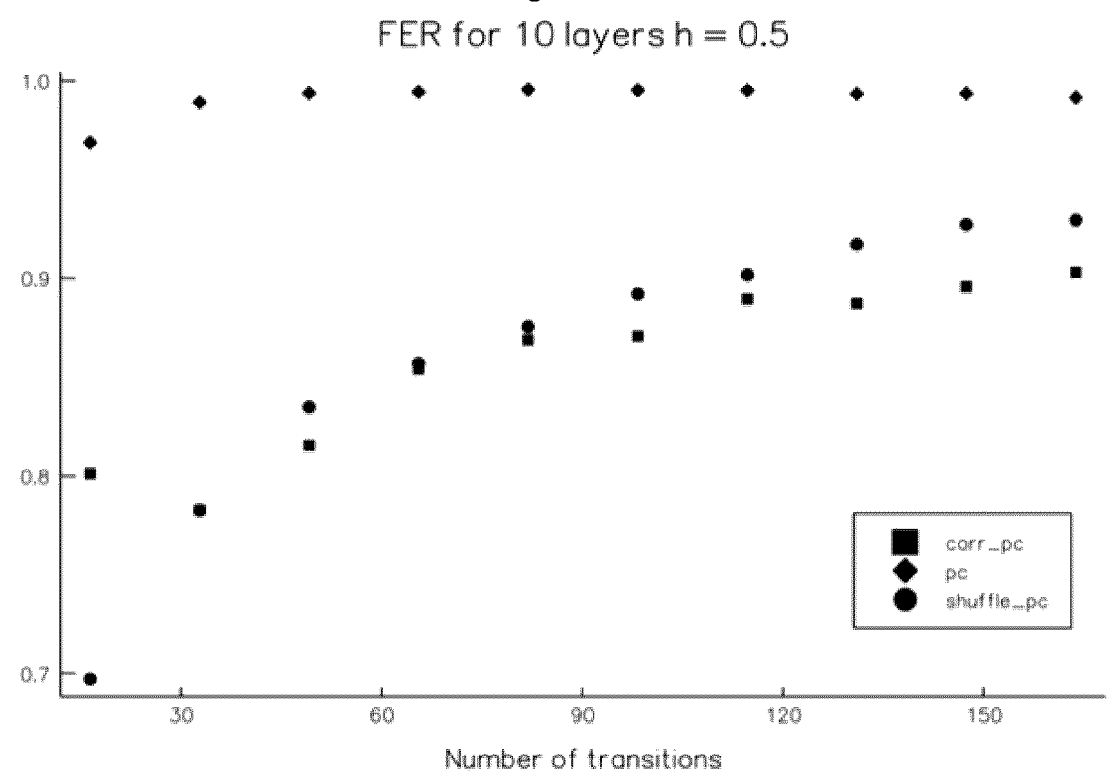

The results for the binary erasure channel with code rate 1/2 are given in FIG. 17. More specifically, on FIG. 17, comparison of the performance of rate 1/2 Polar and Convolutional Polar codes of various sizes for the binary erasure channel are depicted. The encoded message contains 256 bits in the example of FIG. 17A and FIG. 17B, 1024 bits in the example of FIG. 17C and FIG. 17D and 8192 bits in the example of FIG. 17E and FIG. 17F. The capacity with erasure probability 0.5 corresponds to the code rate 1/2. Different observations can be made. Finite-size effects are significant in both codes, with the waterfall region separating "perfect" and "useless" behavior being somewhat below the capacity of the erasure channel (which suggests that erasure rates of up to 0.5 are tolerable for our encoding rate). Nonetheless, the threshold of the Convolutional Polar code is significantly closer to this value than the Polar code. On a logarithmic scale, it is evident that the performance in the low-error region is significantly better by, for instance, looking at the slope in FIG. 17F, which is significantly greater for the Convolutional Polar code. Neither code displays any evidence of an error floor (nor is it expected). Finally, both codes display a tendency for any error to be catastrophic—involving errors on many bits. Indeed, the ratio between the bit error rate (BER) and frame error rate (FER) is very large for the Polar code and even higher (close to 0.5) for the Convolutional Polar code. This corresponds to either a perfectly decoded message or a completely scrambled one. Interestingly, this is the behavior expected of a "perfect" random code, as Shannon envisaged, where the most likely messages are completely uncorrelated.

In FIG. 18, a similar behavior is observed for the bit-flip channel. More specifically, FIG. 18 shows a comparison of the performance of rate 1/2 Polar and Convolutional Polar codes of various sizes for the bit-flip channel. The encoded message contains 256 bits in the example of FIG. 18A and FIG. 18B, 1024 bits in the example of FIG. 18C and FIG. 18D and 8192 bits in the example of FIG. 18E and FIG. 18F. The capacity with bit-flip probability approximately 0.11 corresponds to the code rate 1/2. In the example depicted on FIG. 18, even greater finite-size effects can be observed, with the observed waterfall regions quite a bit below the expected threshold at a bit-flip rate of approximately 0.11. The Convolutional Polar code performs better in all cases, with a higher tolerance for error, a sharper transition between good and bad performance, and better scaling in the low error-rate region.

Finally, performance under the more realistic additive Gaussian white noise channel is depicted in FIG. 19. More specifically, in FIG. 19, comparison of the performance of rate 1/2 Polar and Convolutional Polar codes of various sizes for the additive Gaussian white noise channel is depicted. The encoded message contains 256 bits in the example of FIG. 19A and FIG. 19B, 1024 bits in the example of FIG. 19C and FIG. 19D and 8192 bits in the example of FIG. 19E and FIG. 19F. Once again similar behavior can be observed: the Convolutional Polar code has better error performance than the Polar code, including tolerance for larger noise rates and better scaling in the low noise region. Based on these results, it appears that the Convolutional Polar code is a significant improvement to the Polar code when it comes to error correction capabilities with finite, relatively small block size. Furthermore, the numerical (or computational)

cost is significantly affected, with the same scaling and, anecdotally, approximately twice the computation effort to decode.

What is claimed is:

1. A method of decoding data received over a noisy channel having a channel bandwidth defining channel bits, the method comprising:
    receiving channel bits transmitted over the noisy channel and encoded using a polar code encoding scheme having input positions, the received channel bits encoding non-frozen message bits and frozen bits, the non-frozen message bits applied to encoder input positions having a highest probability of successful decoding after transmission;
    selecting a polar code decoding scheme corresponding to the polar code encoding scheme;
    decoding the received channel bits to output the non-frozen message bits by iteratively, for each bit position:
        if the bit at a bit position is a frozen bit, fixing the decoded bit at the bit position to a fixed frozen bit value;
        if the bit at the bit position is a non-frozen bit, fixing the decoded bit at the bit position to a respective non-frozen value determined using the selected polar code decoding scheme and the previously fixed decoded bits by:
            determining a probability vector for the decoded bit by traversing a logical graph using contraction identities simplified to specific values; and
            fixing the bit from the probability vector;
        indexing the specific values from the contraction identities newly computed during the determination of the probability vector for subsequent reference during a following iteration based on corresponding contraction identities; and
        increasing to a next bit position and processing the next bit until all channel bits are fixed; and
    outputting as the decoded message the non-frozen bits of the fixed decoded bits.

2. The method of claim 1, wherein the noisy communication channel is modelled as an erasure channel with an erasure probability.

3. The method of claim 1, wherein the noisy channel is modelled as an erasure channel that presents correlated noise characteristics and is further defined by:
    a bad-state probability of erasure;
    a good-state probability of erasure, where the bad-state probability of erasure is greater than or equal to the good-state probability of erasure;
    a probability of transition between the good state and the bad state; and
    a probability of transition between the bad state and the good state.

4. A non-transitory computer readable medium storing instructions, which when executed a processor of a computing device configure the device to perform a method of decoding data received over a noisy channel having a channel bandwidth defining channel bits, the method comprising:
    receiving the channel bits transmitted over the noisy channel and encoded using a polar code encoding scheme having input positions, the received channel bits encoding non-frozen message bits and frozen bits, the non-frozen message bits applied to encoder input positions having a highest probability of successful decoding after transmission;
    selecting a polar code decoding scheme corresponding to the polar code encoding scheme;
    decoding the received channel bits to output the non-frozen message bits by iteratively, for a bit:
        if the bit is a frozen bit, fixing the decoded bit to a fixed frozen bit value; and
        if the bit is a non-frozen bit, fixing the decoded bit to a respective non-frozen value determined using the selected polar code decoding scheme and the previously fixed decoded bits by:
            determining a probability vector for the decoded bit by traversing a logical graph using contraction identities simplified to specific values; and
            fixing the bit from the probability vector;
        indexing the specific values from the contraction identities newly computed during the determination of the probability vector for subsequent reference during a following iteration based on corresponding contraction identities; and
    outputting as the decoded message the non-frozen bits of the fixed decoded bits.

5. The computer readable medium of claim 4, wherein the noisy communication channel is modelled as an erasure channel with an erasure probability.

6. The computer readable medium of claim 4, wherein the noisy channel is modelled as an erasure channel that presents correlated noise characteristics and is further defined by:
    a bad-state probability of erasure;
    a good-state probability of erasure, where the bad-state probability of erasure is greater than or equal to the good-state probability of erasure;
    a probability of transition between the good state and the bad state; and
    a probability of transition between the bad state and the good state.

* * * * *